US012598822B2

(12) United States Patent
McGivney et al.

(10) Patent No.: US 12,598,822 B2
(45) Date of Patent: Apr. 7, 2026

(54) STACKED FOCAL PLANE ARRAY CIRCUIT AND METHOD THEREOF

(71) Applicant: Aeluma, Inc., Goleta, CA (US)

(72) Inventors: Michael McGivney, Goleta, CA (US); Jonathan Klamkin, Goleta, CA (US); Bowen Song, Goleta, CA (US); Bei Shi, Goleta, CA (US); Simone Tommaso Suran Brunelli, Goleta, CA (US)

(73) Assignee: Aeluma, Inc., Goleta, CA (US)

( * ) Notice: Subject to any disclaimer, the term of this patent is extended or adjusted under 35 U.S.C. 154(b) by 364 days.

(21) Appl. No.: 18/489,695

(22) Filed: Oct. 18, 2023

(65) Prior Publication Data

US 2025/0120192 A1     Apr. 10, 2025

Related U.S. Application Data

(63) Continuation of application No. 18/483,922, filed on Oct. 10, 2023.

(51) Int. Cl.
*H01L 27/146* (2006.01)
*H01L 23/00* (2006.01)
*H10F 39/00* (2025.01)
*H10F 39/12* (2025.01)
*H10F 39/18* (2025.01)

(52) U.S. Cl.
CPC ........... *H10F 39/024* (2025.01); *H01L 24/08* (2013.01); *H10F 39/018* (2025.01); *H10F 39/184* (2025.01); *H10F 39/1843* (2025.01); *H10F 39/199* (2025.01); *H10F 39/803* (2025.01); *H10F 39/811* (2025.01); *H01L 2224/08145* (2013.01)

(58) Field of Classification Search
CPC .... H10F 39/024; H10F 39/018; H10F 39/184; H10F 39/1843; H10F 39/199; H10F 39/803; H10F 39/811; H10F 39/809; H01L 24/08; H01L 2224/08145
See application file for complete search history.

(56) References Cited

U.S. PATENT DOCUMENTS

| | | | | |
|---|---|---|---|---|
| 2009/0173883 A1* | 7/2009 | Kauffman | ............. | H10F 39/184 |
| | | | | 250/338.4 |
| 2012/0286328 A1* | 11/2012 | Nishida | ............... | H10F 30/2215 |
| | | | | 257/188 |
| 2020/0319345 A1* | 10/2020 | Cheng | ................... | G01S 7/4816 |
| 2022/0102410 A1* | 3/2022 | Chen | ................... | H10F 39/8033 |

* cited by examiner

*Primary Examiner* — Leonardo Andujar

(57) ABSTRACT

A stacked focal planar array (FPA) device and method of fabrication. The method can include forming photodetectors or FPAs by heteroepitaxial growth of III-V PINs, APDs, or other photodetector devices that are bonded to a Si-based read-out integrated circuit (ROIC) wafer in a stacked configuration. In a single-color device example, a wavelength configuring buffer layer and photodetector are grown on a first substrate using compound semiconductor materials to enable infrared detection at desired wavelength(s). Depending on the application, this growth can be done on a graded compliant buffer layer and/or a selectively transparent buffer layer. And, silicon detectors can be incorporated to detect visible and NIR wavelengths in a dual-color device example. Further, the resulting devices can be bonded overlying the ROIC device in a flipped orientation and configured as pixels in a sensor array device coupled to the ROIC device.

23 Claims, 72 Drawing Sheets

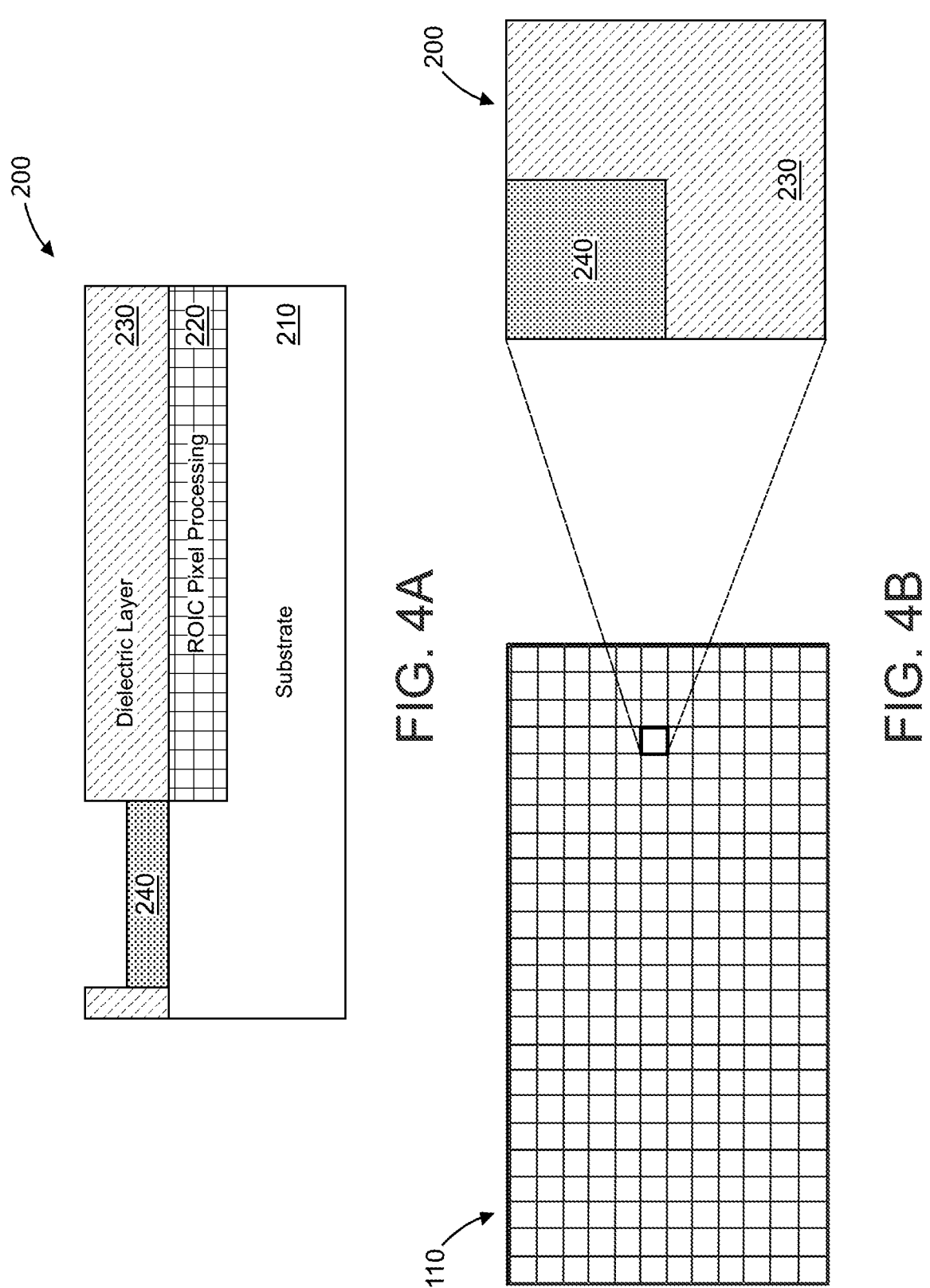

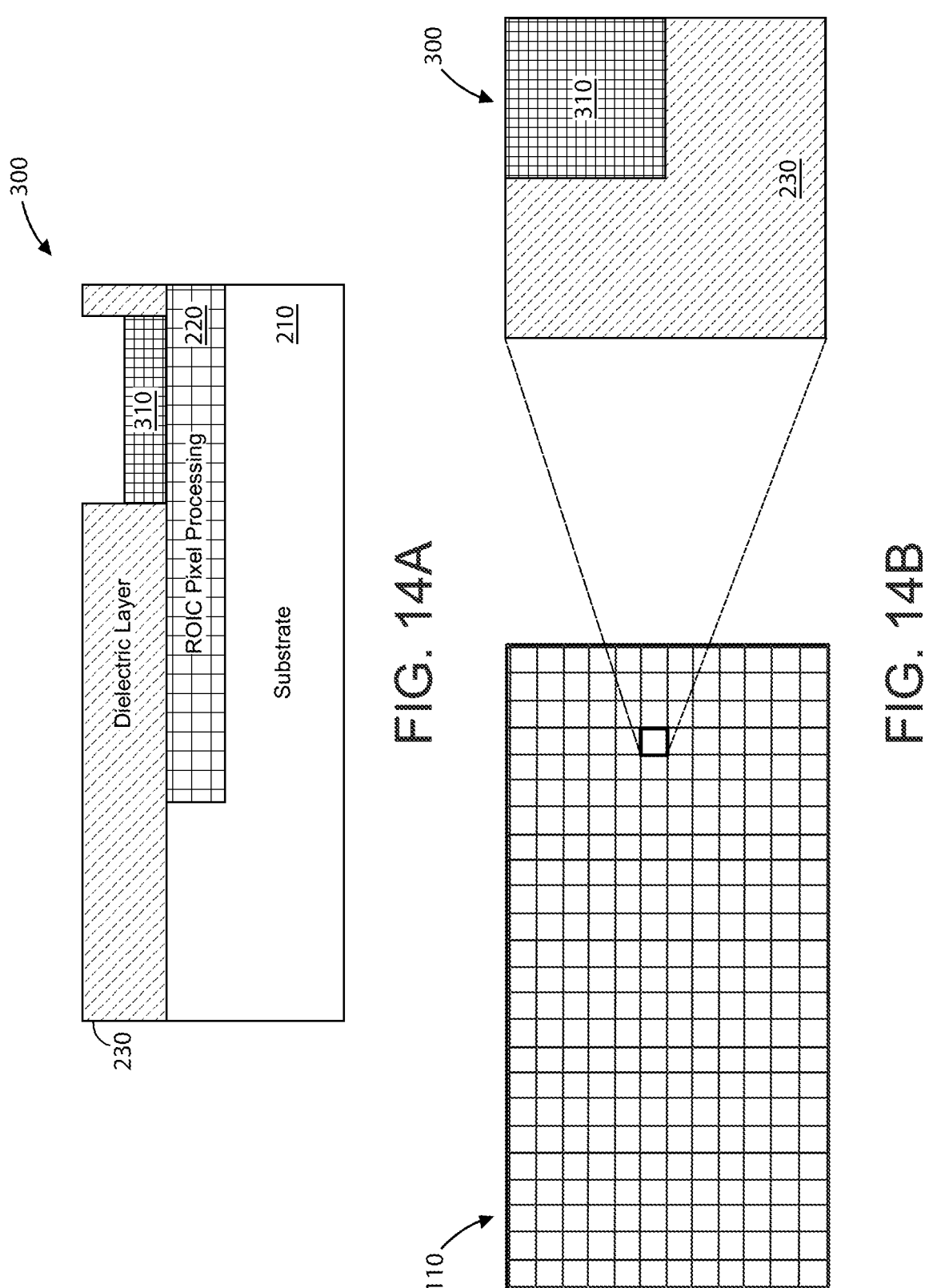

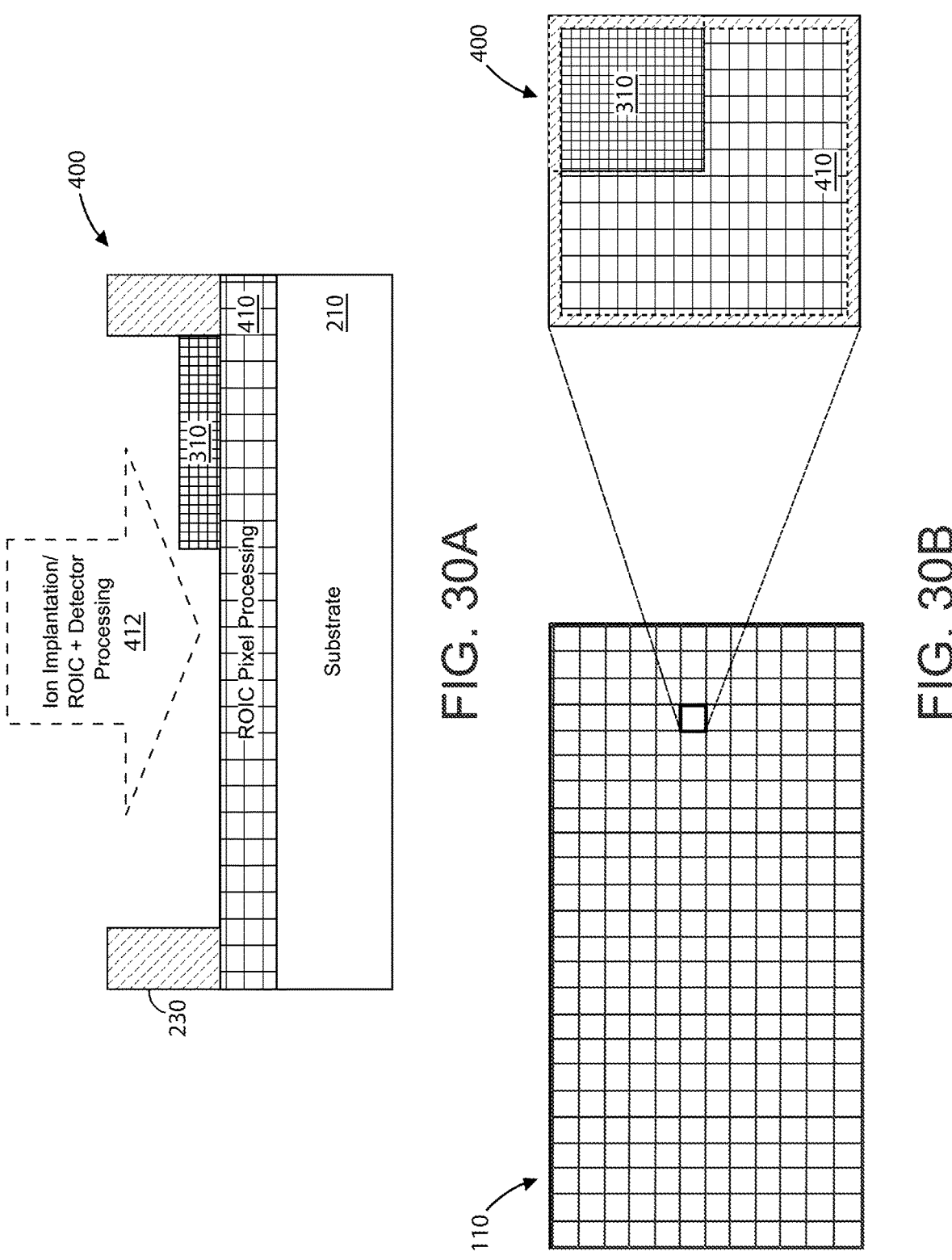

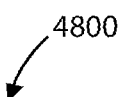
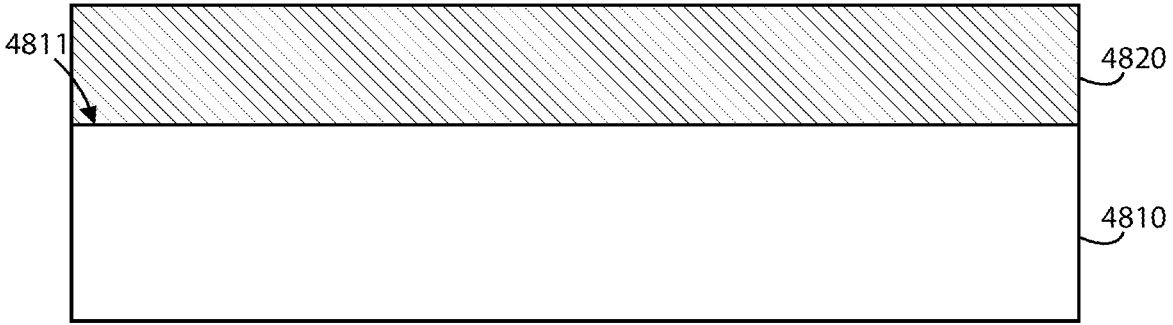
FIG. 48

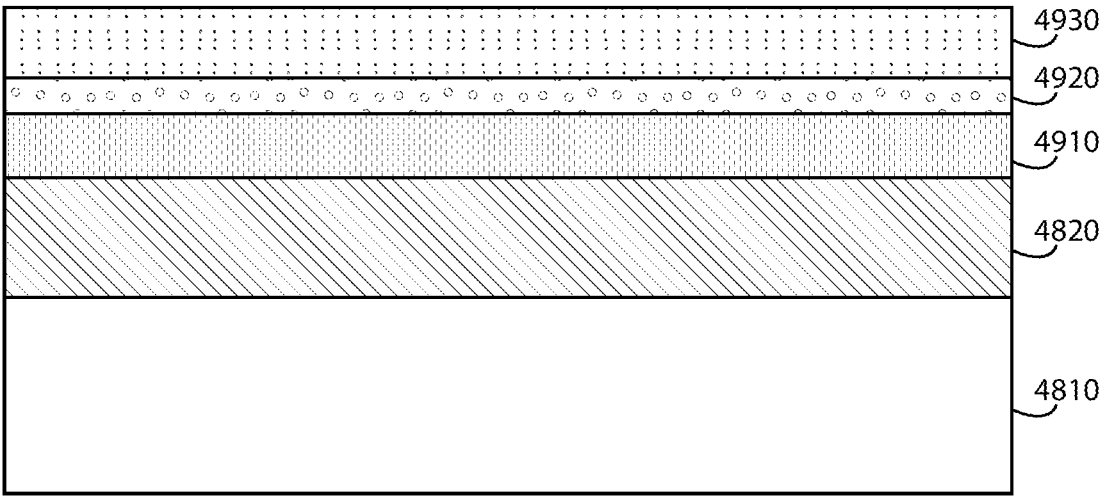
4930
4920
4910
4820
4810
FIG. 49

5400

5440

5442

5402

5444

5403

5446    5446

5426

5428    5428

5420   5424    5420   5424

5422   5422    5422

5418

5401

5416

5414

5450

5452    5452

5454

Trigger   5400

5464

5402

Pixel read out

5462

5428   Cathode

5401

5432   Anode

5600

5610

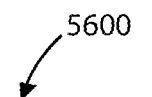
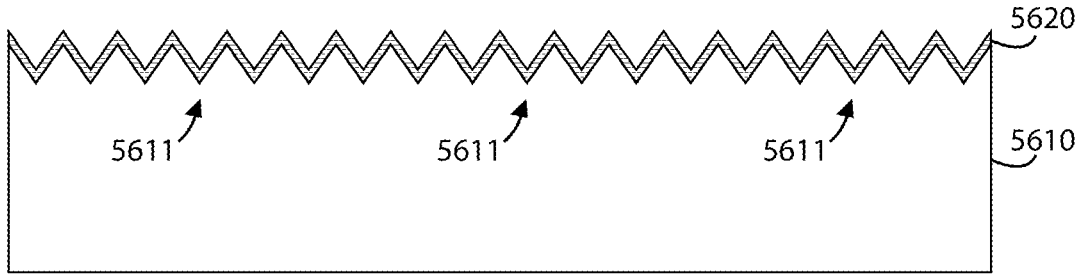
FIG. 56C

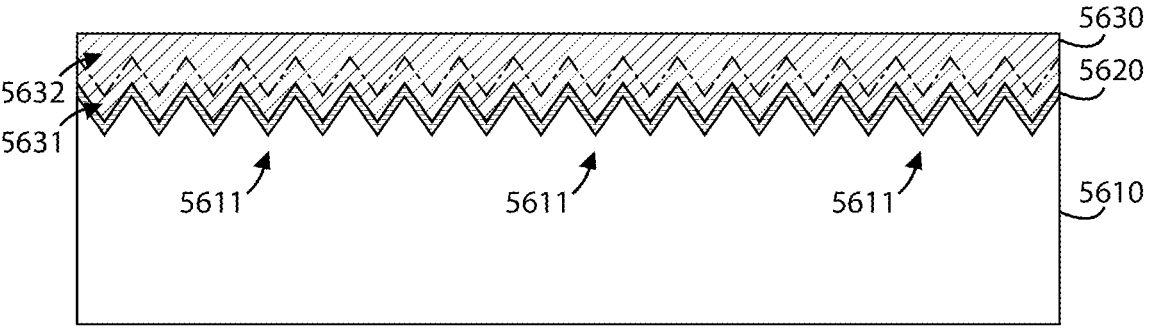
FIG. 56D

STACKED FOCAL PLANE ARRAY CIRCUIT AND METHOD THEREOF

CROSS-REFERENCES TO RELATED APPLICATIONS

The present application is a continuation of U.S. patent application Ser. No. 18/483,922, filed Oct. 10, 2023.

BACKGROUND OF THE INVENTION

Electronic devices have proliferated over the years. From an iPhone 12 designed and sold by Apple Inc. to advanced networks for selling almost any type of good by Amazon-.com Inc., electronic devices have entered into almost every aspect of our daily lives. These devices rely on miniature chips made from semiconductor materials, commonly silicon ("Si"). These silicon materials are also used to make sensing devices that can capture images of objects or scenes. Silicon is widely used because it is an abundant material and silicon-based semiconductor manufacturing is mature due to the investments made in the electronics industry. A common technology process is called complementary metal oxide semiconductor, or "CMOS." The CMOS technology was developed for manufacturing integrated circuits but is now used for image sensors and photodetectors. Such image sensors are called CMOS image sensors (CIS) and such photodetectors may be charge coupled devices (CCDs) or silicon single photon avalanche detectors (SPADs). Oftentimes, such CMOS sensors are manufactured using high-volume manufacturing with 8- and 12-inch silicon wafers. These image sensors and photodetectors are used for visible cameras and for near infrared (NIR) sensing. The latter form of these devices may be used for LiDAR scanning, facial recognition, proximity sensors, 3D imaging, and other applications. A common wavelength range for these sensors for such applications is about 900-940 nm.

Despite the advances with CMOS image sensors and photodetectors, limitations or drawbacks exist. For example, CMOS sensors have limitations in the detectable wavelength range. These CMOS sensors suffer from poor sensitivity at longer wavelengths within the detectable wavelength range. These and other limitations may also exist.

From the above, it is desired that the industry develops improved sensing devices.

BRIEF SUMMARY OF THE INVENTION

The present invention is generally related to electronic devices. More specifically, the present invention provides techniques related to optoelectronic devices such as, but not limited to, photodetectors and photodetector array circuits using heteroepitaxy of compound semiconductor ("CS") materials on silicon and other large-diameter substrates, along with subsequent circuit fabrication and integration methods. Merely by way of example, the present invention can be applied to various applications including image sensing, range finding, including LiDAR (light detection and ranging), among others, but it will be recognized that there are many other applications.

According to an example, the present invention provides for a stacked focal planar array (FPA) device and method of fabrication. The method can include forming photodetectors or FPAs by heteroepitaxial growth of III-V PINs, APDs, or other photodetector devices that are bonded to a Si-based read-out integrated circuit (ROIC) wafer in a stacked configuration. In a single-color device example, a wavelength configuring buffer layer and photodetector are grown on a first substrate using CS materials to enable infrared detection at desired wavelength(s). Depending on the application, this growth can be done on a graded compliant buffer layer and/or a selectively transparent buffer layer. And, silicon detectors can be incorporated to detect visible and NIR wavelengths in a dual-color device example. Further, the resulting devices can be bonded overlying the ROIC device in a flipped orientation and configured as pixels in a sensor array device coupled to the ROIC device.

Benefits or advantages are achieved over conventional techniques. The integration platform based on heteroepitaxy of CS materials and device structures on Si by direct or selective heteroepitaxy enables large-volume manufacturing of optoelectronic devices, such as image sensor and laser arrays. The use of selectively transparent wavelength or graded configuring materials enables high performance at target wavelength ranges with low dislocation density. These devices fabricated using the present techniques can exhibit improved detectable wavelength range, higher sensitivity, and other related performance metrics. These and other benefits or advantages are described throughout the present specification and more particularly below.

A further understanding of the nature and advantages of the invention may be realized by reference to the latter portions of the specification and attached drawings.

BRIEF DESCRIPTION OF THE DRAWINGS

In order to better understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 48-53 are simplified diagrams illustrating methods of fabricating a compound semiconductor (CS) photodetector circuit device 4800 according to an example of the present invention.

FIGS. 56A-56E are simplified diagrams illustrating a method of forming a photodetector device according to an example of the present invention.

DETAILED DESCRIPTION OF THE INVENTION

Figure 1:
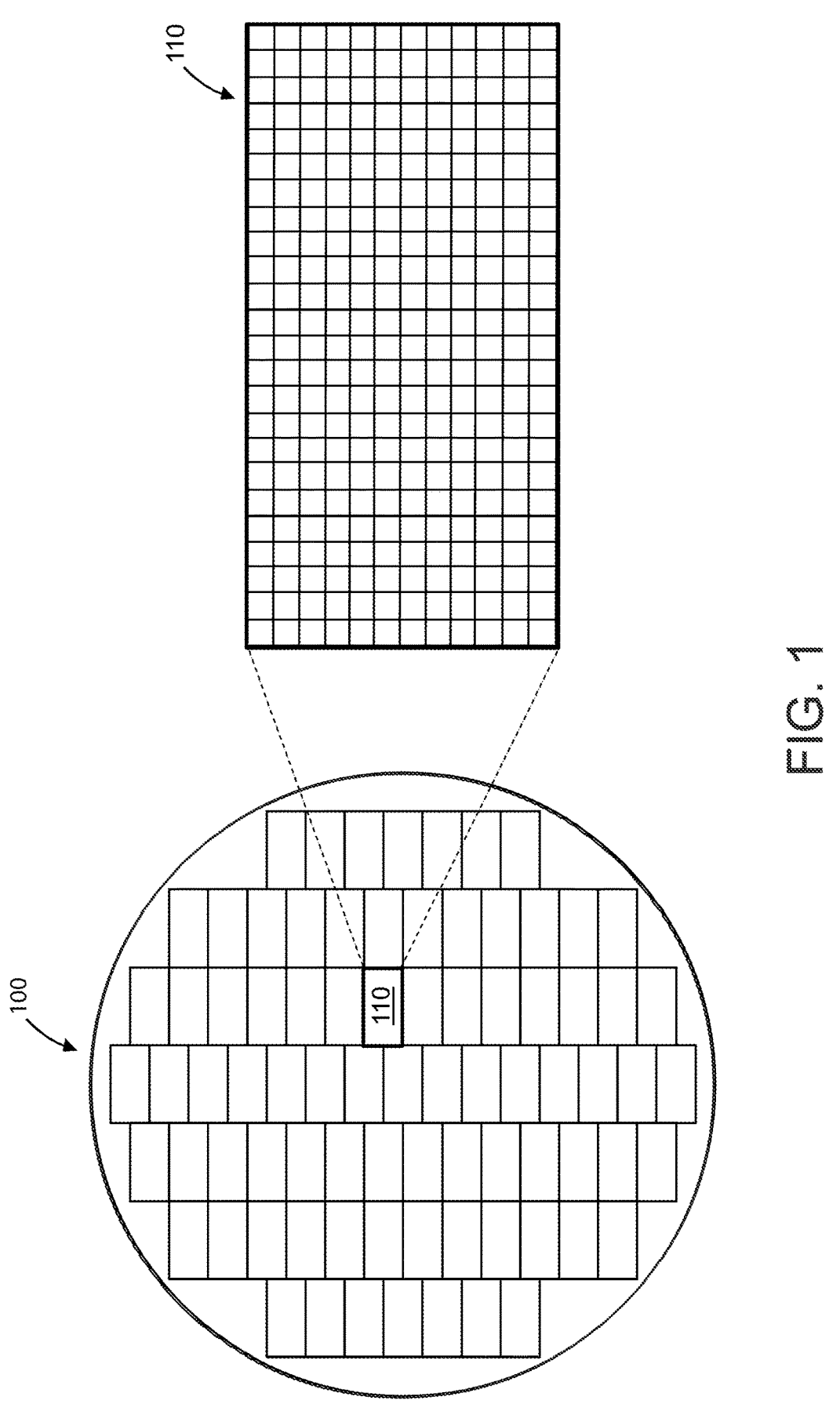
FIG. 1 is a simplified diagram illustrating a silicon wafer having a plurality of array device regions according to an example of the present invention.

The present invention is generally related to electronic devices. More specifically, the present invention provides techniques related to optoelectronic devices for mobile applications such as, but not limited to, photodetectors and photodetector array circuits using heteroepitaxy of CS materials on Si and other large-diameter substrates, along with subsequent circuit fabrication and integration methods. Merely by way of example, the present invention can be applied to various applications including image sensing, range finding, LiDAR, among others, but it will be recognized that there are many other applications.

In an example, the present invention provides method and device for realizing highly manufacturable and scalable semiconductor optoelectronic devices, including photodetector circuit arrays, on Si substrates that can be implemented in a variety of module devices. By directly depositing CS materials on Si substrates, mature Si microelectronics manufacturing processes can be leveraged to fabricate high performance photodetector circuits. Deposition on 8- and 12-inch Si substrates, which are common for CMOS technologies, enables the subsequent fabrication in CMOS manufacturing lines, however, the technology is not limited to 8- and 12-inch Si substrates only. CS materials can be deposited directly onto Si substrates with the techniques described in the present invention.

The technique to describe the direct deposition of CS materials is referred to herein as heteroepitaxy. The heteroepitaxy step or steps may be carried out with techniques including, but not limited to, metalorganic chemical vapor deposition (MOCVD), molecular beam epitaxy (MBE), metalorganic MBE (MOMBE), chemical beam epitaxy (CBE), hydride vapor phase epitaxy (HVPE), liquid phase epitaxy (LPE), or any combination thereof.

In addition to Si substrates, alternative substrates may be used including, but not limited to, silicon on insulator (SOI), miscut Si, SOI on miscut Si, germanium (Ge) on Si, Ge, miscut Ge, or gallium arsenide (GaAs) substrates, without departing from the scope of the invention.

In an embodiment of the present invention, CS material is deposited onto a Si substrate by heteroepitaxy, by firstly depositing a buffer material that includes an initial nucleation on the Si surface and enables the trapping, annihilation, and/or filtering of defects near the interface between the CS material and the Si surface. The initial nucleation step may be carried out at a relatively low temperature, and the subsequent buffer material growth intended to trap, annihilate and/or filter defects may be carried out at a higher temperature. Surface treatment may be carried out prior to the initial nucleation on the Si surface. This treatment may include, but is not limited to, chemical cleaning and/or treatment of the Si surface, reordering of the Si surface with high-temperature annealing in an ambient, high-temperature annealing in an ambient to remove and/or treat a surface oxide, or the formation of various Si crystal planes by treatment or etching.

The initial nucleation and buffer growth can be carried out with a number of methodologies, and combinations of methodologies, including, but not limited to, initial group IV (e.g., Si or Ge material) growth for surface reordering or reparation followed by CS growth for defect trapping, or Si surface patterning or structuring, that may include formation of various Si crystal planes, followed by CS nucleation and growth, or low-temperature CS nucleation, or low-temperature CS nucleation followed by multi-step growth with temperature grading for defect bending and annihilation, or use of strained layer superlattices (SLSs), interfaces with high strain fields, graded or step-graded layers, or other similar techniques to redirect, trap, convert, and/or annihilate defects.

The techniques of the present invention can be used to manufacture various optoelectronic devices in high volumes by leveraging Si manufacturing methods. These devices include, but are not limited to, lasers that are either edge-emitting or vertical cavity surface emitting, optical modulators, photodetectors or photodiodes, semiconductor optical amplifiers, and nonlinear devices for optical frequency comb generation. Specific to image sensors and photodetector circuit arrays, various device structures could be realized by heteroepitaxy deposition of device layers and subsequent fabrication steps. These device structures include, but are not limited to, planar photodiodes, mesa photodiodes, double mesa photodiodes, PIN or NIP photodiodes, avalanche photodiodes (APDs), charge coupled devices (CCDs), focal plane array (FPA) devices, single photon avalanche detectors (SPADs), and uni-traveling-carrier (UTC) photodiodes.

The optoelectronic devices and device arrays realized with deposition of CS materials on Si can be leveraged in various applications, including, but not limited to, LiDAR; LiDAR for autonomous vehicles including, but not limited to, automobiles, aerial vehicles, airplanes, jets, drones, robotic vehicles; advanced driver assistance systems (ADAS); LiDAR for mobile devices including, but not limited to, phones and tablets; imaging for camera applications including, but not limited to, digital cameras, mobile phones, tablets; imaging and perception for robots, artificial intelligence (AI) applications, augmented reality (AR) applications, and virtual reality (VR) applications; 3D imaging and sensing; defense and aerospace; industrial vision, factory automation; medical and biomedical imaging; topography, weather, and wind mapping; gas sensing; infrared (IR) and near infrared (NIR) imaging and sensing; smart building, security, people counting; proximity sensing;

facial recognition, thermal imaging, thermography; heating, ventilation and air conditioning (HVAC);

In addition to the group III-V CS materials, the techniques of the present invention could apply to other materials for photodetector circuits including, but not limited to, II-VI compounds, IV-VI compounds, II-V compounds, or IV-IV compounds.

In another embodiment, the CS nucleation, buffer materials and subsequent photodetector materials may be deposited and formed by selective area heteroepitaxy, whereby the Si or similar substrate could be first patterned with a dielectric to form recesses, within which the CS nucleation, the buffer materials and the photodetector materials could be selectively deposited. Selective area heteroepitaxy is the process by which the Si substrate would be patterned with a dielectric, and the subsequent deposition of semiconductor materials would deposit selectively on the exposed Si surfaces but not on the dielectric surfaces. Selective area heteroepitaxy is beneficial for improving the quality of the CS material on Si, for facilitating photodetector fabrication, and also for realization of novel device structures. Selective area heteroepitaxy can improve material quality by releasing thermal strain caused by the mismatch in thermal expansion coefficient between the CS materials and the Si, and by providing aspect ratio trapping of defects and dislocations.

FIG. 1 is a simplified diagram illustrating a silicon wafer 100 having a plurality of array device regions (or pixel device regions) according to an example of the present invention. In as specific example, the wafer 100 can include a CMOS based ROIC wafer. Here, the plurality of array device regions 110 is spatially configured to maximize wafer yield. A close-up of one of the device regions 110 is indicated by the dotted lines to the right of the wafer 100. As shown, the array device region 110 includes a plurality of device regions 112. In an example, each device region 112 includes an array of pixels devices, and each pixel device can include partially or fully fabricated electronic circuit elements intended to connect with an optoelectronic device (e.g., photodetector, or the like) for the purposes of transmitting and/or processing a signal. Example methods of fabricating these pixel devices are shown in the following figures.

According to various examples, the present invention provides for methods of fabricating monolithic single or dual color photodetector devices or focal plane array (FPA) devices by a heteroepitaxial growth process. This growth process can be used to form III-V PINs, avalanche photodiodes (APDs), or other photodetector devices in etched recesses of a Si-based read-out integrated circuit (ROIC) wafer. The process can also include forming a wavelength configuring buffer layer upon which the photodetector device layers are grown. For single-color detectors or FPAs, the wavelength configuring buffer layer and photodetector is grown in such a way as to enable infrared detection at one or more desired detection wavelengths.

FIGS. 2A-2B to FIGS. 11A-11B are simplified diagrams illustrating a method of fabricating a monolithic single color FPA device according to an example of the present invention. In these figures, the "A" figure shows a cross-sectional view of the device, while the "B" figure shows a top view of the device configured as part of the array device 110 shown in FIG. 1. Also, shared reference numerals in subsequent figures refer to the same elements as described in previous figures.

Figures 2A, 2B:
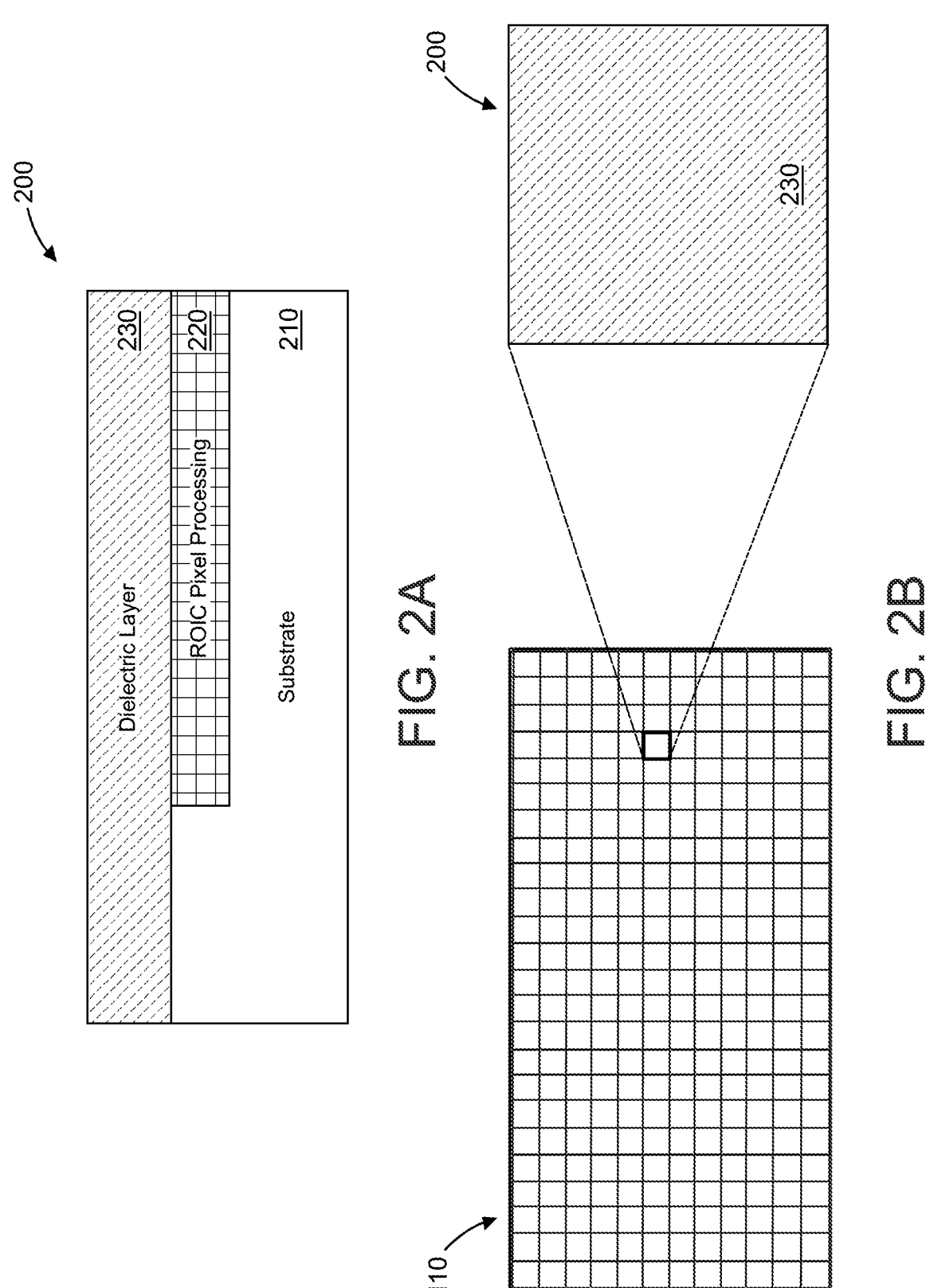
FIGS. 2A-2B to FIGS. 11A-11B are simplified diagrams illustrating a method of fabricating a monolithic single color FPA device according to an example of the present invention.

In FIG. 2A, the method for fabricating single color FPA device 200 starts with a substrate (e.g., silicon substrate, or the like) 210 with a partially processed ROIC device 220 formed within a first portion of the substrate 210 and a first dielectric layer (e.g., silicon dioxide, low-K dielectric, or the like) 230 formed overlying the ROIC device 220 and a second portion of the substrate 210. As shown, this first portion can be a recessed portion, as shown in FIG. 2A. FIG. 2B shows the dielectric layer 230 covering both the ROIC device 220 and the substrate 210.

Figures 3A, 3B:
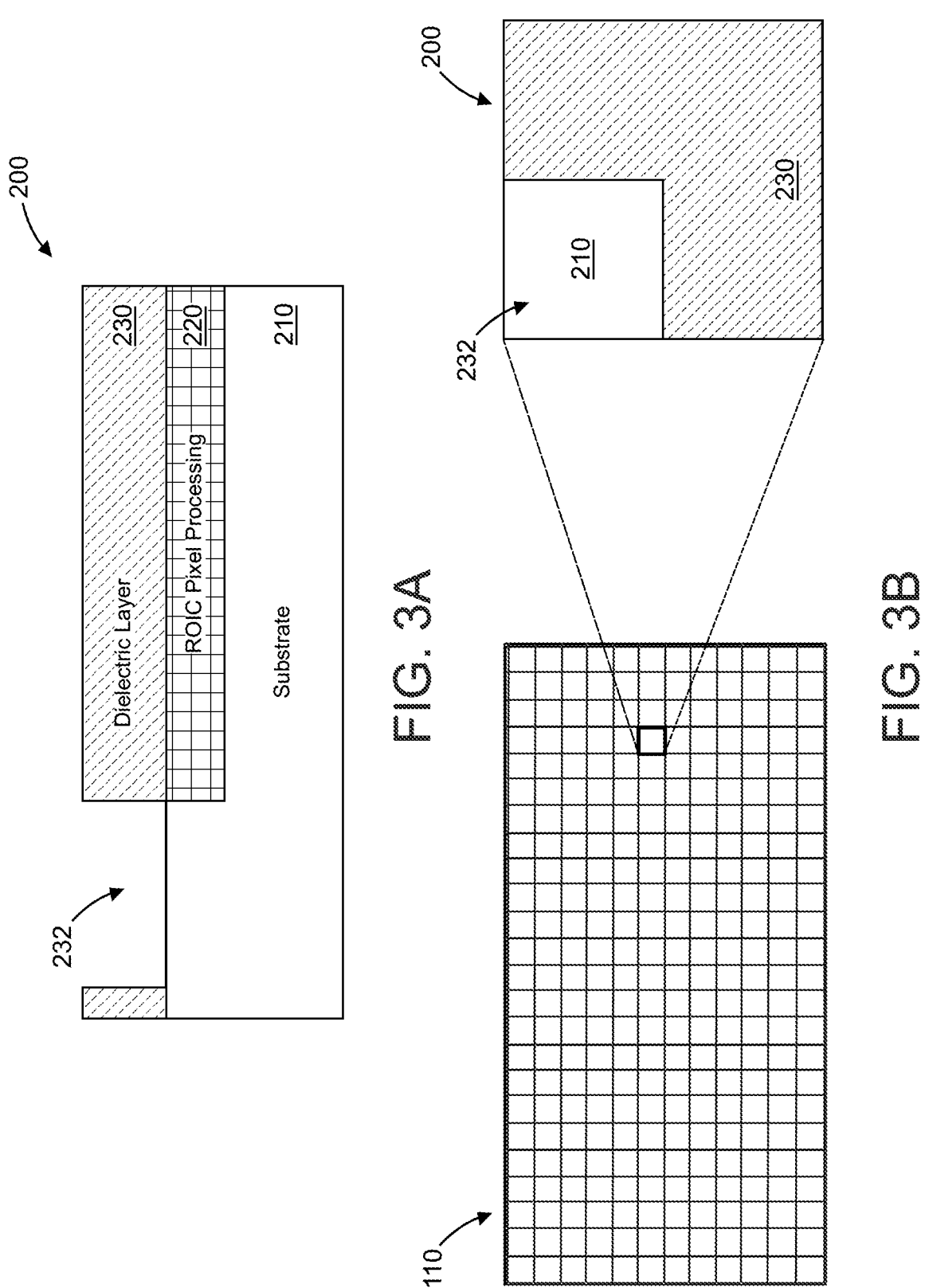

In FIG. 3A, a portion of the dielectric layer 230 is removed to form a cavity region 232 to expose the second portion of the substrate 210. The removal process can include a masking and patterning process, including an etching process, such as wet etching, dry etching, or the like. FIG. 2B shows that the cavity region 232 exposes a top-left corner of the substrate 210 as being the second portion, however the second portion that is exposed and the first portion within which the ROIC device 220 is formed can vary in shape and size.

In FIG. 4A, a buffer material 240 is formed overlying the substrate 210 within the cavity region 232. This buffer material 240 can be a wavelength configuring material, which is discussed later in further detail. FIG. 4B shows the buffer material 240 overlying the previously exposed second portion of the substrate 210.

Figures 5A, 5B:
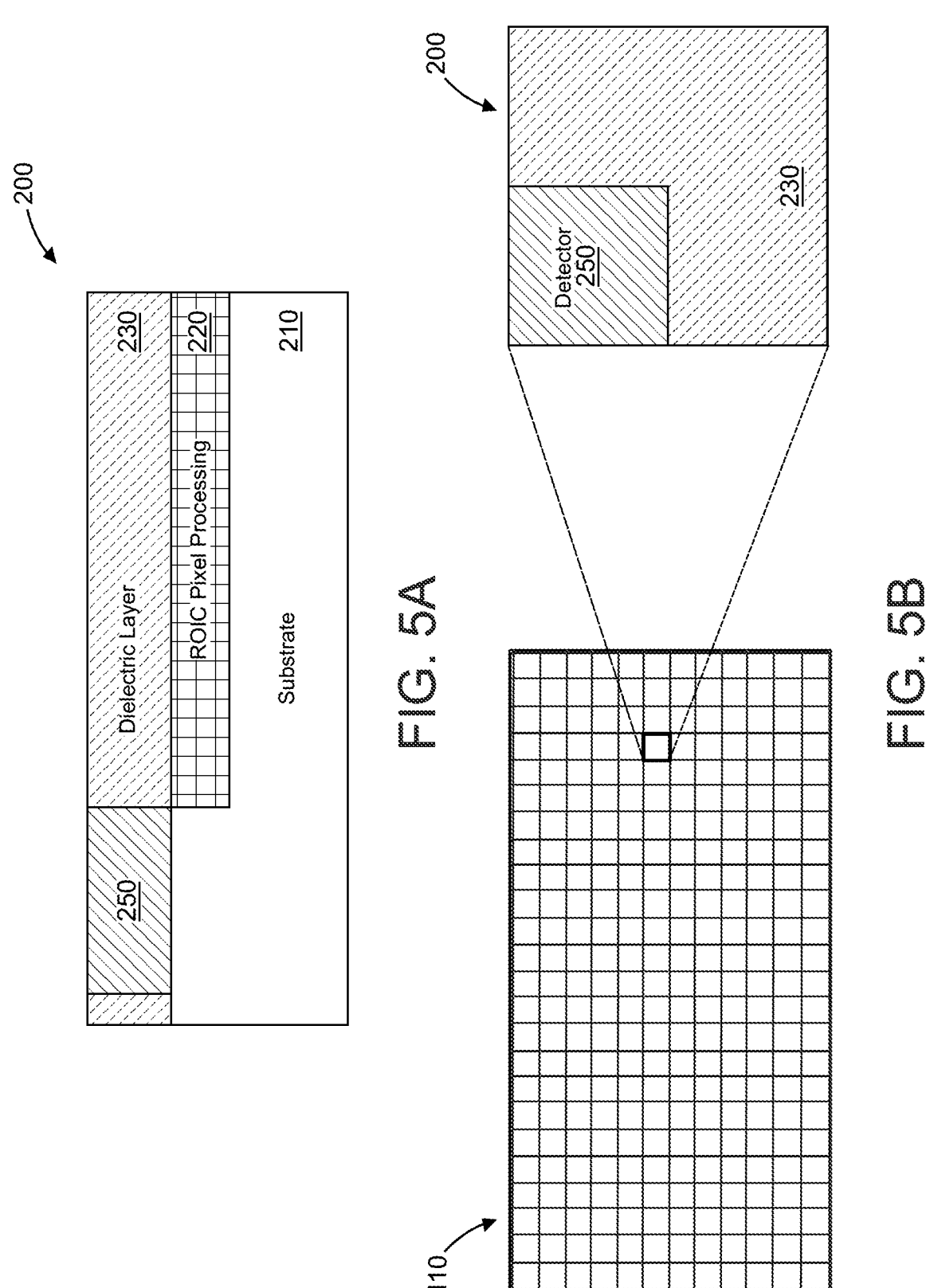

In FIG. 5A, photodetector materials are formed overlying the buffer material 240 to form a photodetector device 250. These photodetector materials are discussed later in further detail. In a specific example, the photodetector device 250 can be configured as a III-V pixel IR device, or the like. FIG. 5B shows the photodetector device 250 formed overlying the previously formed buffer material 240.

Figures 6A, 6B:
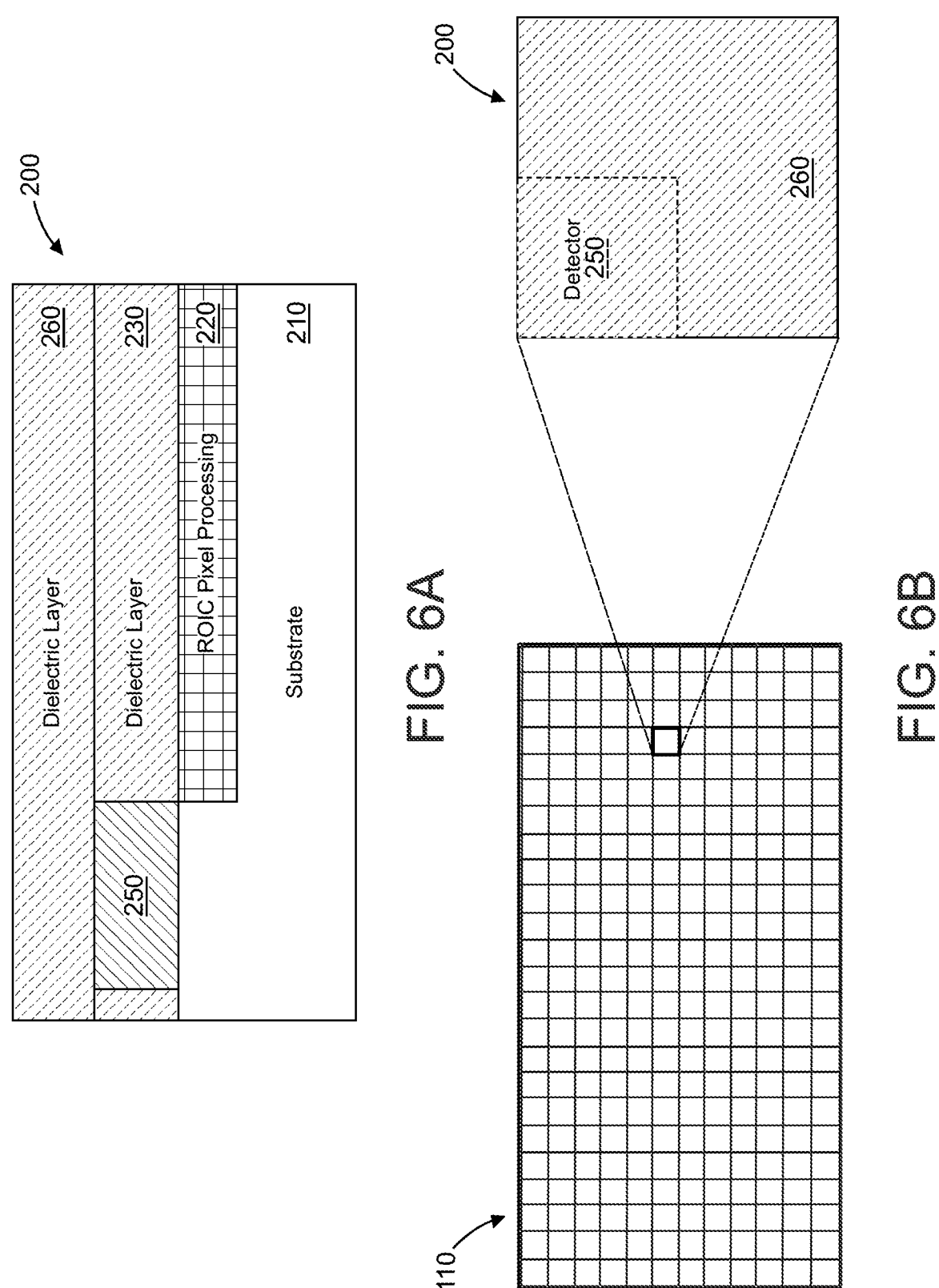

In FIG. 6A, a second dielectric layer 260 is formed overlying the first dielectric layer 230 and the photodetector device 250. FIG. 6B shows the second dielectric layer 260 overlying all previous elements.

Figures 7A, 7B:
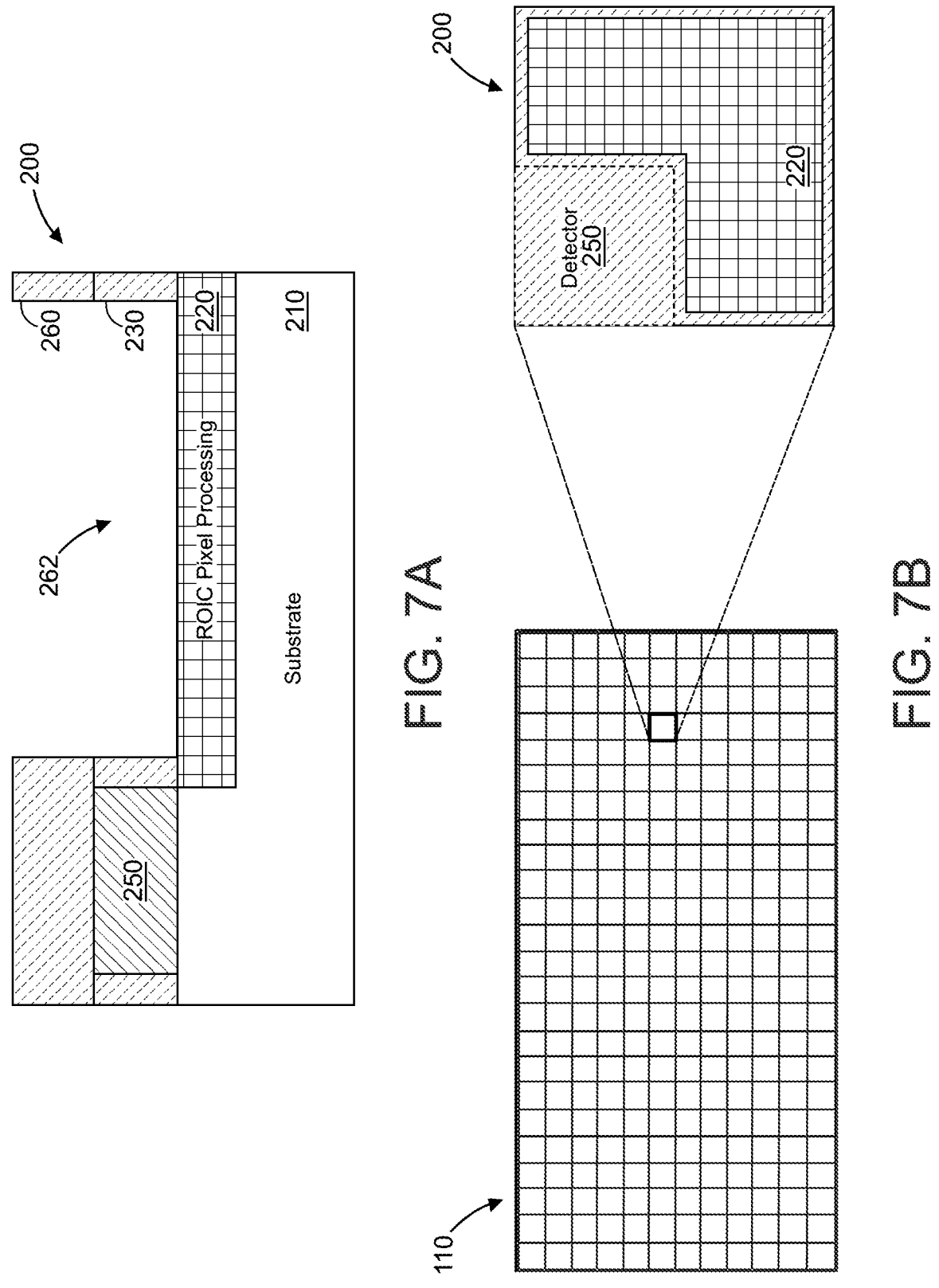

In FIG. 7A, a cavity region 262 is formed within a portion of the first and second dielectric materials 230, 260 overlying and exposing the ROIC device 220. The formation of this cavity region 262 can include a similar masking and patterning process as discussed previously. FIG. 7B shows that the cavity region 262 exposes the ROIC device 220 within the first portion of the substrate 210 in an "L" shape, however the first portion that is exposed can vary in shape and size, as stated previously.

Figures 8A, 8B:
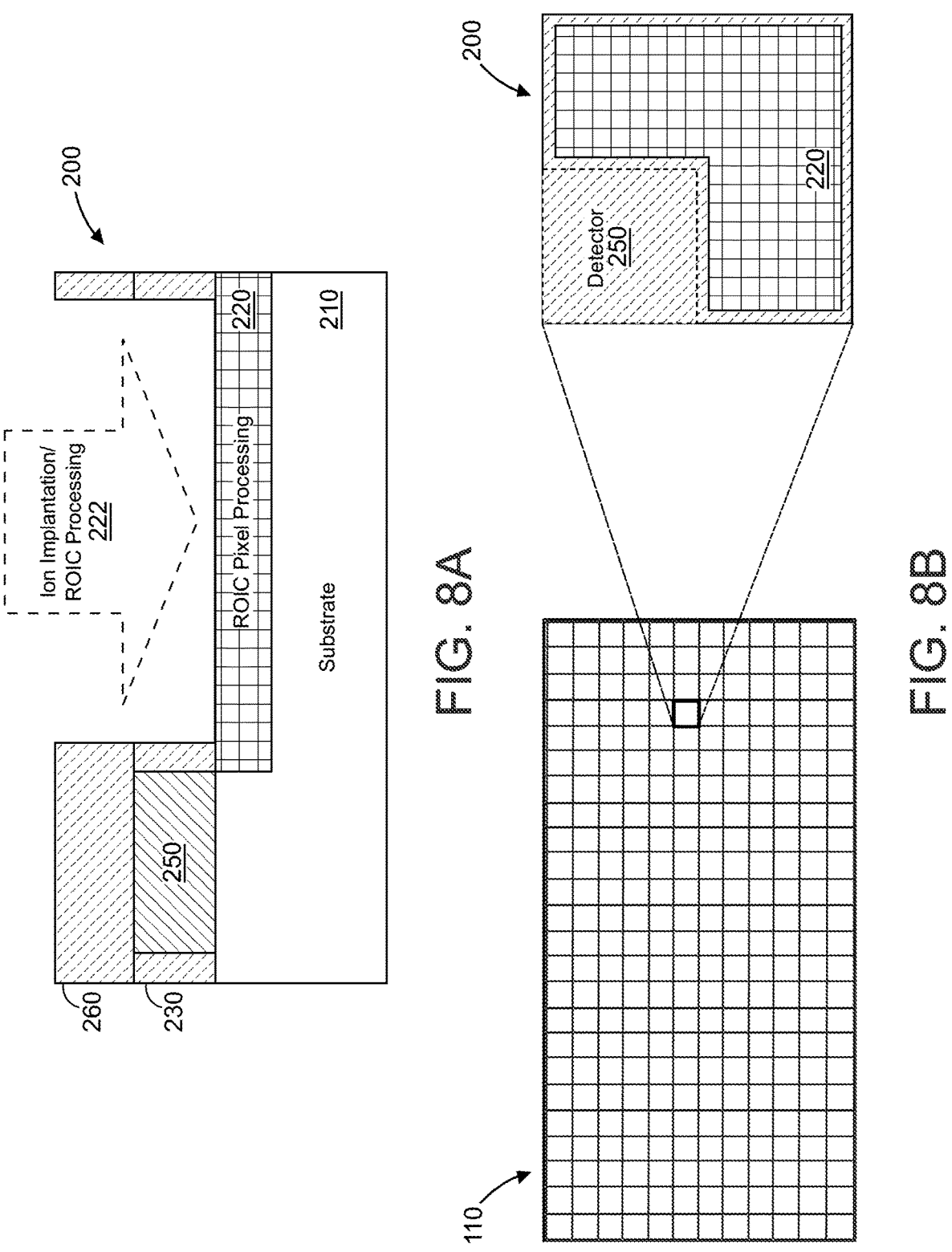

In FIG. 8A, the exposed ROIC device 220 is subjected to IC processing 222, which can include an ion implantation process and other fabrication processes to finalize the ROIC 220. FIG. 8B shows that the ROIC device 220 is still exposed during these processing steps.

Figures 9A, 9B:
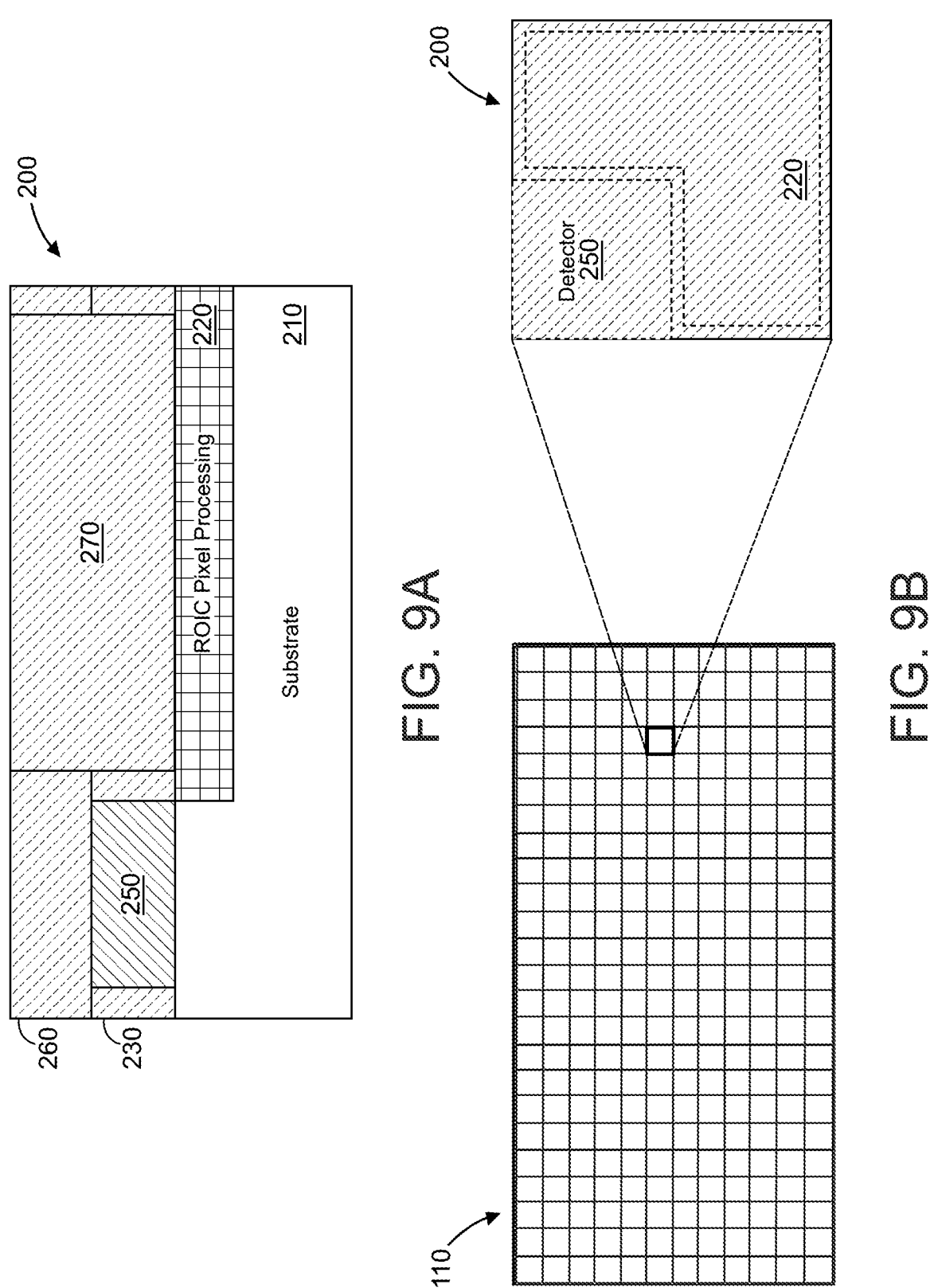

In FIG. 9A, a first dielectric material 270 is formed within the cavity region 262 overlying the ROIC device 220. FIG. 9B shows that the ROIC 220 is no longer exposed following the formation of this first dielectric material 270.

Figures 10A, 10B:
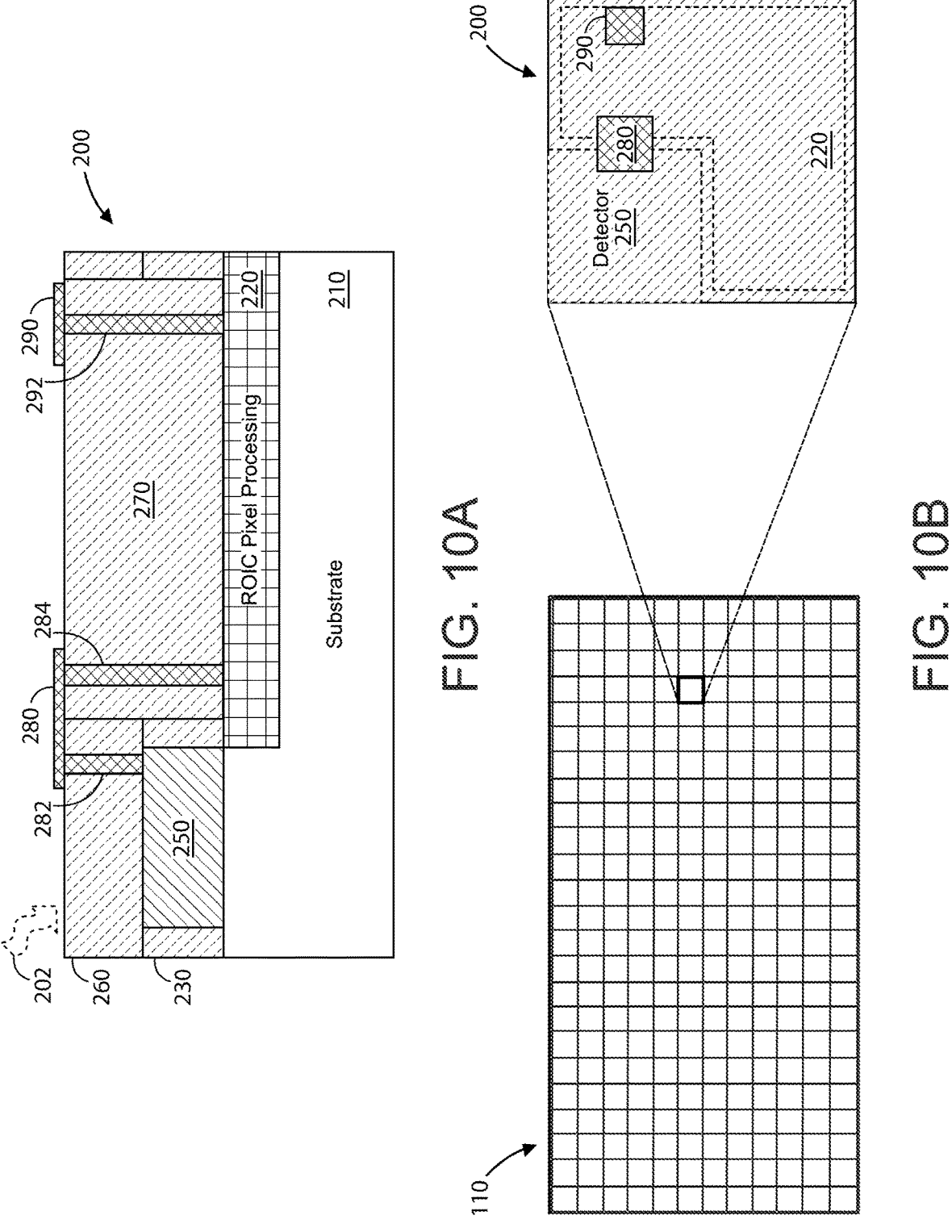

In FIG. 10A, a first bond pad 280 is formed overlying at least a portion of the second dielectric layer 260 and a portion of the first dielectric material 270, and is coupled to the ROIC device 220 and the photodetector device 250. The first bond part 280 is coupled to the photodetector device 250 by a first metal interconnection 282 through the second dielectric layer 260, and is coupled to the ROIC device 220 by a second metal interconnection 284 through the first dielectric material 270. These metal interconnections 282, 284 can be formed as via structures coupled to the first bond pad 280, or as other similar structures. Also, a second bond pad 290 can be formed overlying another portion of the first dielectric material 270. This second bond pad 290 can be coupled to the ROIC device 220 by a metal interconnection 292, which can also be formed as via structures, or the like. FIG. 10B shows an example orientation of the first and second bond pads 280, 290.

Figures 11A, 11B:
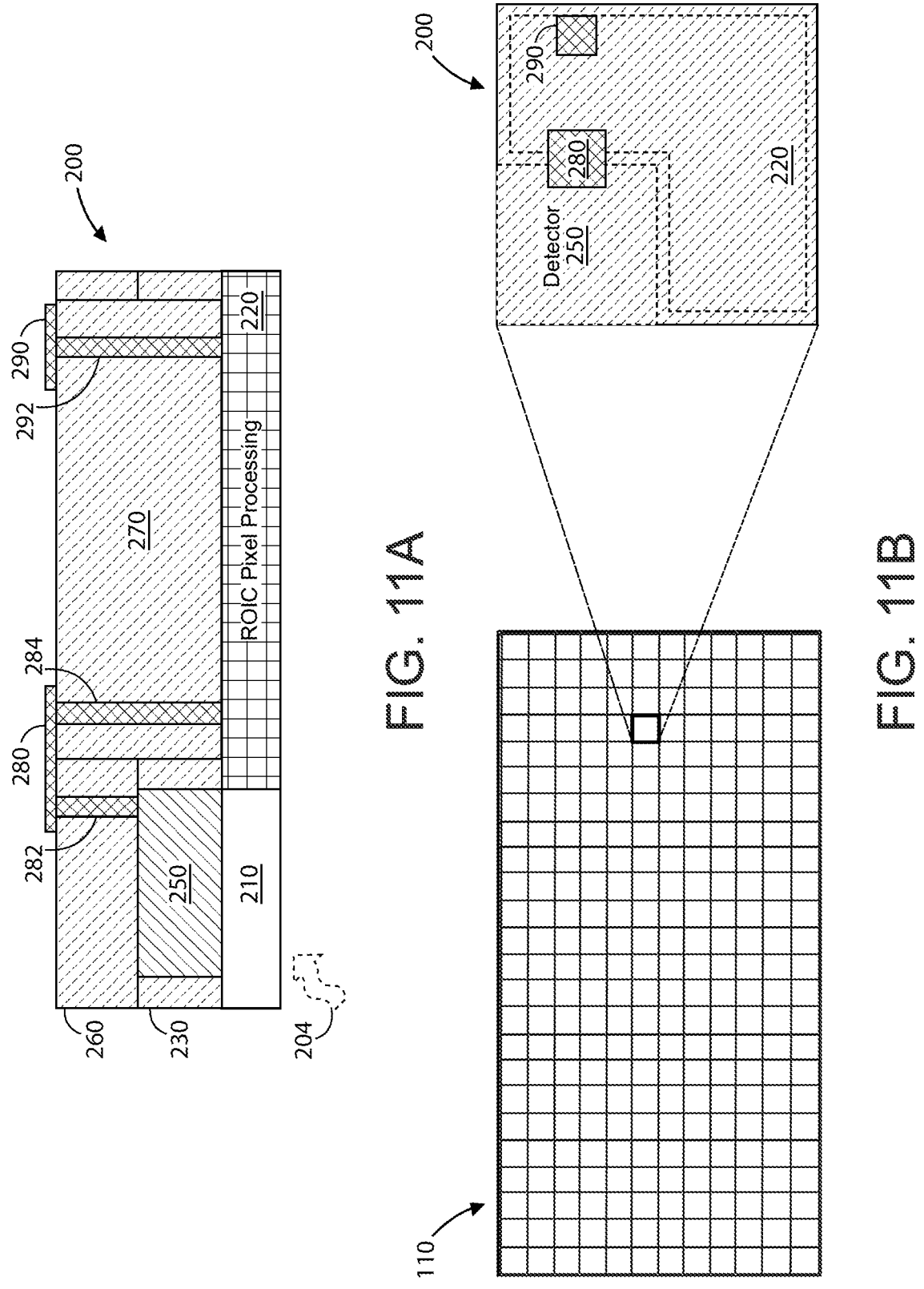

Depending on the application, the device 200 can be configured for front-side illumination (e.g., 900 to 2500 nm) or backside illumination (e.g., beyond 1000 to 2500 nm). As shown in FIG. 10A, the device 200 is configured for front-side illumination, as indicated by the top-side dotted line arrow 202 to the photodetector device 250. However, FIG. 11A shows the device 200 in a backside illumination configuration, as indicated by the back-side dotted line arrow 204. In this case, the substrate 210 can be thinned to expose the backside of the ROIC device 220 or to a desired thickness to such that the photodetector 250 can operate in the backside illumination configuration. The thinning process can include flipping the device on to a handling interposer and subsequently removing or thinning the substrate 210. Further details of the front-side and backside illumination configurations are discussed in reference to FIGS. 59A, 59B, 60A, and 60B.

Other steps can be taken to finish fabrication of the device 200, including the formation of additional metal interconnects or other backend processing steps, such as generating anti-reflection (AR) coatings on either the front or backside of the chip, forming lens structures (e.g., micro lens array, metalens array, or the like), and others. Other elements and method steps described herein can also be incorporated as well. For example, the formation of the photodetector or FPA device can be done on a graded compliant buffer layer, and can be configured to enable detection at desired wavelengths (e.g., 900 to 2500 nm). Those of ordinary skill in the art will recognize other variations, modifications, and alternatives.

For dual-color detectors or FPAs, the photodetector device 250 can be formed by steps similar to those discussed previously. Additionally, semiconductor detectors (e.g., silicon detectors, or the like) may be monolithically incorporated into the device 200 so as to enable detection as different wavelengths (e.g., about 900-2500 nm). FIGS. 12A-12B to FIGS. 24A-24B are simplified diagrams illustrating a method of fabricating a monolithic dual color FPA device according to an example of the present invention. In these figures, the "A" figure shows a cross-sectional view of the device, while the "B" figure shows a top view of the device configured as part of the array device 110 shown in FIG. 1. Also, shared reference numerals in subsequent figures refer to the same elements as described in previous figures.

Figures 12A, 12B:
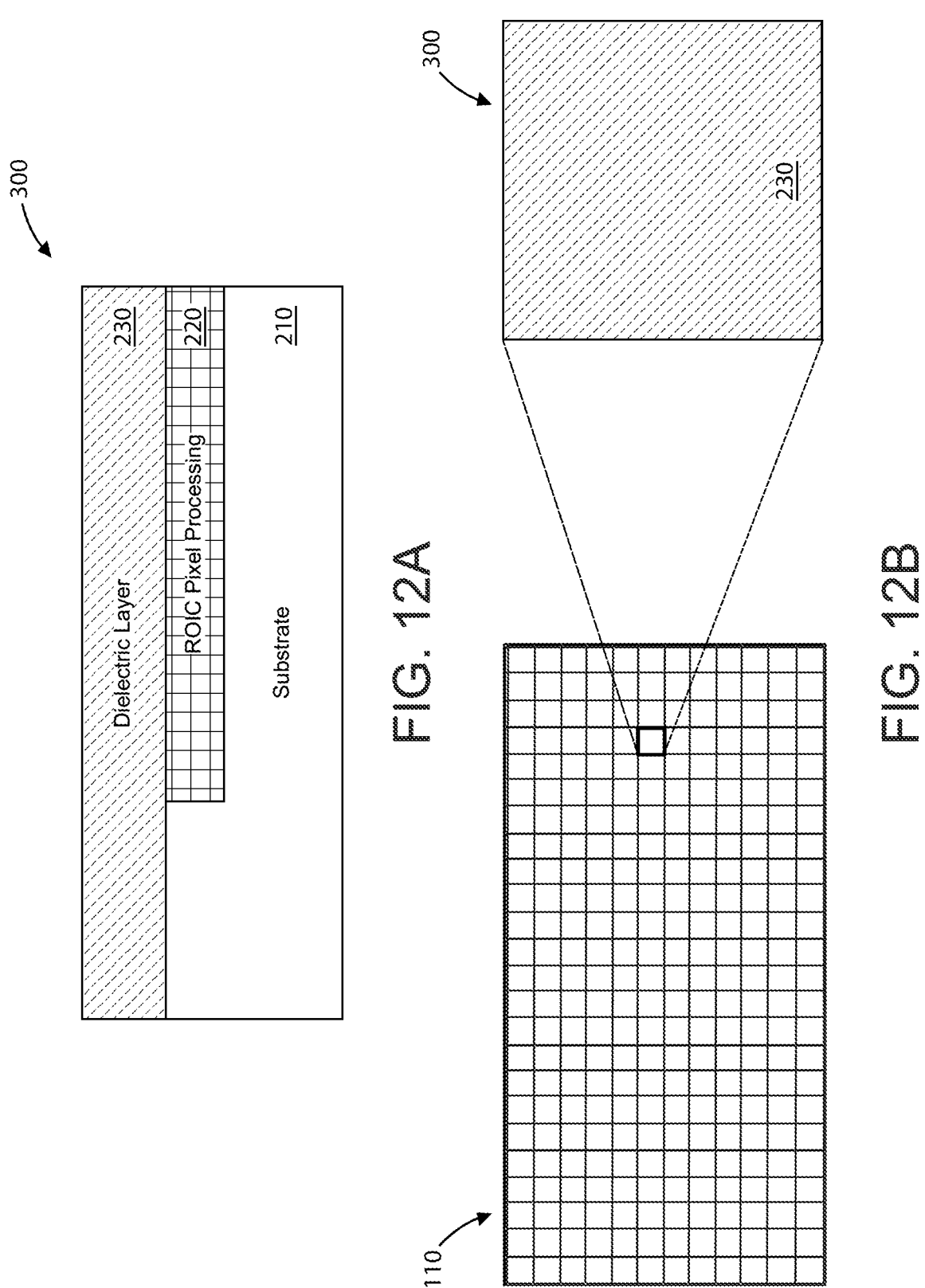
FIGS. 12A-12B to FIGS. 24A-24B are simplified diagrams illustrating a method of fabricating a monolithic dual color FPA device according to an example of the present invention.

FIGS. 12A and 12B show that the method for fabricating dual color FPA device 300 starts with a substrate 210 with a partially processed ROIC device 220 formed within a first portion of the substrate 210 and a first dielectric layer 230 formed overlying the ROIC device 220 and a second portion of the substrate 210, similar to FIGS. 2A and 2B.

Figures 13A, 13B:
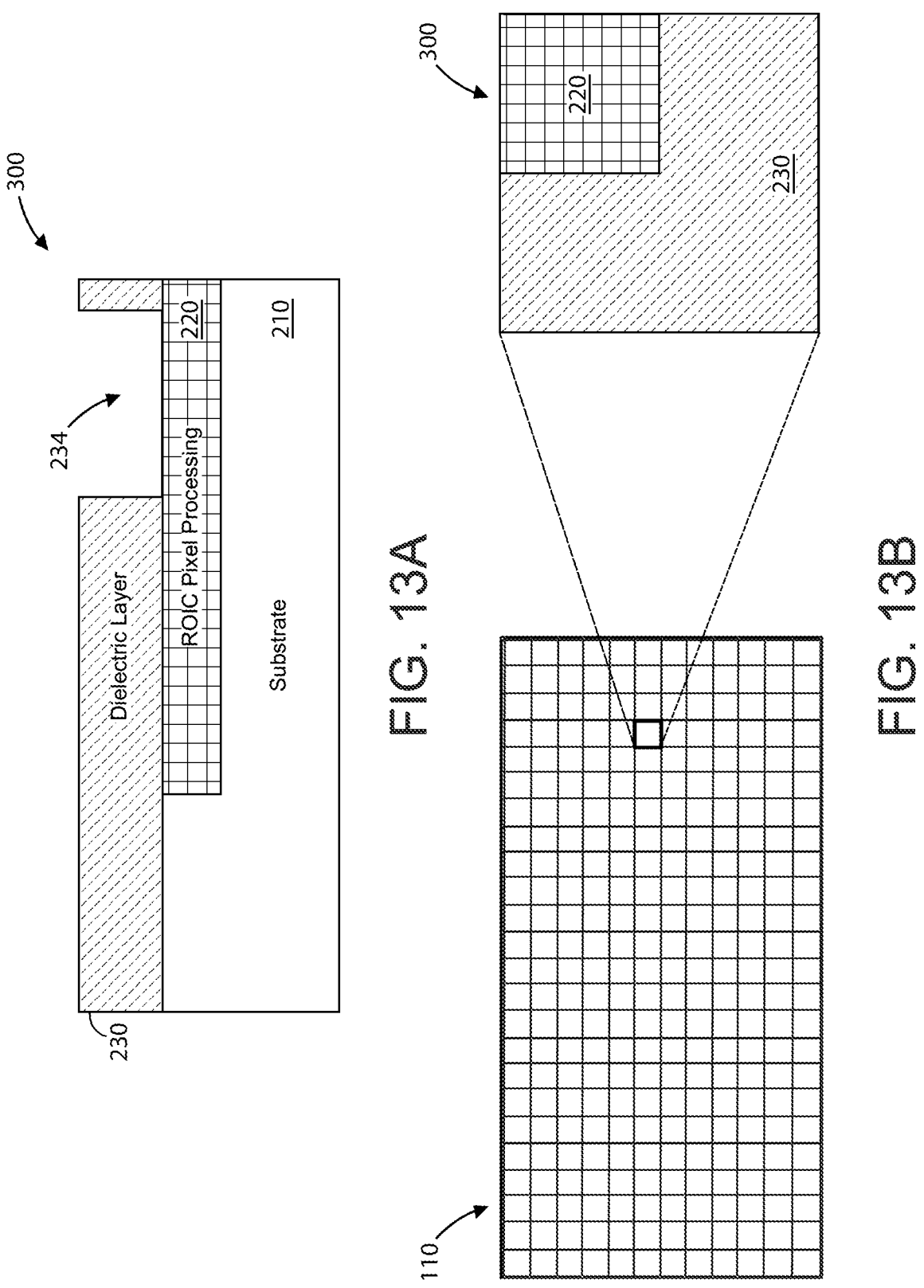

However, in FIG. 13A, a first cavity region 234 is formed within a portion of the first dielectric layer 230 overlying and exposing a portion of the ROIC device 220. FIG. 13B shows that the first cavity region 234 exposes a top-right corner of the substrate 210, however this first cavity region 234 can vary in shape and size.

Figures 15A, 15B:
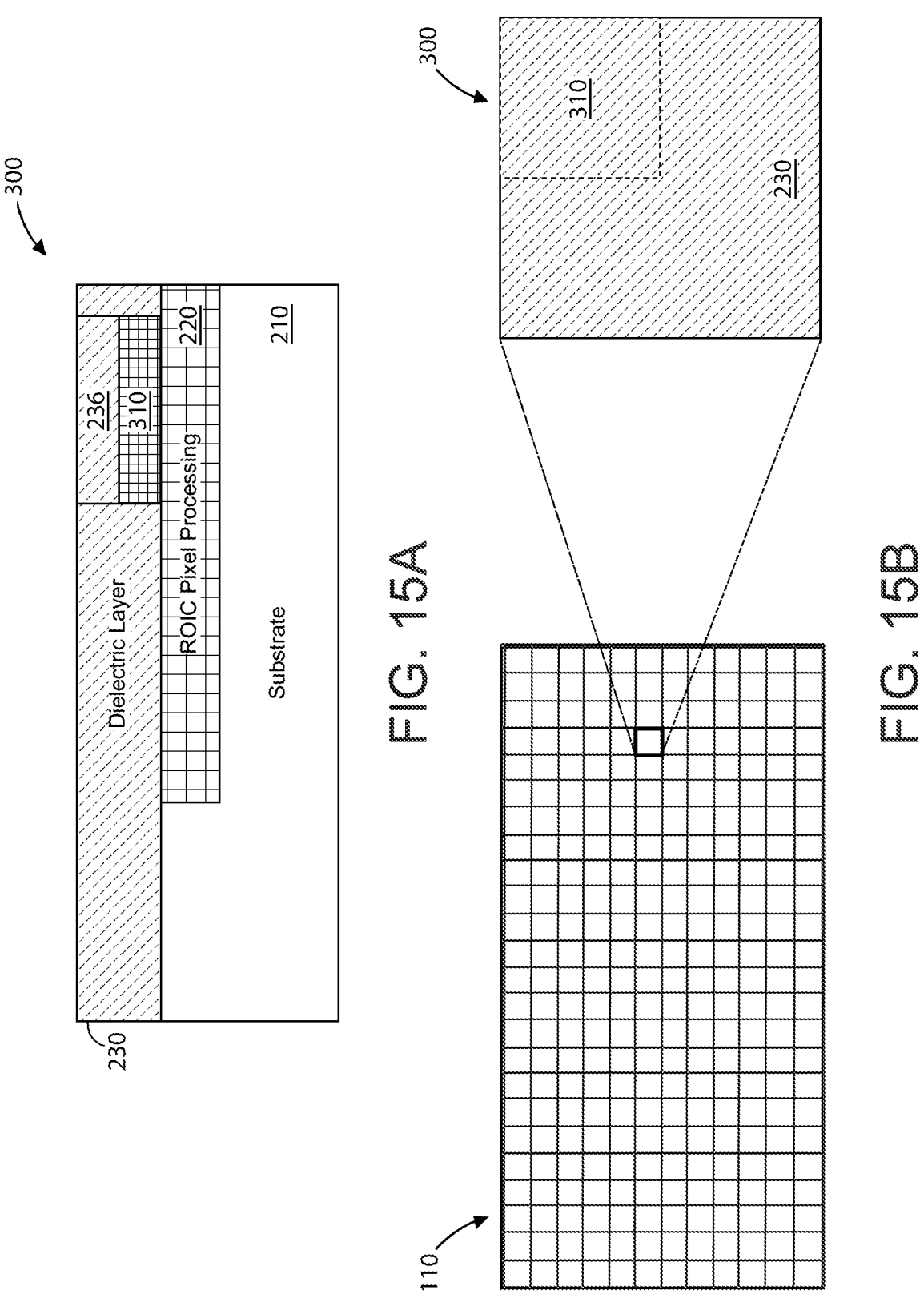
Figures 16A, 16B:
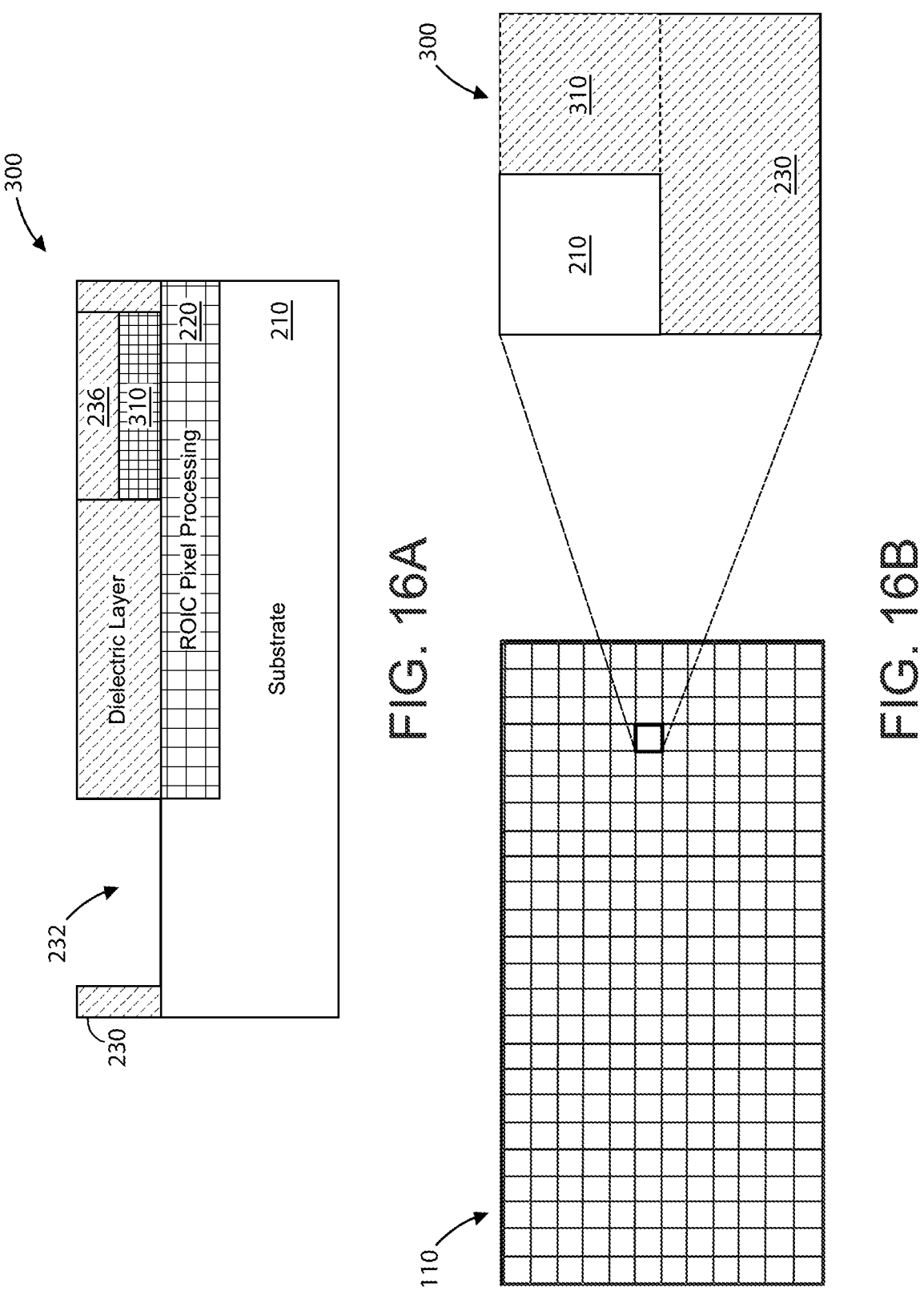
Figures 17A, 17B:
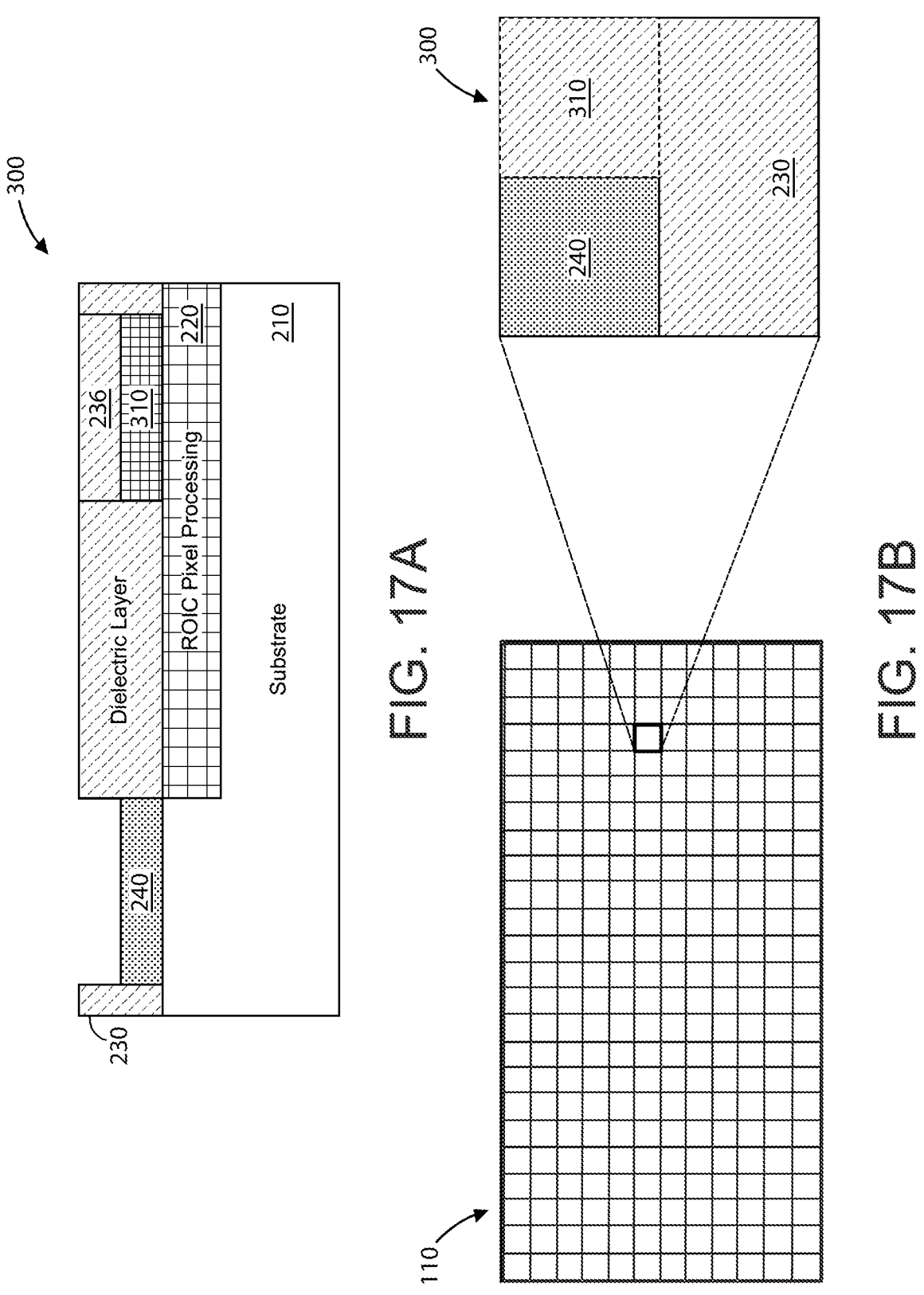
Figures 18A, 18B:
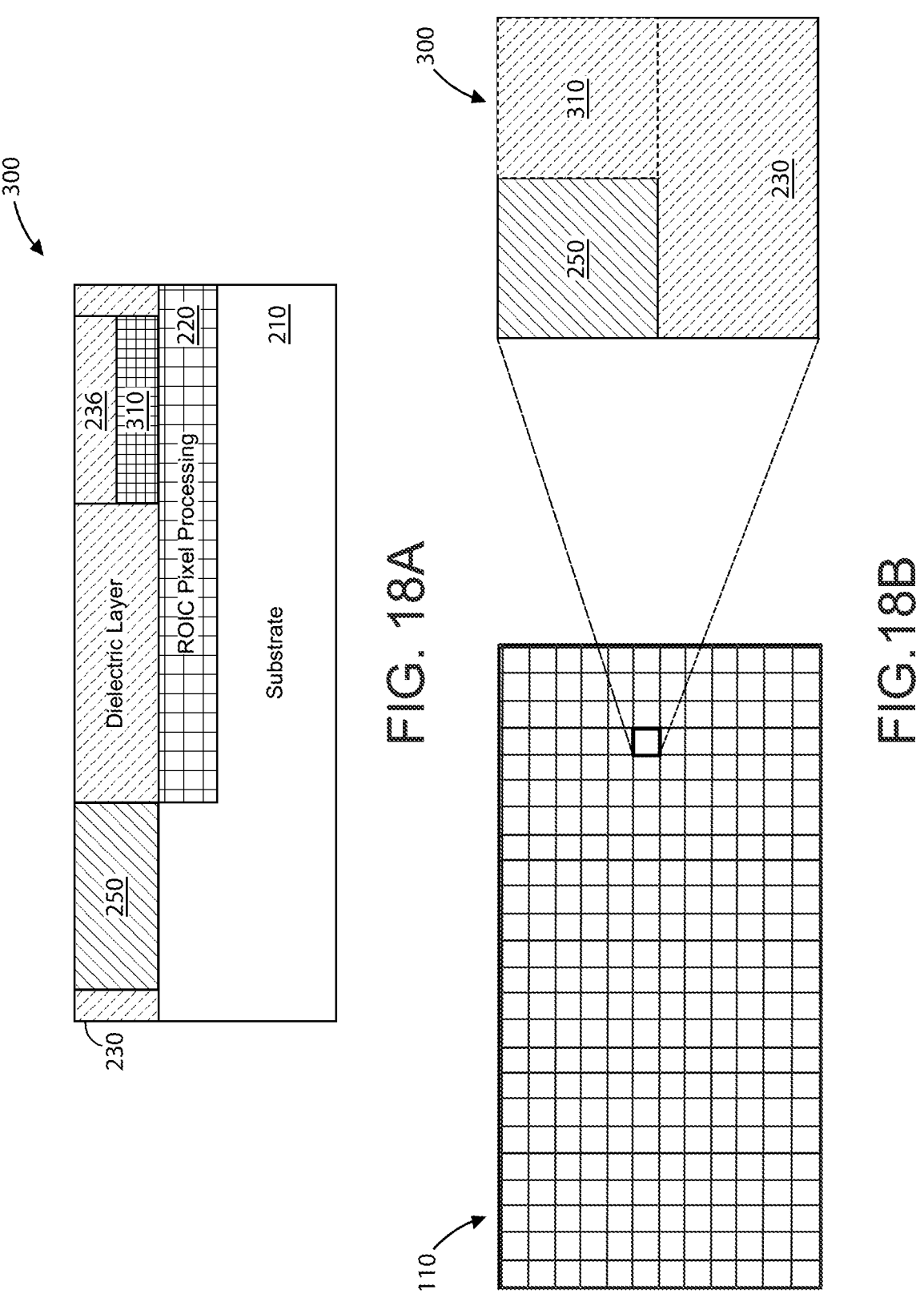
Figures 19A, 19B:
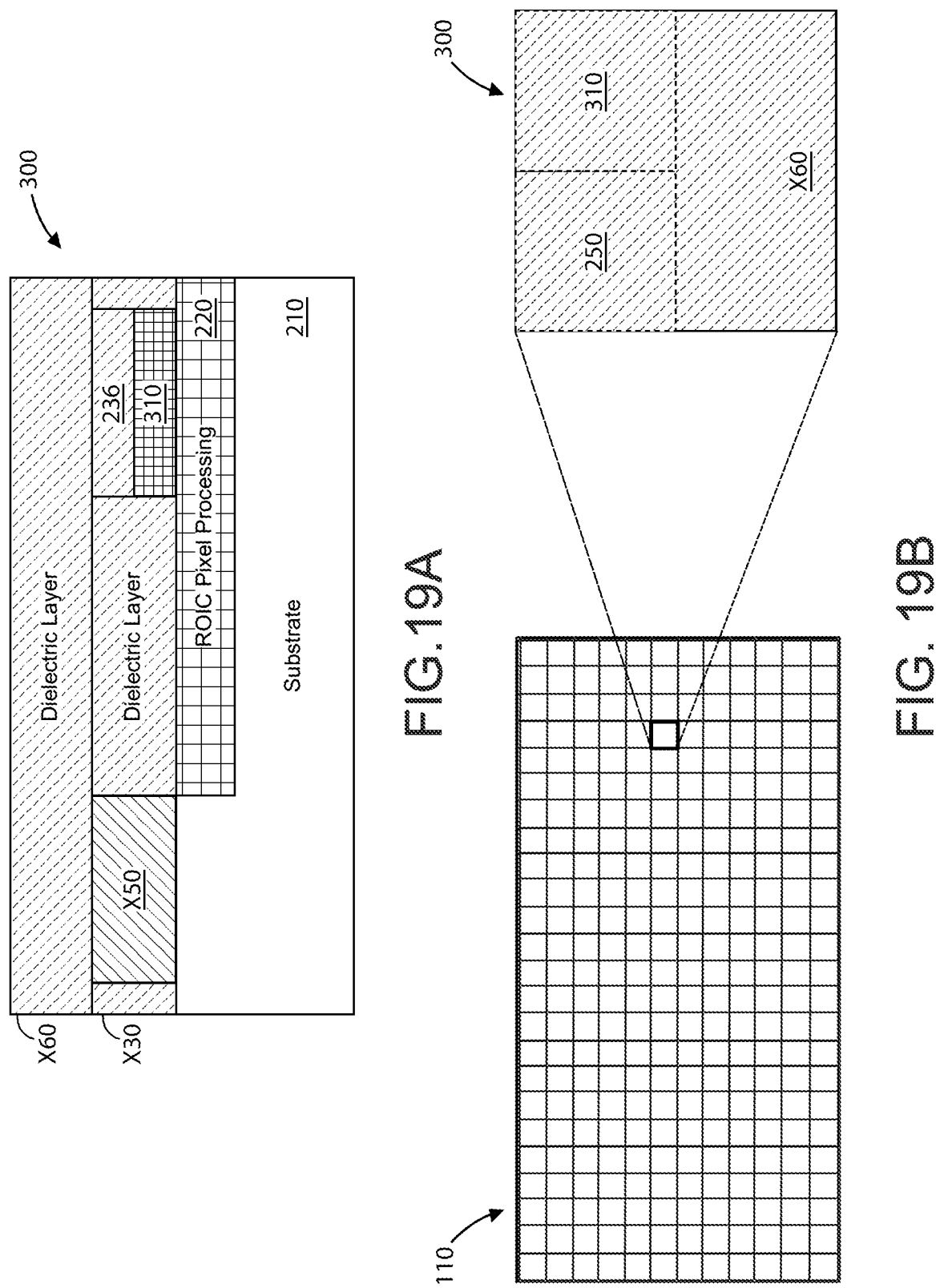

In FIG. 14A, a semiconductor detector device 310 is formed within the first cavity region 234 overlying the ROIC device 220. This device 310 can include silicon detectors, germanium detectors, to the like. FIG. 14B shows the semiconductor detector device 310 formed overlying previously exposed portion of the ROIC device 220. And, in FIG. 15A, a dielectric portion 236 is formed overlying the semiconductor detector device 310. FIG. 15B shows that the semiconductor detector device 310 is no longer exposed following the formation of this dielectric material 236.

Figures 20A, 20B:
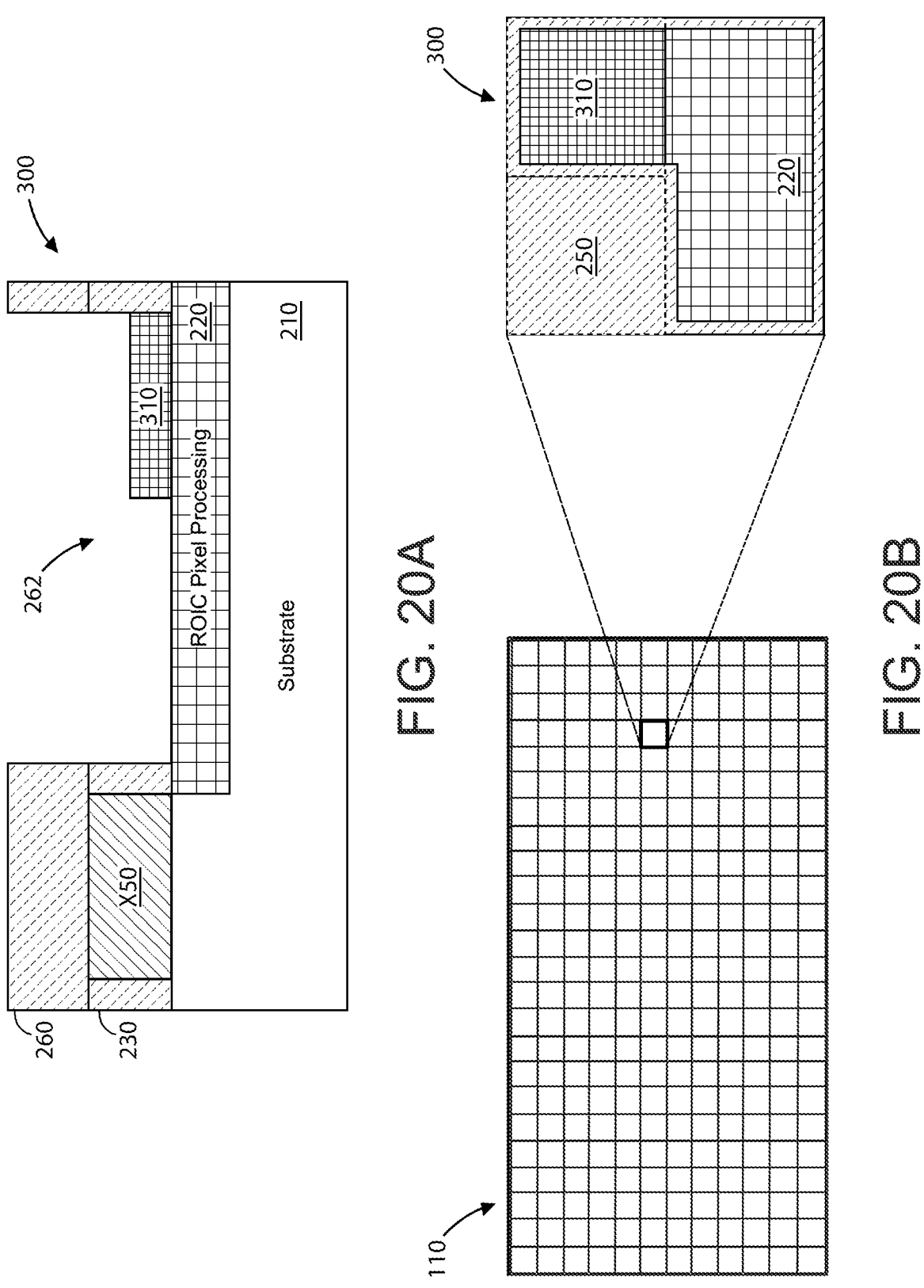

Following these steps, FIGS. 16A-16B to FIGS. 20A-20B show similar steps to FIGS. 3A-3B to FIGS. 7A-7B for forming the photodetector device 250 and the overlying second dielectric layer 260 in the device 300, as well as forming the cavity region 262 overlying the ROIC device 220. However, in FIG. 20A, the cavity region 262 removes the previously formed dielectric material 236 and also exposes the semiconductor detector device 310. FIG. 20B also shows the semiconductor device 310 exposed along with the ROIC device 220.

Figures 21A, 21B:
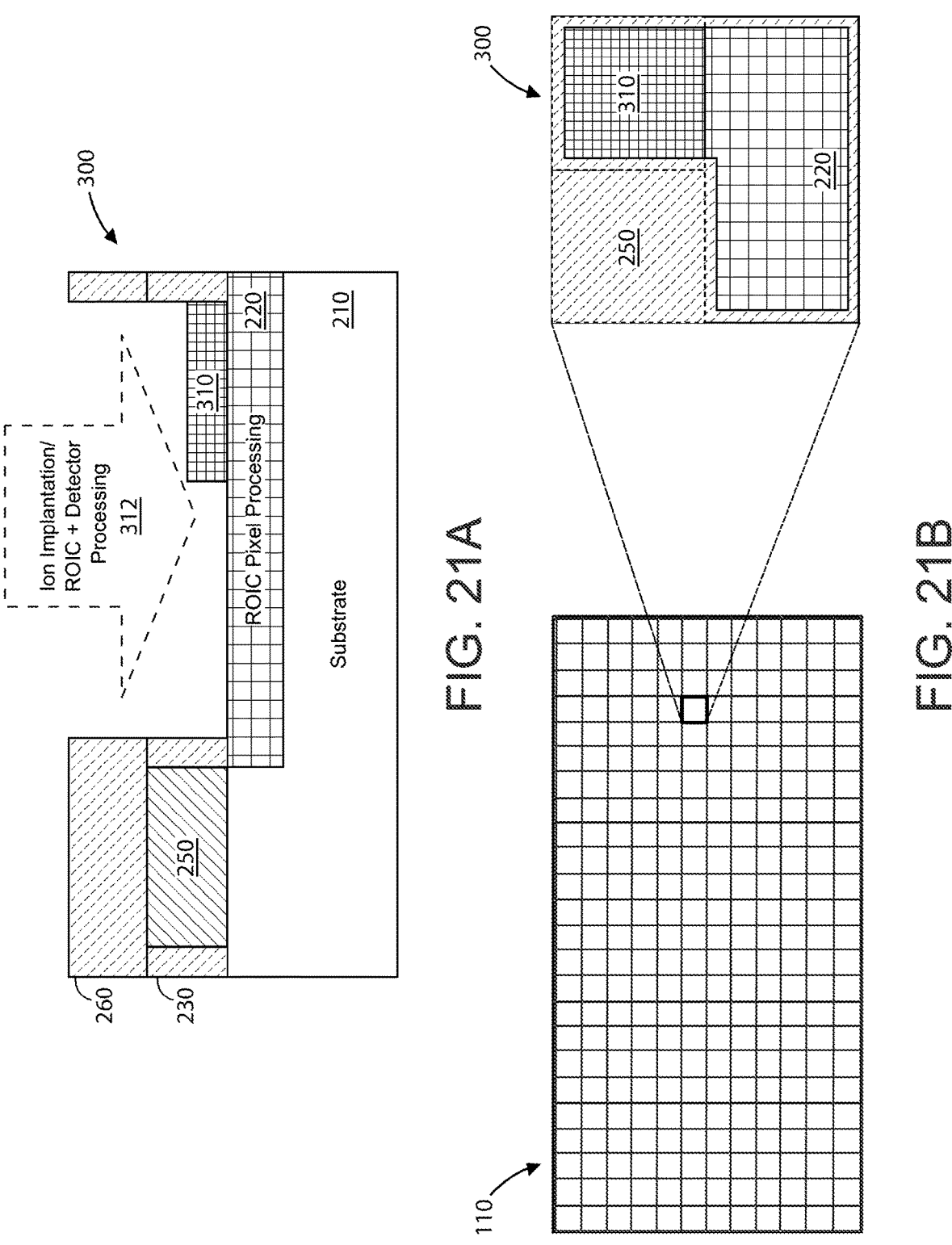
Figures 22A, 22B:
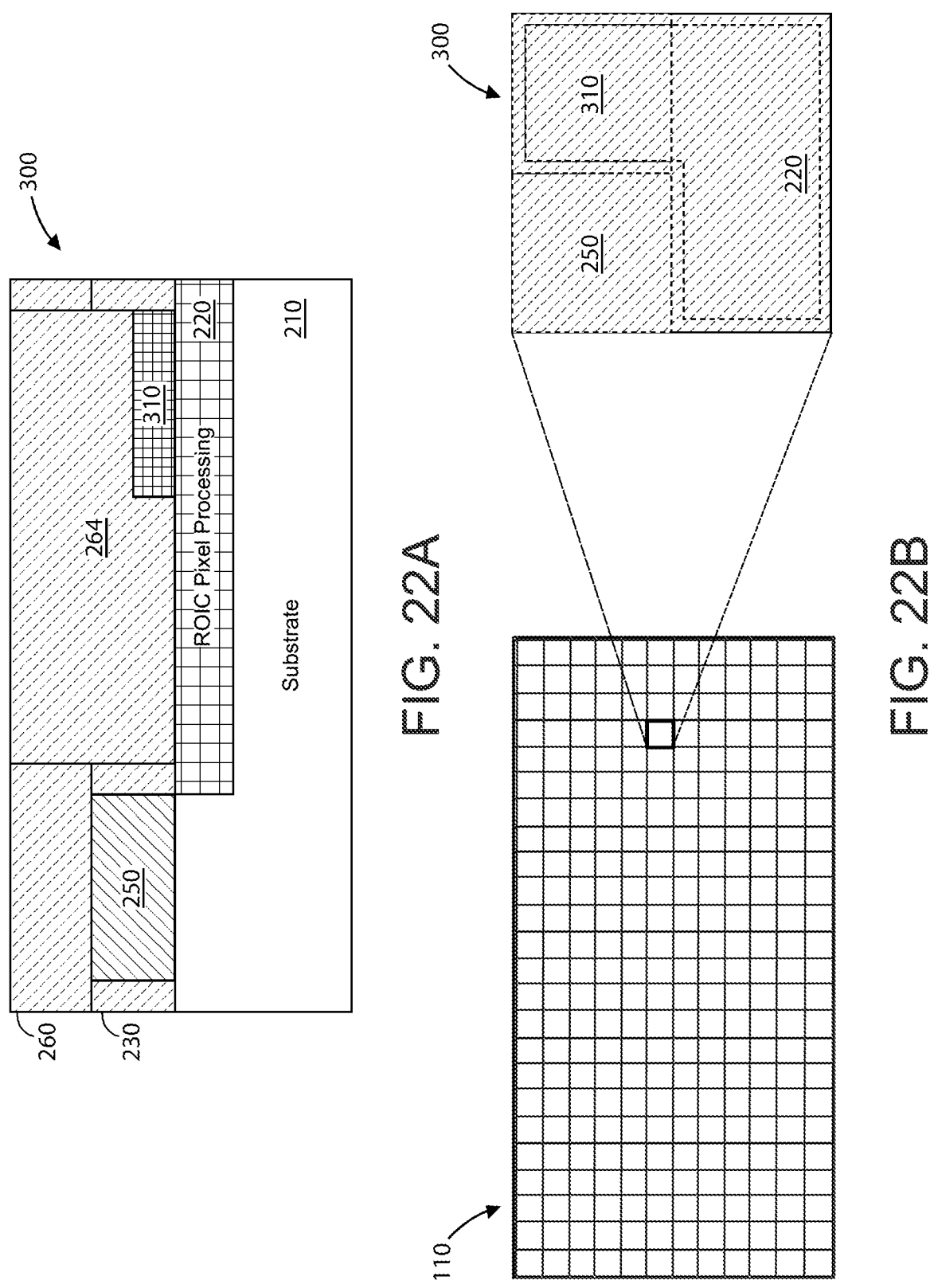

In FIGS. 21A and 21B, the exposed semiconductor detector device 310 and the exposed ROIC device 220 are subjected to IC processing 312, which can include an ion implantation process and other fabrication processes to finalize the ROIC 220 and the semiconductor detector device 310. FIG. 21B shows that the ROIC device 220 and the semiconductor detector device 310 are still exposed during these processing steps. And, in FIG. 22A, a dielectric material 264 is formed within the second cavity region 262 overlying the semiconductor detector device 310 and the ROIC device 220. FIG. 22B shows that the semiconductor detector device 310 and the ROIC device 220 are no longer exposed following the formation of this dielectric material 264.

Figures 23A, 23B:
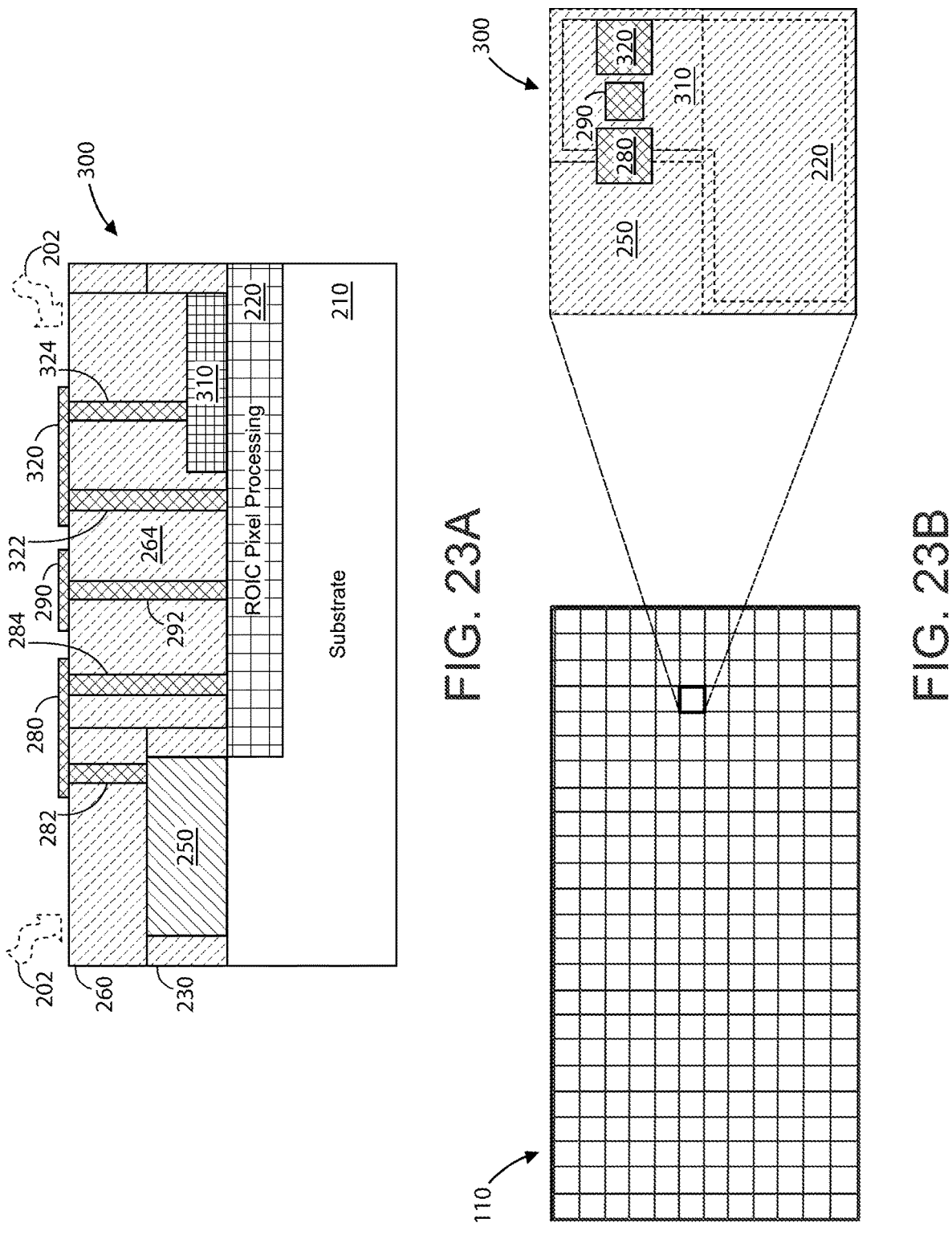

In FIG. 23A, the device 300 also includes the formation of the first bond pad 280 and the second bond pad 290, along with their respective metal interconnects (282, 284, 292, and 294). Additionally, a third bond pad 320 is formed overlying at least a portion of the semiconductor detector device 310 and the ROIC device 220. This third bond pad 320 is coupled to the ROIC device 220 by a first metal interconnect 322, and coupled to the semiconductor detector device 310 by a second metal interconnect 324. FIG. 23B shows an example orientation of the first, second, and third bond pads 280, 290, 320.

Figures 24A, 24B:
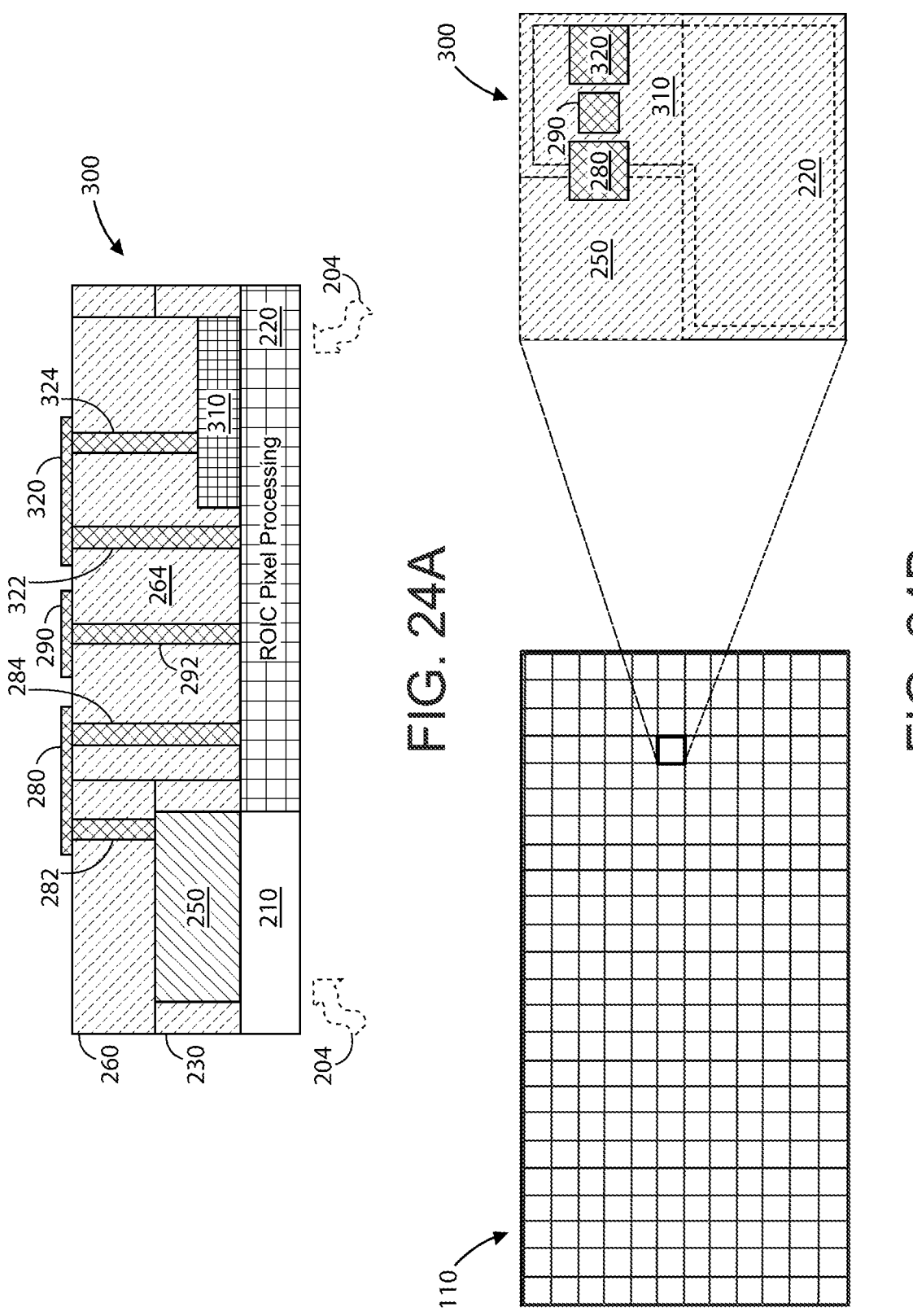

Similar to the device 200, the device 300 can be configured for front-side illumination or backside illumination as well. As shown in FIG. 23A, the device 300 is configured for front-side illumination, as indicated by the top-side dotted line arrows 202 to the photodetector device 250 (e.g., about 900 to 2600 nm) and the semiconductor detector device 310 (e.g., about 400 to 1000 nm). And, FIG. 24A shows the device 300 in a backside illumination configuration, as indicated by the back-side dotted line arrows 204.

Other steps can be taken to finish fabrication of the device 300, including the formation of additional metal interconnects or other backend processing steps, such as forming lenses or other structures. Other elements and method steps described herein can also be incorporated as well. Those of ordinary skill in the art will recognize other variations, modifications, and alternatives.

FIGS. 25A-25B to FIGS. 37A-37B are simplified diagrams illustrating a method of fabricating a monolithic dual color FPA device according to an example of the present invention. In these figures, the "A" figure shows a cross-sectional view of the device, while the "B" figure shows a top view of the device configured as part of the array device 110 shown in FIG. 1. Also, shared reference numerals in subsequent figures refer to the same elements as described in previous figures.

Figures 25A, 25B:
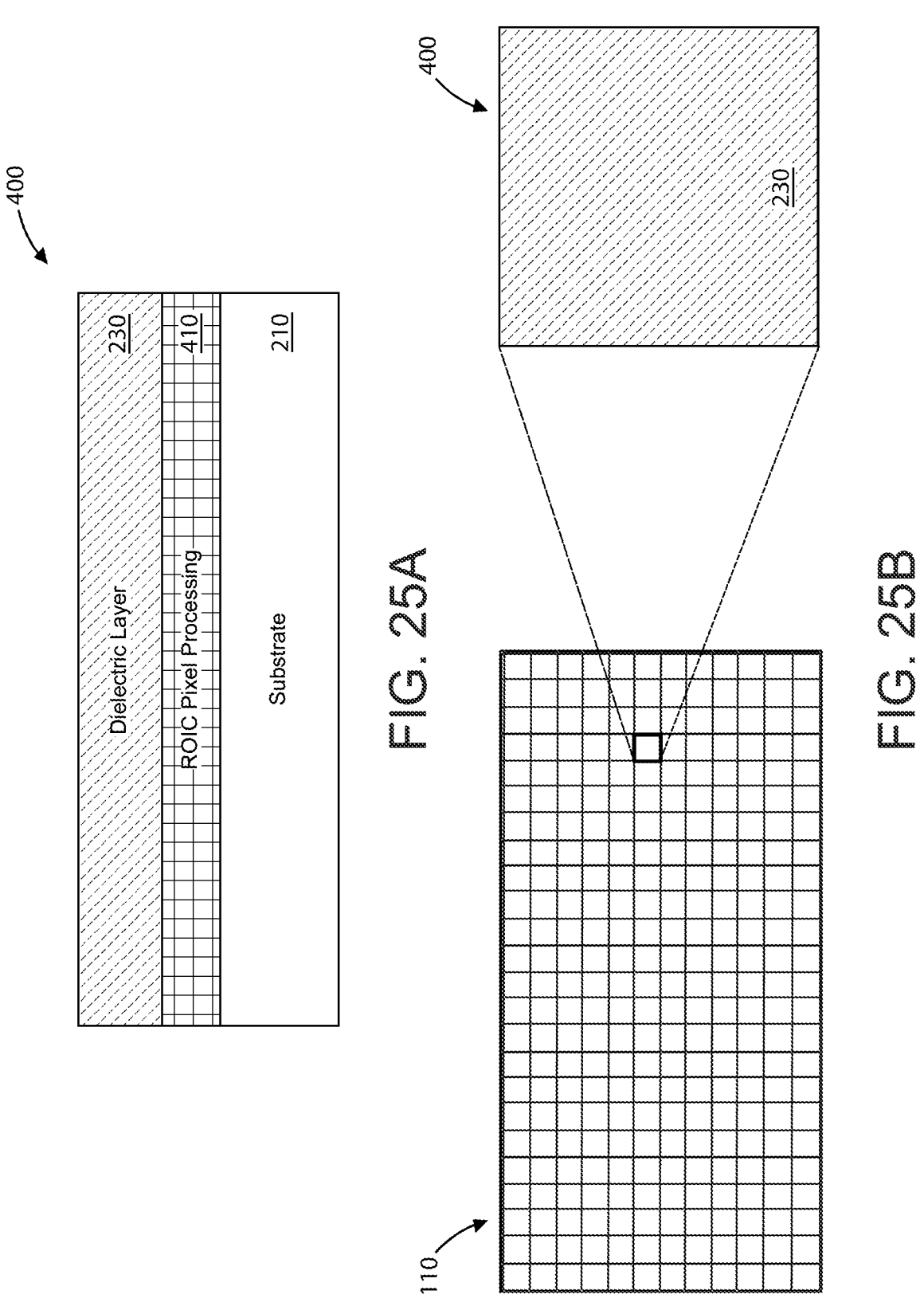
FIGS. 25A-25B to FIGS. 37A-37B are simplified diagrams illustrating a method of fabricating a monolithic dual color FPA device according to an example of the present invention.
Figures 26A, 26B:
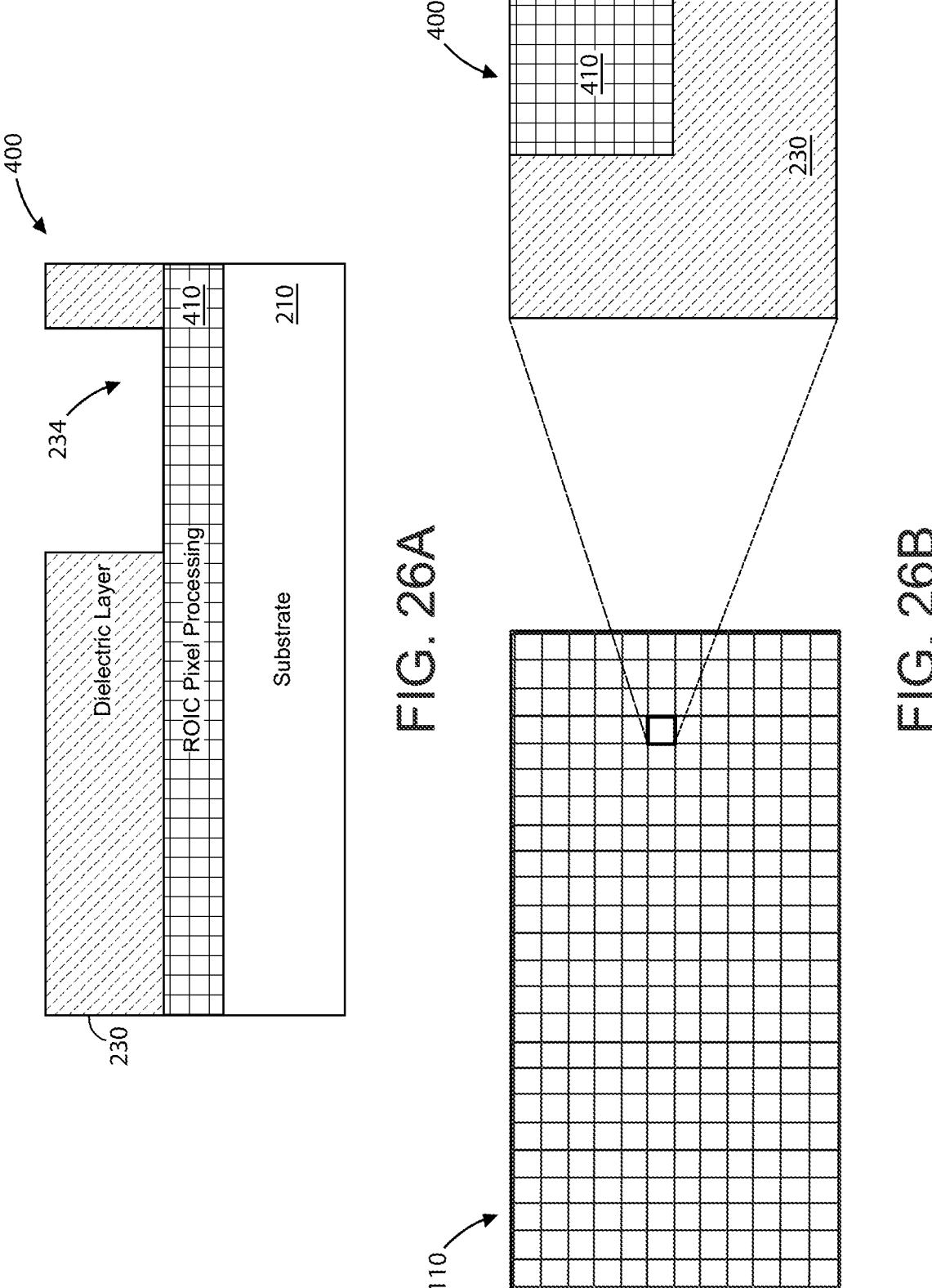
Figures 27A, 27B:
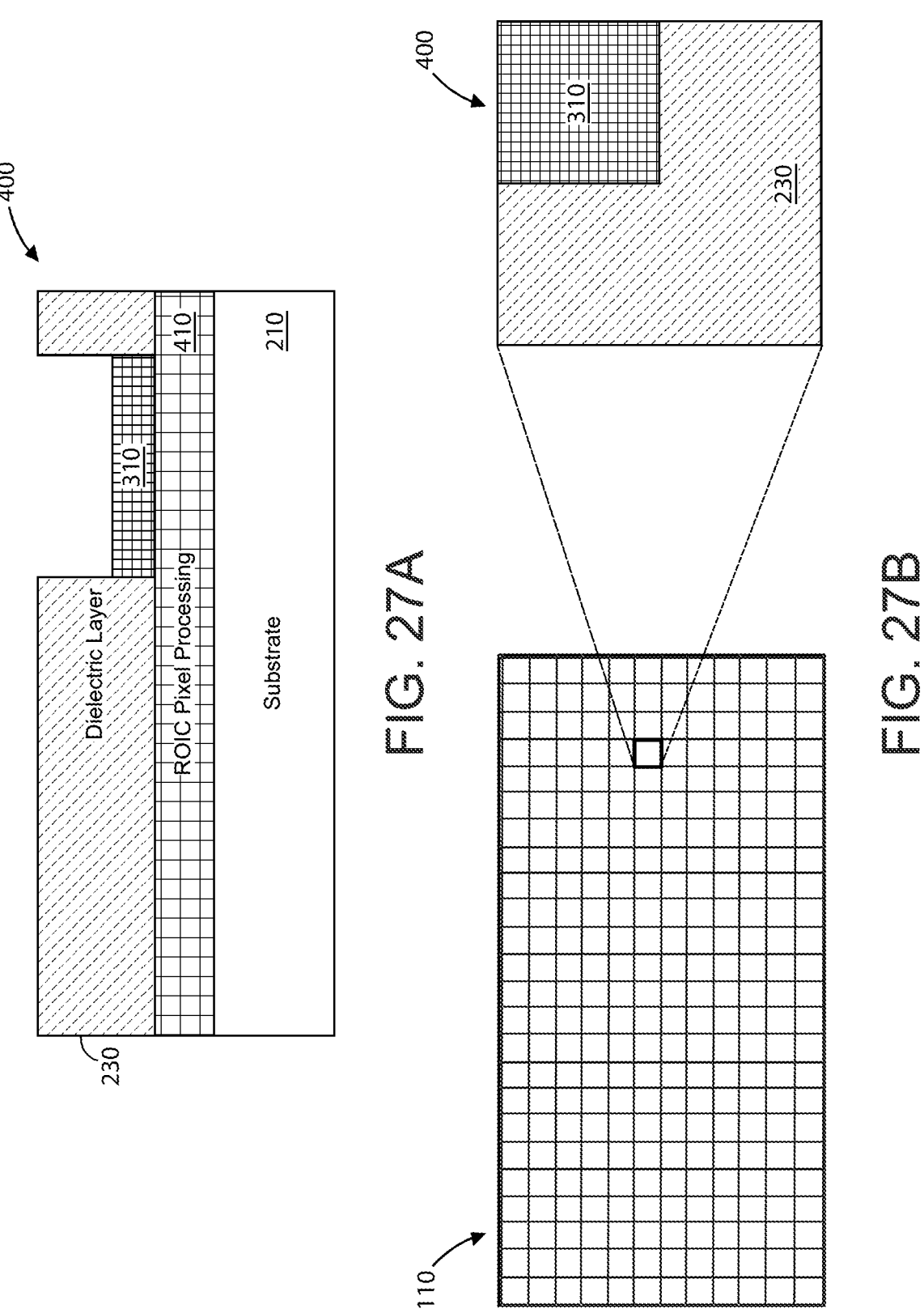
Figures 28A, 28B:
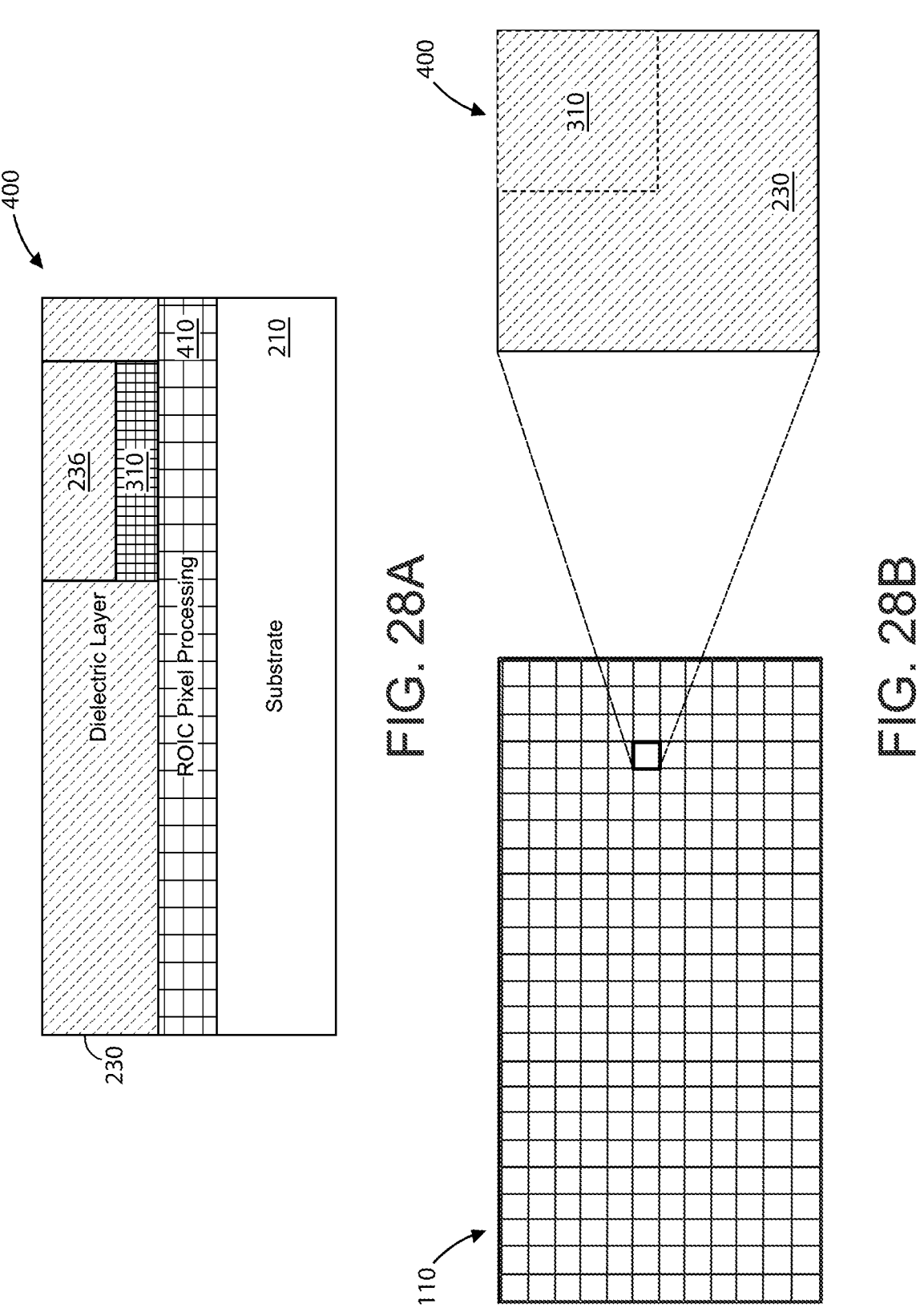

In FIG. 25A, the method for fabricating this dual color FPA device 400 starts with a substrate (e.g., silicon substrate, or the like) 210 with a partially processed ROIC device 410 formed within overlying the substrate 210 and a first dielectric layer 230 formed overlying the ROIC device 410. FIG. 25B shows the dielectric layer 230 covering the ROIC device 220, which covers the substrate 210. Then, FIGS. 26A-26B to FIGS. 28A-28B show similar steps to FIGS. 13A-13B to FIGS. 15A-15B for forming a semiconductor detector device 310 and an overlying dielectric material 236 within a cavity region 234.

Figures 29A, 29B:
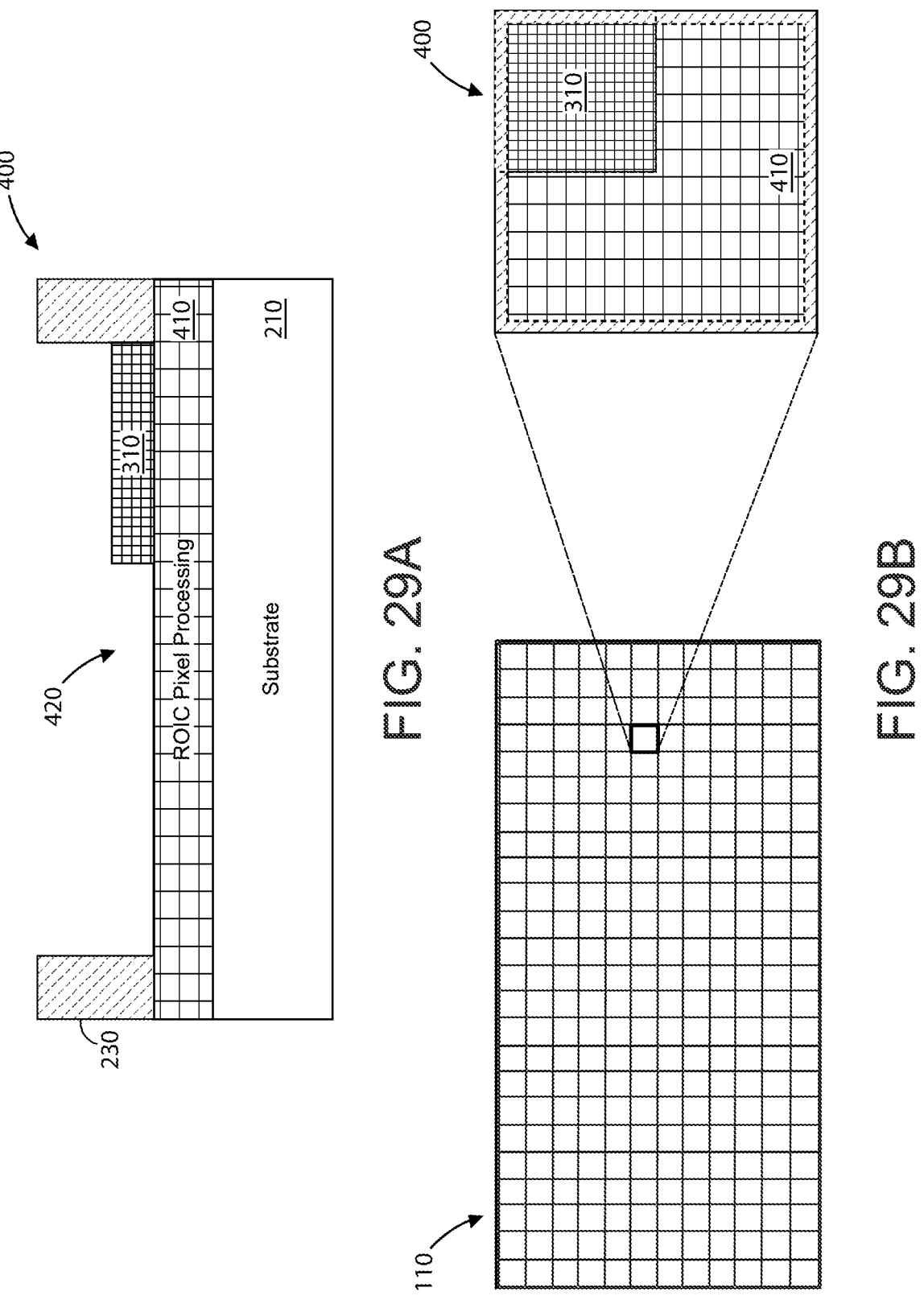
Figures 31A, 31B:
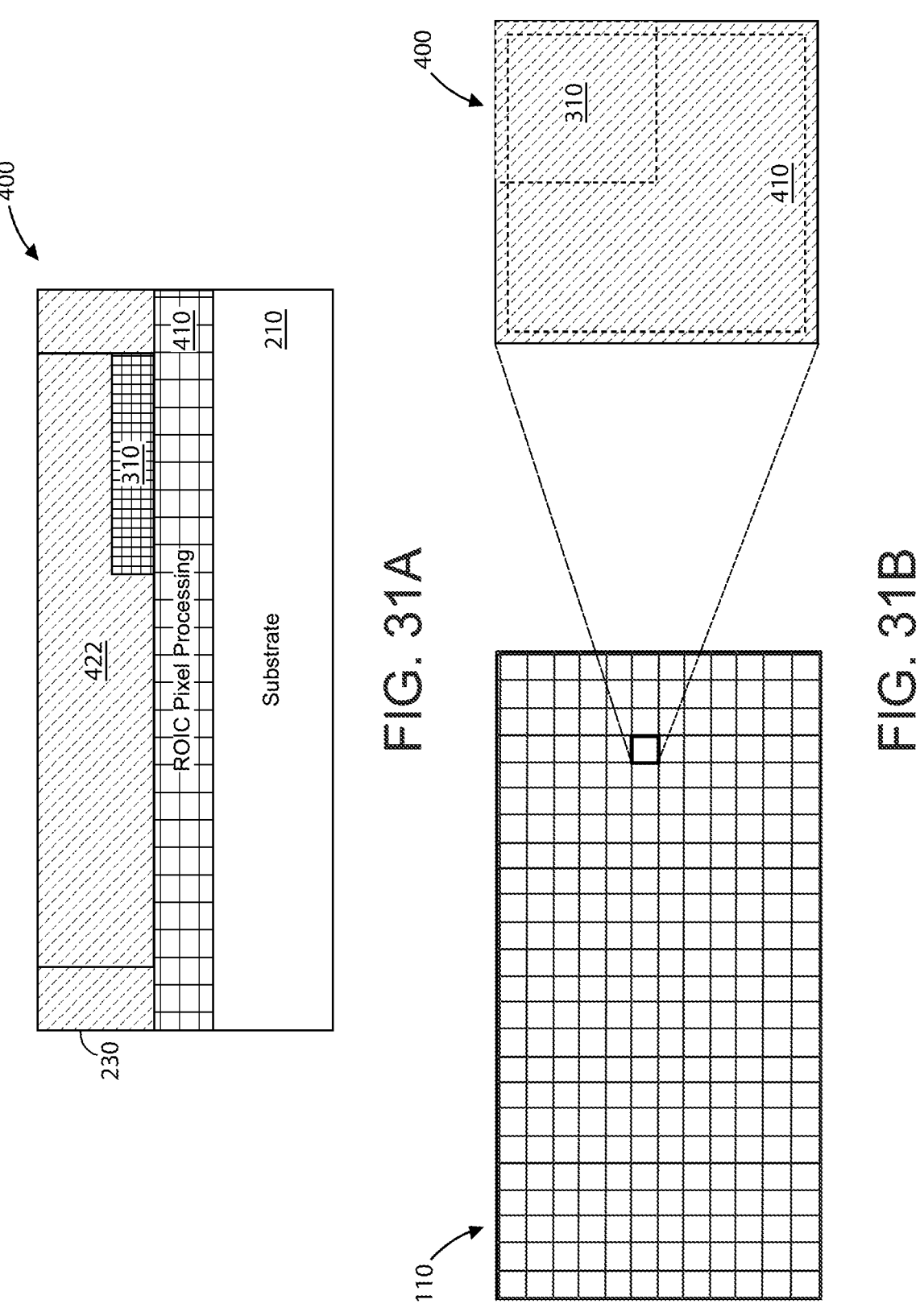

Following these steps, FIG. 29A shows a cavity region 420 formed within a portion of the first dielectric material 230 overlying the semiconductor detector device 310 and the ROIC device 410. FIG. 29B shows that formation of the cavity region 420 exposes the semiconductor detector device 310 and the ROIC device 410. Similar to FIGS. 21A-21B, FIGS. 30A-30B show the exposed semiconductor detector device 310 and the exposed ROIC device 410 being subjected to IC processing 412, which can include an ion implantation process and other fabrication processes to finalize the ROIC 410 and the semiconductor detector device 310. And, in FIG. 31A, a dielectric material 422 is formed within the cavity region 420 overlying the semiconductor detector device 310 and the ROIC device 410. FIG. 31B shows that the semiconductor detector device 310 and the ROIC device 410 are no longer exposed following the formation of this dielectric material 422.

Figures 32A, 32B:
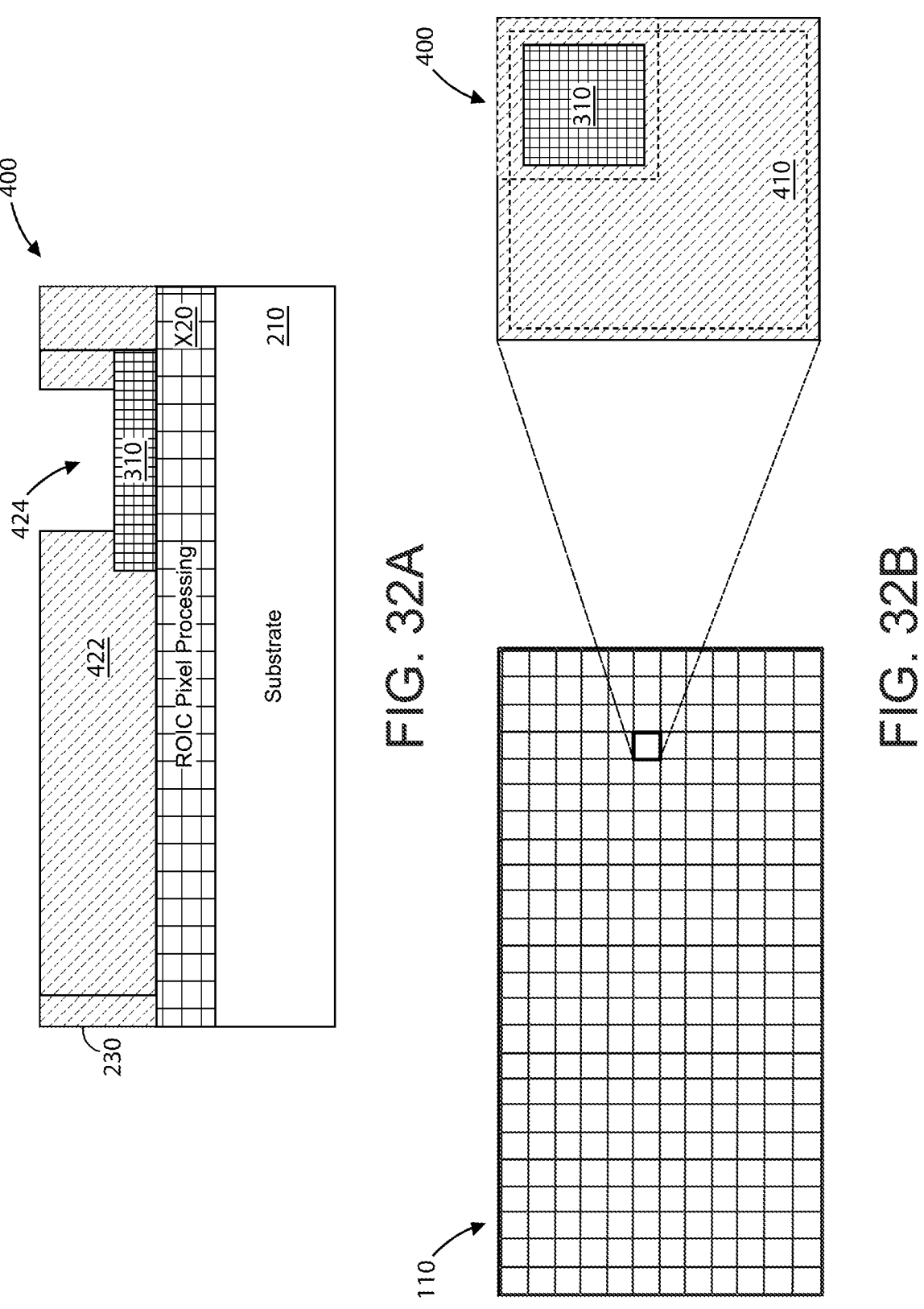

In FIG. 32A, a portion of the dielectric material 422 is removed to form a cavity region 424 to expose at least a portion of the semiconductor detector device 310. FIG. 32B shows that the cavity region 424 exposes the semiconductor detector device 310 overlying a top-right corner of the substrate 210, however, the size and position of the semiconductor detector device 310 and the cavity region 424 can vary.

Figures 33A, 33B:
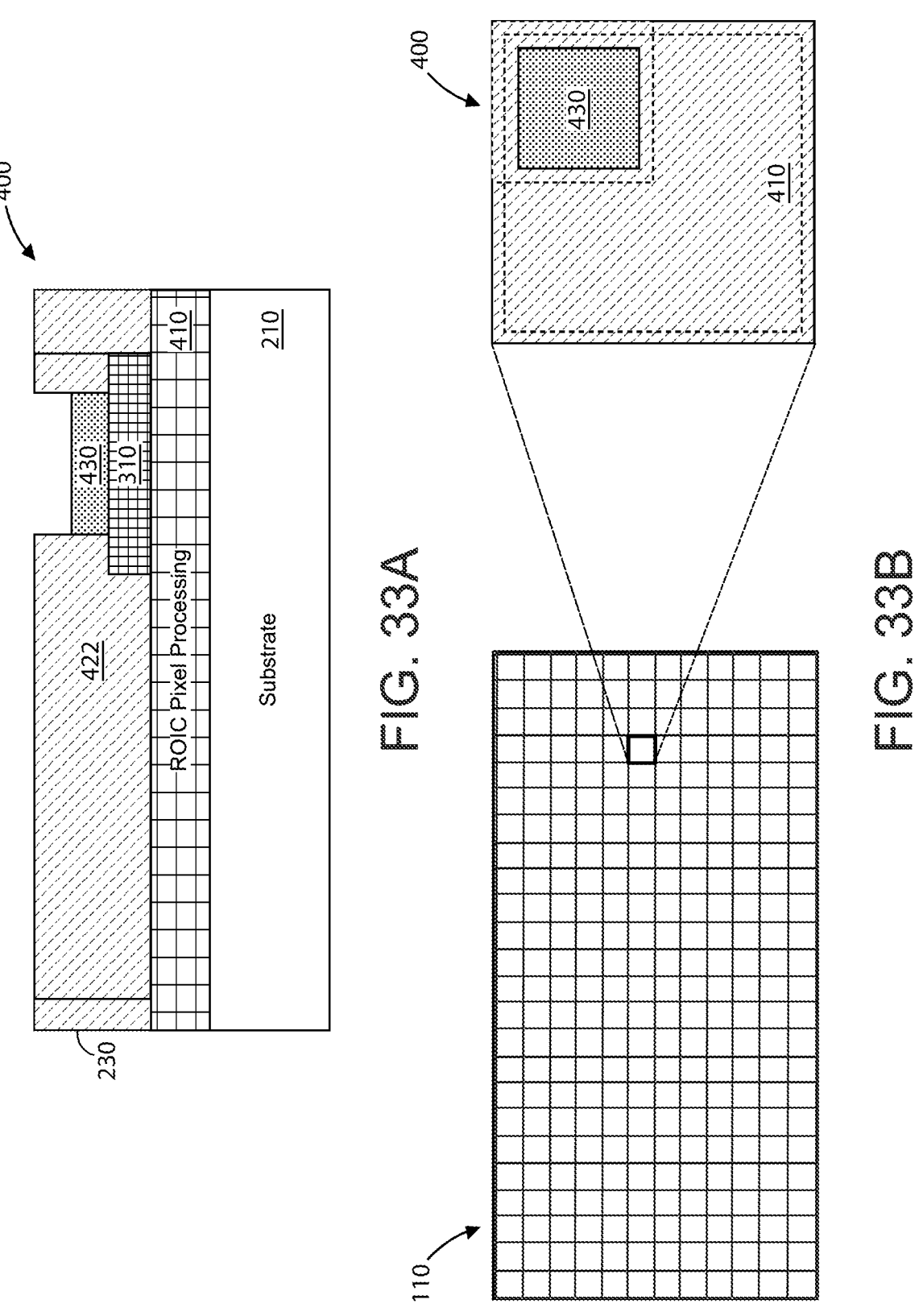

In FIG. 33A, a buffer material 430 is formed overlying the semiconductor detector device 310 within the cavity region 424. This buffer material 430 can be a wavelength configuring material, which is discussed later in further detail. FIG. 33B shows the buffer material 430 overlying the previously exposed portion of the semiconductor detector device 310.

Figures 34A, 34B:
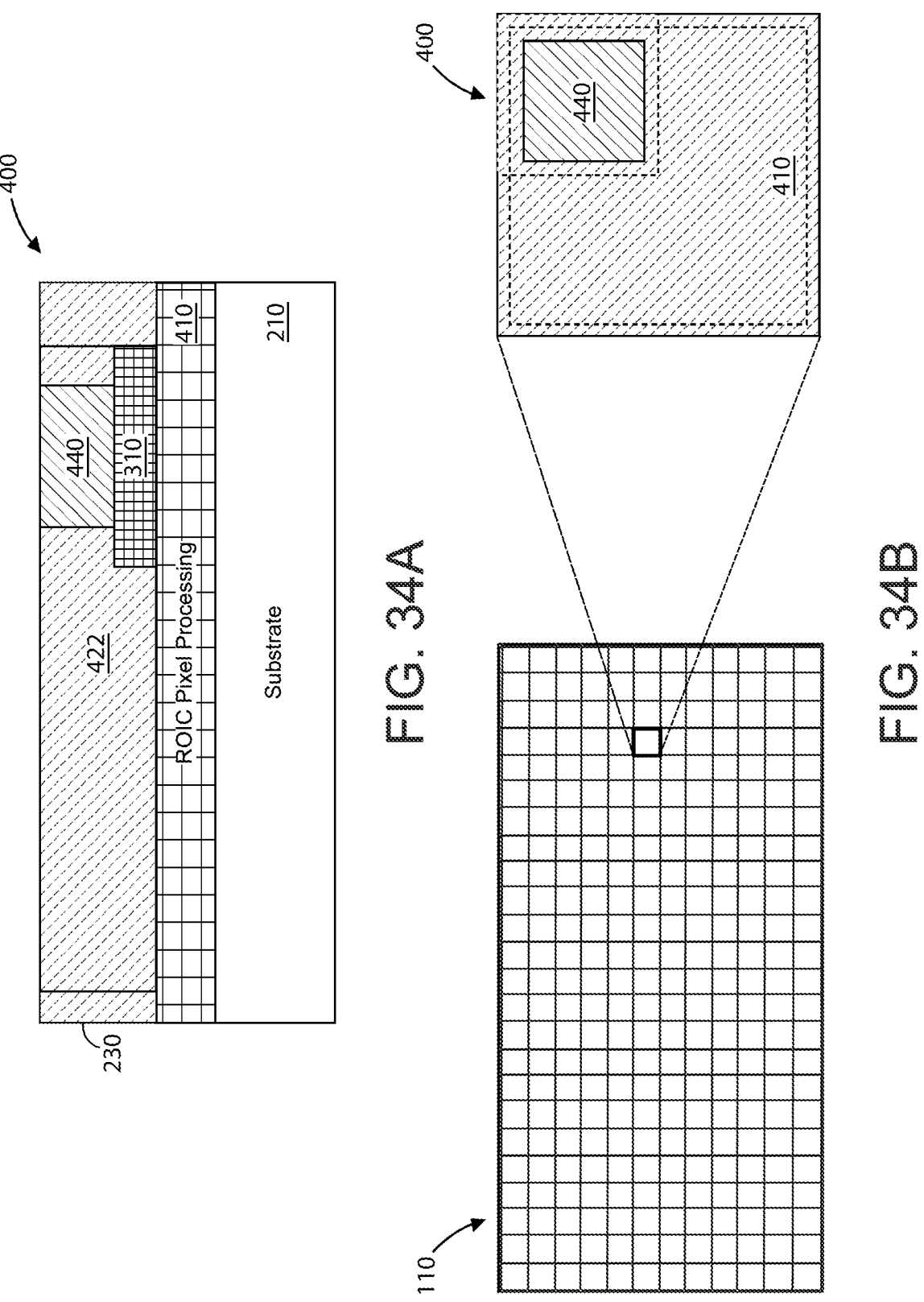
Figures 35A, 35B:
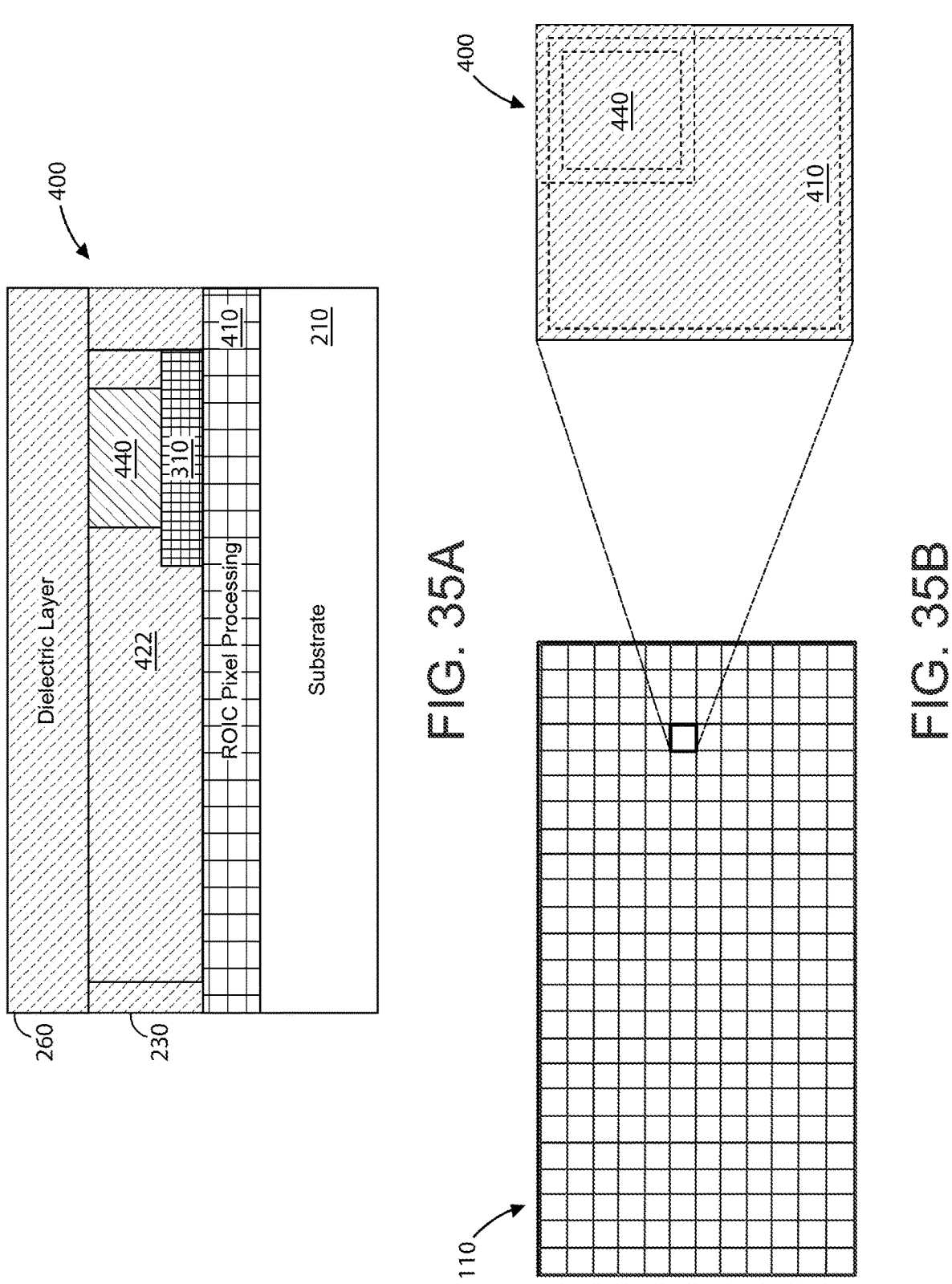

In FIG. 34A, photodetector materials are formed overlying the buffer material 430 to form a photodetector device 440. These photodetector materials are discussed later in further detail. In a specific example, the photodetector device 440 can be configured as a III-V pixel IR device, or the like. FIG. 34B shows the photodetector device 440 formed overlying the previously formed buffer material 240 and overlying the semiconductor detector device 310 in a stacked configuration. Then, in FIG. 35A, a second dielectric layer 260 is formed overlying the first dielectric layer 230 and the photodetector device 440. FIG. 35B shows the second dielectric layer 260 overlying all previous elements.

Figures 36A, 36B:
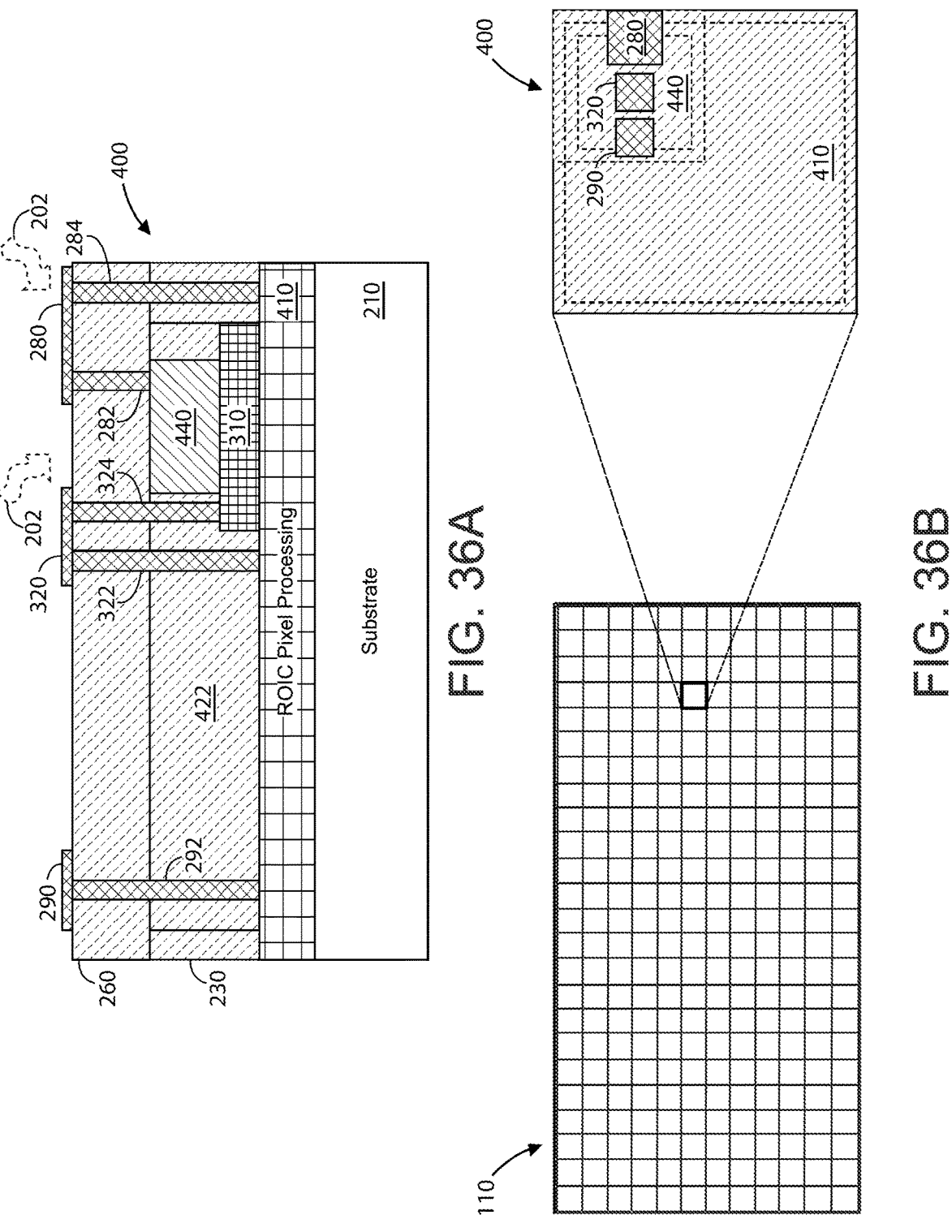
Figures 37A, 37B:
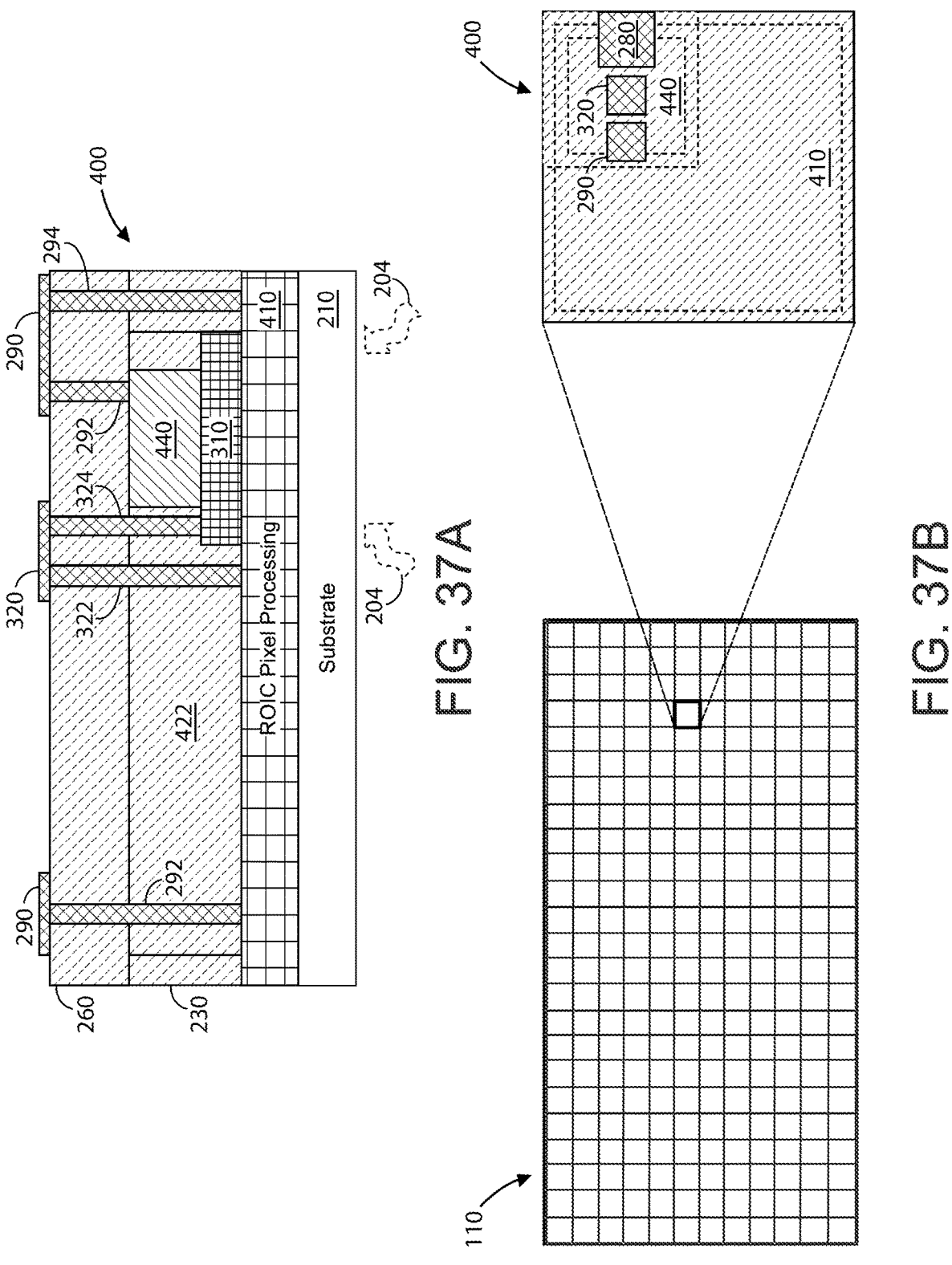

In FIG. 36A, the device 400 also includes the formation of the first bond pad 280, the second bond pad 290 and the third bond pad 320, along with their respective metal interconnects (282, 284, 292, 294, 322, and 324). Compared to device 300, the first bond pad 280 is also spatially configured overlying the semiconductor detector device 310 because the photodetector device 440 was formed overlying the semiconductor detector device 310. FIG. 36B shows an example orientation of the first, second, and third bond pads 280, 290, 320.

Similar to the previous devices, the device 400 can be configured for front-side illumination or backside illumination as well. As shown in FIG. 36A, the device 400 is configured for front-side illumination, as indicated by the top-side dotted line arrows 202 to the photodetector device 440 and the semiconductor detector device 310. And, FIG.

37A shows the device 400 in a backside illumination configuration, as indicated by the back-side dotted line arrows 204.

Other steps can be taken to finish fabrication of the device 400, including the formation of additional metal interconnects or other backend processing steps, such as forming lenses or other structures. Other elements and method steps described herein can also be incorporated as well. Those of ordinary skill in the art will recognize other variations, modifications, and alternatives.

According to various examples, the present invention provides for methods of fabricating integrated single or dual color photodetector devices or focal plane array (FPA) devices by a heteroepitaxial growth process and bonding the devices to a ROIC device. As discussed previously, this growth process can be used to form III-V PINs, avalanche photodiodes (APDs), or other photodetector devices.

FIGS. 38A-38B to FIGS. 47A-47B are simplified diagrams illustrating a method of fabricating an integrated dual color FPA device according to an example of the present invention. In these figures, the "A" figure shows a cross-sectional view of the device, while the "B" figure shows a top view of the device configured as part of the array device 110 shown in FIG. 1. Also, shared reference numerals in subsequent figures refer to the same elements as described in previous figures. Although this example illustrates a dual color device, the techniques described herein can be applied to a single color device configuration or other device configurations as well.

Figures 38A, 38B:
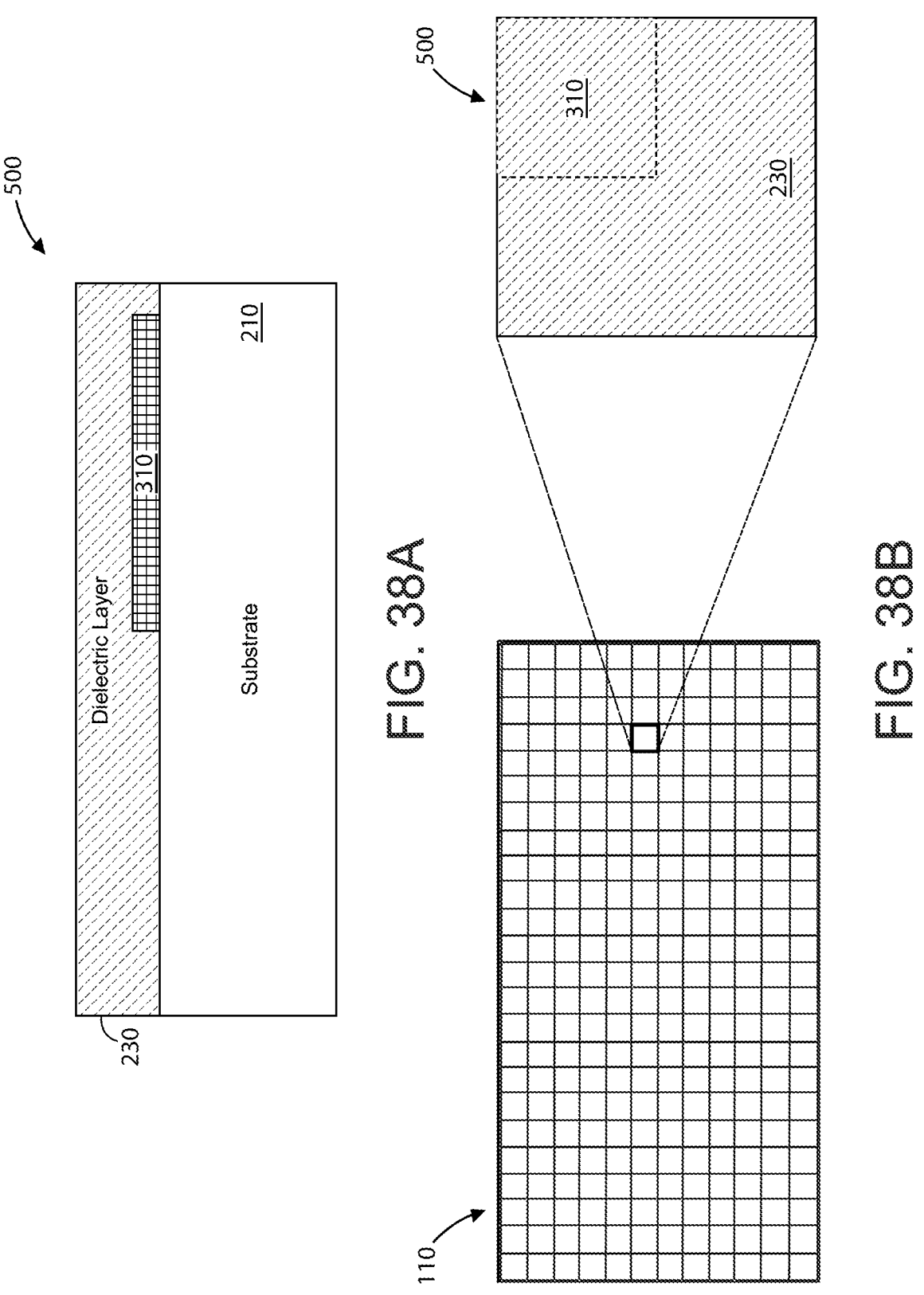
FIGS. 38A-38B to FIGS. 47A-47B are simplified diagrams illustrating a method of fabricating an integrated dual color FPA device according to an example of the present invention.

In FIG. 38A, the method for fabricating an integrated dual color FPA device 500 starts with a substrate (e.g., silicon substrate, or the like) 210 with a semiconductor detector device 310 formed overlying a first portion of the substrate 210 and a first dielectric layer (e.g., silicon dioxide, low-K dielectric, or the like) 230 formed overlying the semiconductor device 310 and a second portion of the substrate 210. FIG. 38B shows the dielectric layer 230 covering both the semiconductor detector device 310 and the substrate 210. In an example, the semiconductor detector device 310 can be formed using similar steps as those discussed previously.

Figures 39A, 39B:
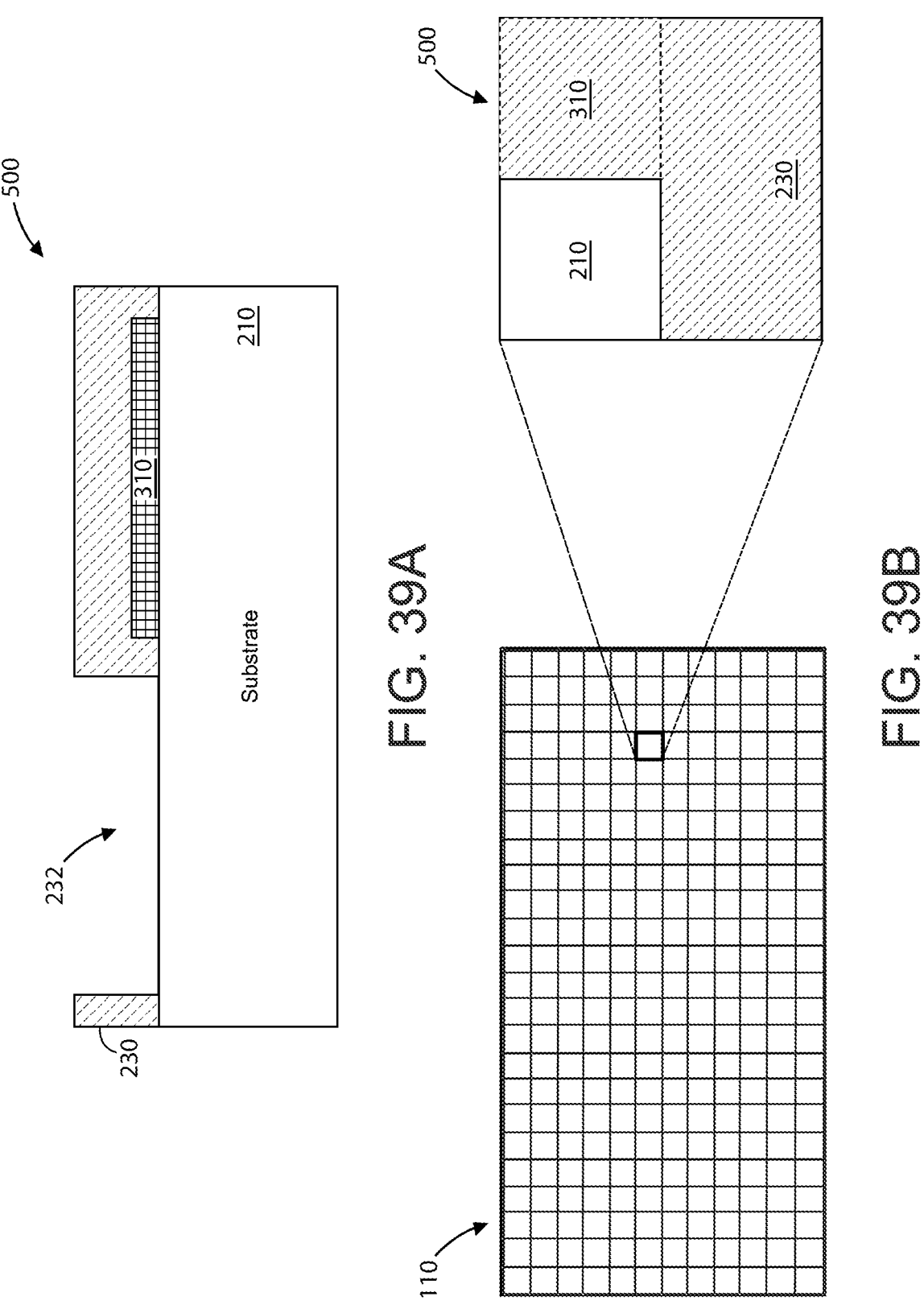

In FIG. 39A, a portion of the dielectric layer 230 is removed to form a cavity region 232 to expose the second portion of the substrate 210. The removal process can include a masking and patterning process, including an etching process, such as wet etching, dry etching, or the like. FIG. 39B shows that the cavity region 232 exposes a top-left corner of the substrate 210 as being the second portion, however the second portion that is exposed and the first portion within which the semiconductor detector device 310 is formed can vary in shape and size.

Figures 40A, 40B:
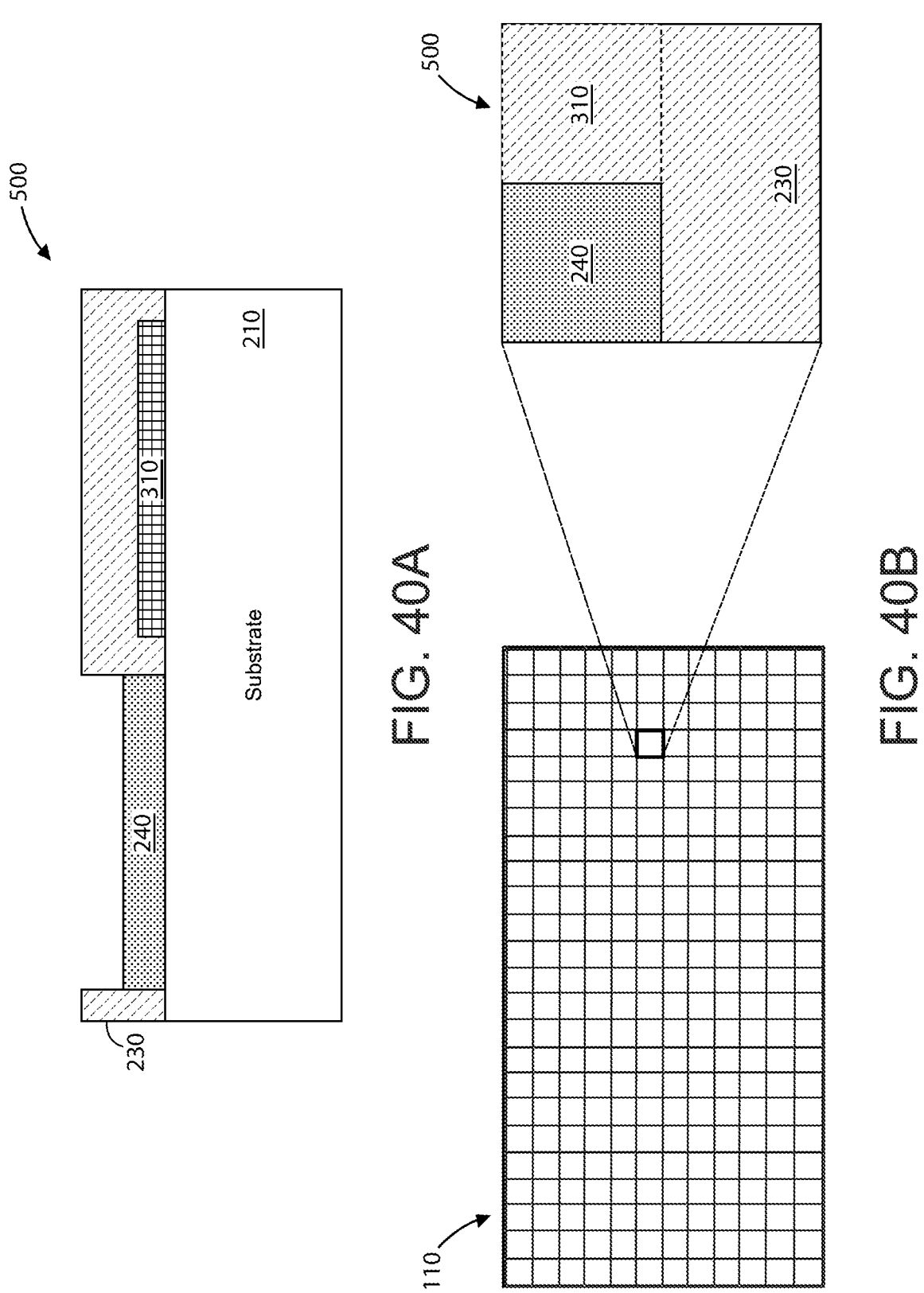

In FIG. 40A, a buffer material 240 is formed overlying the substrate 210 within the cavity region 232. This buffer material 240 can be a wavelength configuring material, which is discussed later in further detail. FIG. 40B shows the buffer material 240 overlying the previously exposed second portion of the substrate 210.

Figures 41A, 41B:
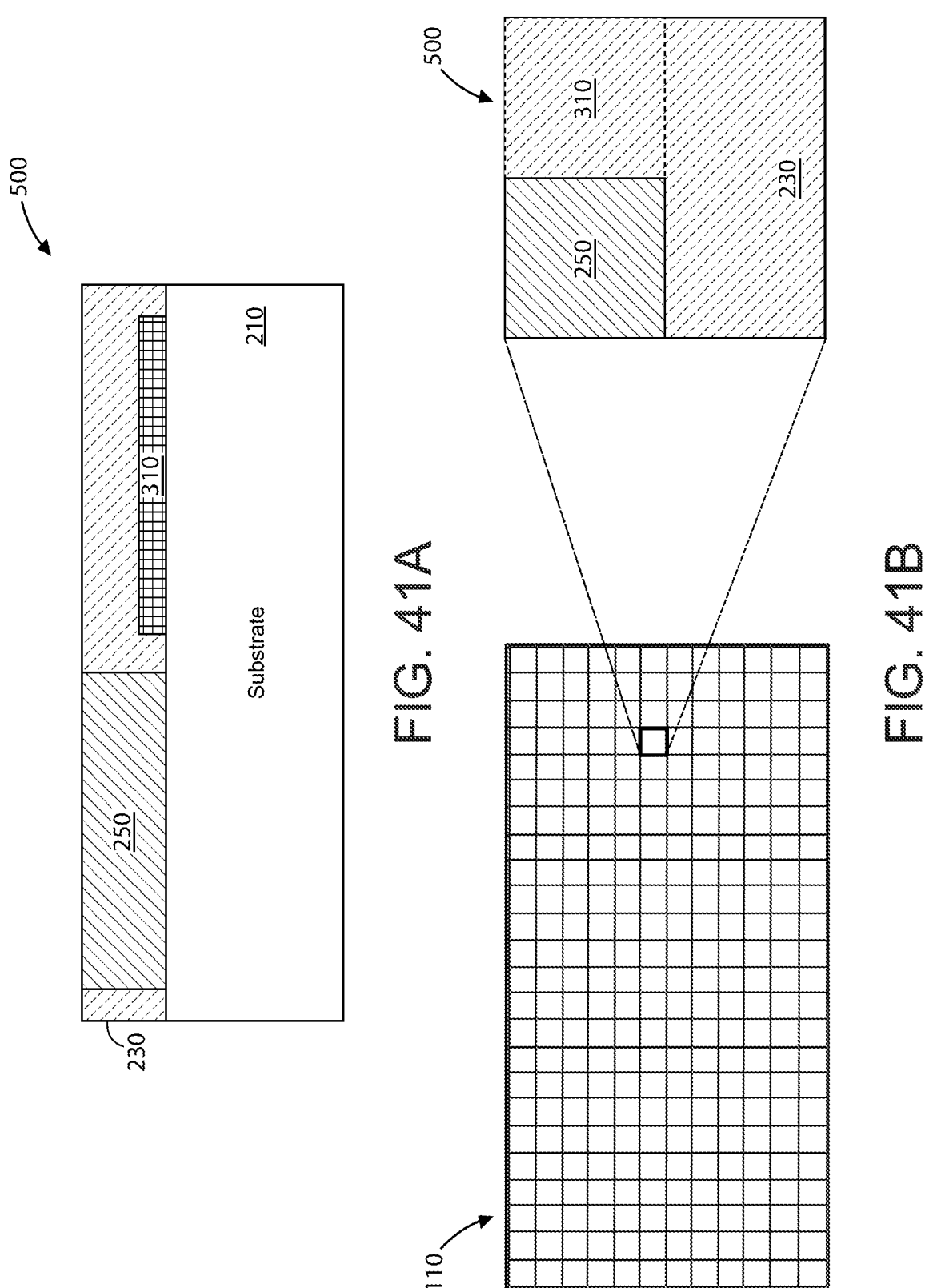

In FIG. 41A, photodetector materials are formed overlying the buffer material 240 to form a photodetector device 250. These photodetector materials are discussed later in further detail. In a specific example, the photodetector device 250 can be configured as a III-V pixel IR device, or the like. FIG. 41B shows the photodetector device 250 formed overlying the previously formed buffer material 240.

Figures 42A, 42B:
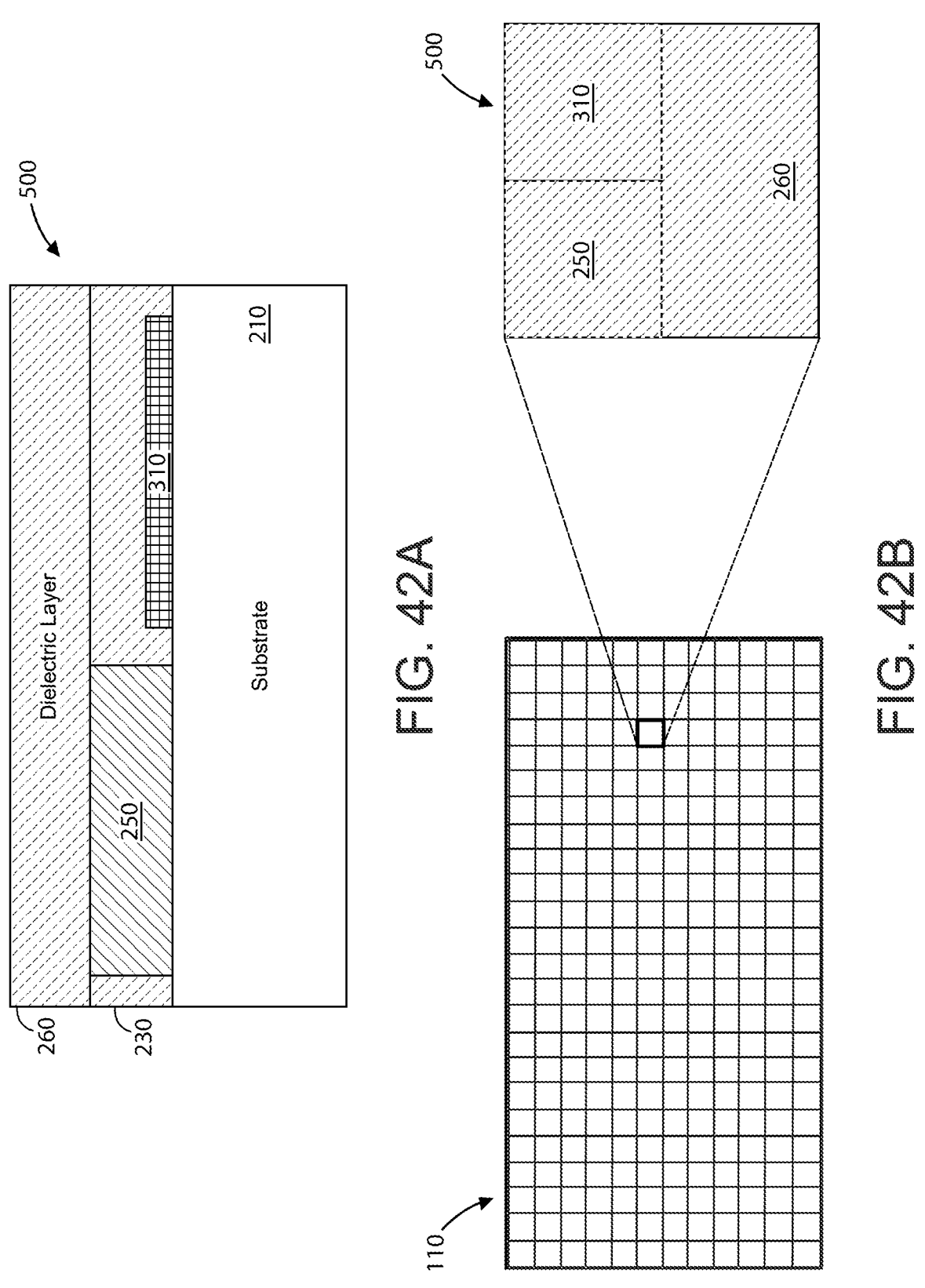

In FIG. 42A, a second dielectric layer 260 is formed overlying the first dielectric layer 230 and the photodetector device 250. FIG. 6B shows the second dielectric layer 260 overlying all previous elements.

Figures 43A, 43B:
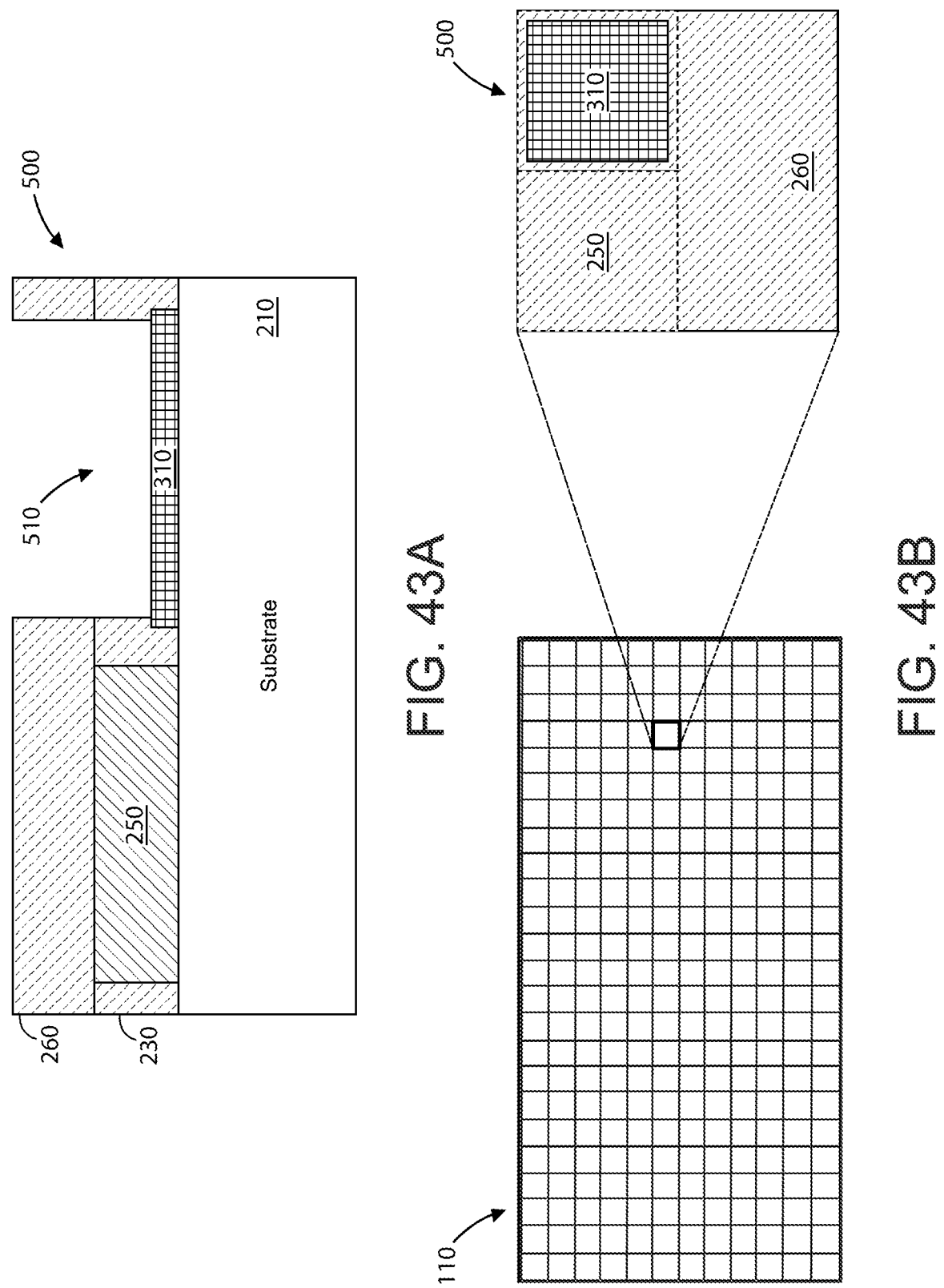

In FIG. 43A, a cavity region 510 is formed within a portion of the first and second dielectric materials 230, 260 overlying and exposing the semiconductor detector device 310. The formation of this cavity region 510 can include a similar masking and patterning process as discussed previously. FIG. 43B shows that the cavity region 510 exposes the semiconductor detector device 310 within the first portion of the substrate 210.

Figures 44A, 44B:
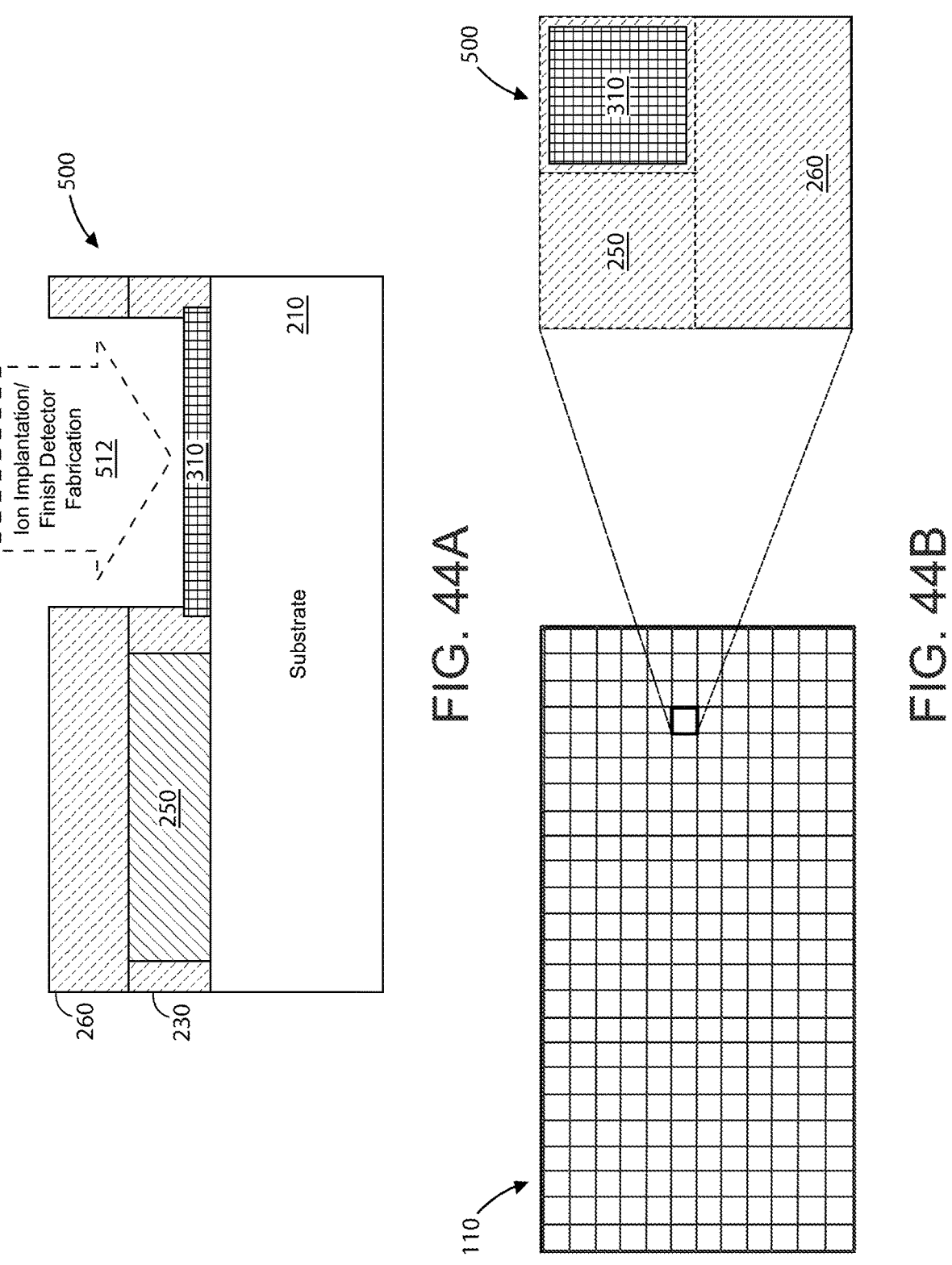

In FIG. 44A, the exposed semiconductor detector device 310 is subjected to device processing 512, which can include an ion implantation process and other fabrication processes to finalize the semiconductor detector device 310. FIG. 44B shows that the semiconductor detector device 310 is still exposed during these processing steps.

Figures 45A, 45B:
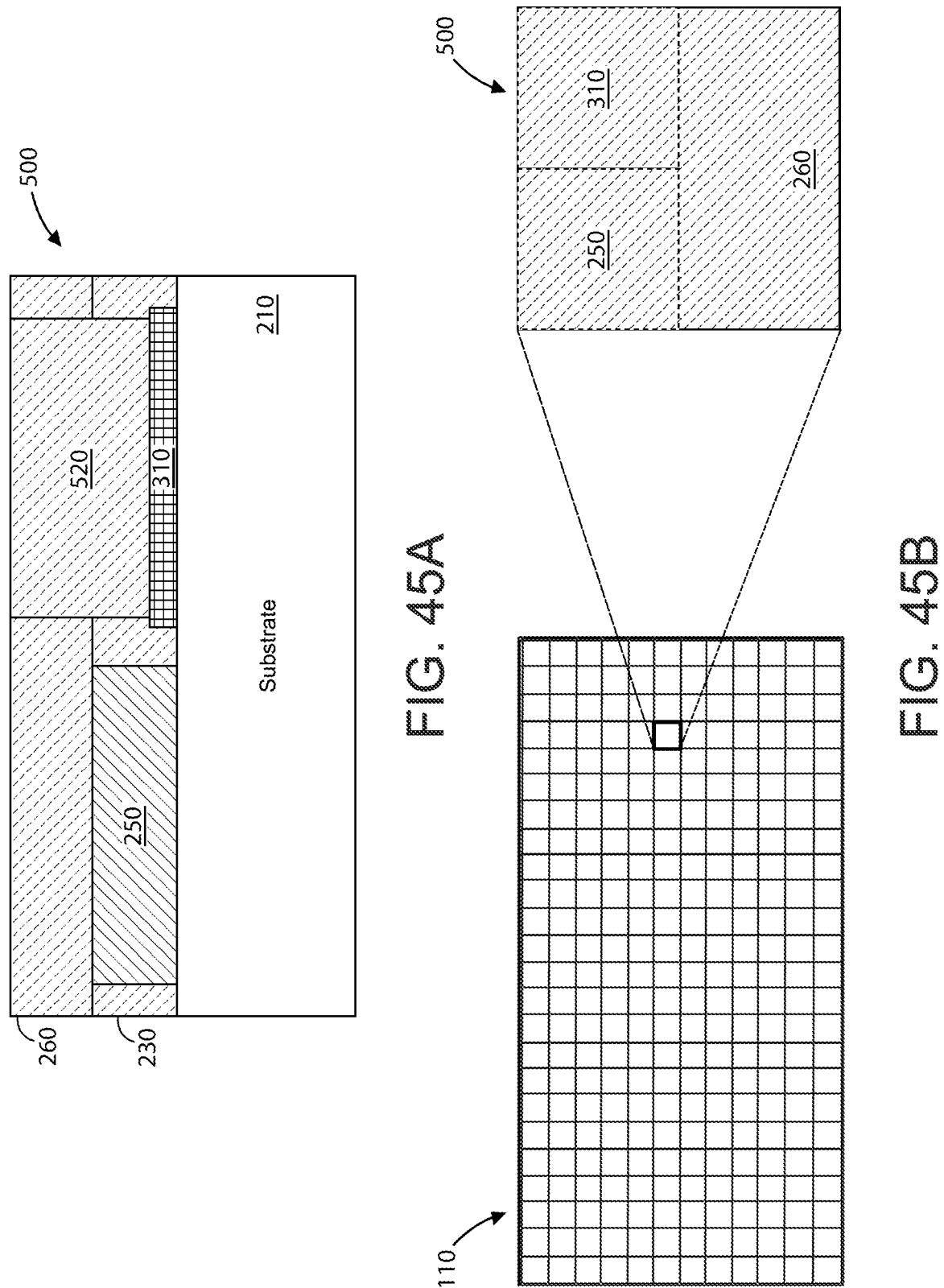

In FIG. 45A, a dielectric material 520 is formed within the cavity region 510 overlying the semiconductor detector device 310. FIG. 45B shows that the semiconductor detector device 310 is no longer exposed following the formation of this dielectric material 520.

Figures 46A, 46B:
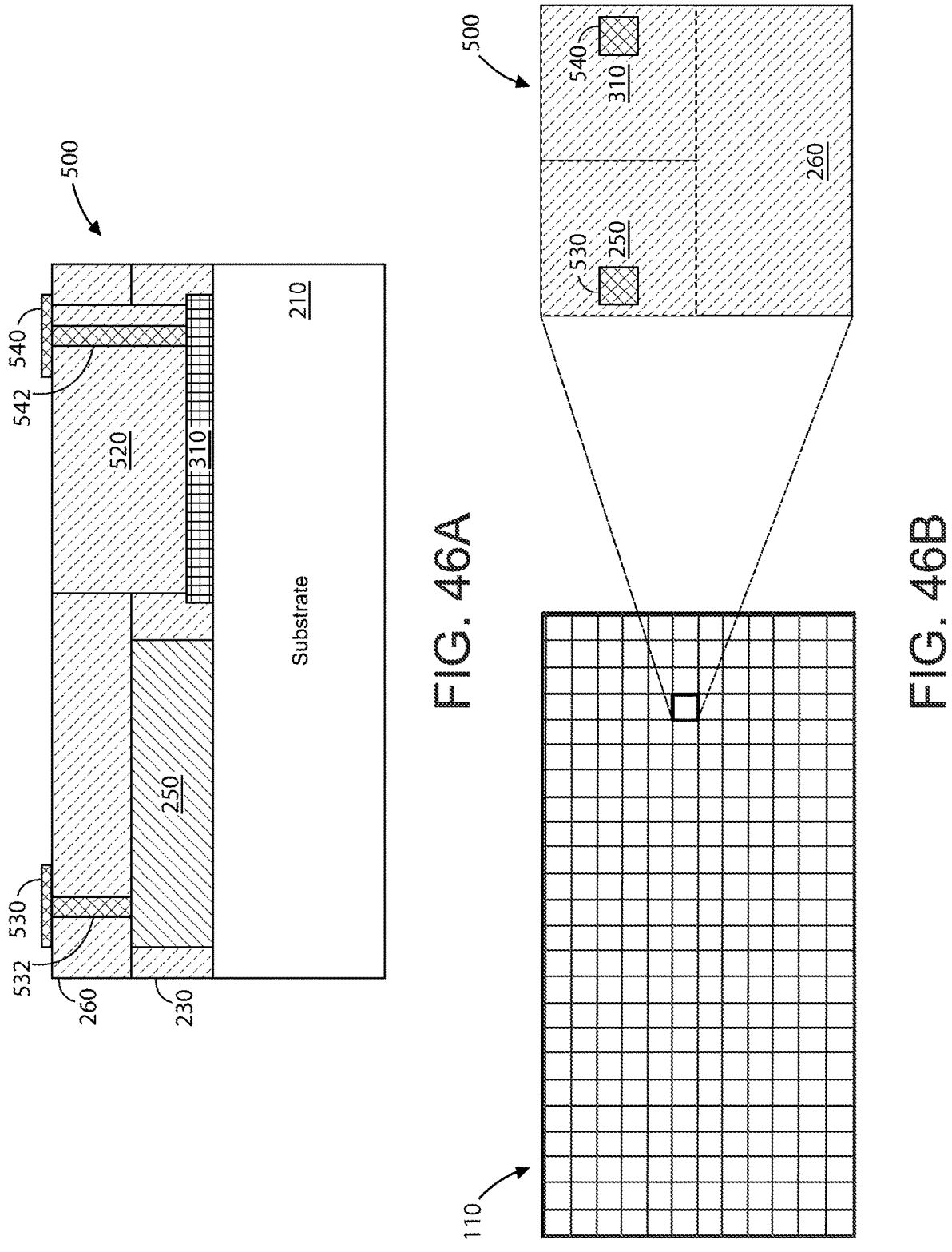

In FIG. 46A, a first bond pad 530 is formed overlying at least a portion of the second dielectric layer 260 and is coupled to the photodetector device 250 by a metal interconnection 532. And, a second bond pad 540 is formed overlying at least a portion of the dielectric material 520 and is coupled to the semiconductor detector device 310 by a metal interconnection 542. These metal interconnections 532, 542 can be formed as via structures, or as other similar structures. FIG. 46B shows an example orientation of the first and second bond pads 530, 540.

Figures 47A, 47B:
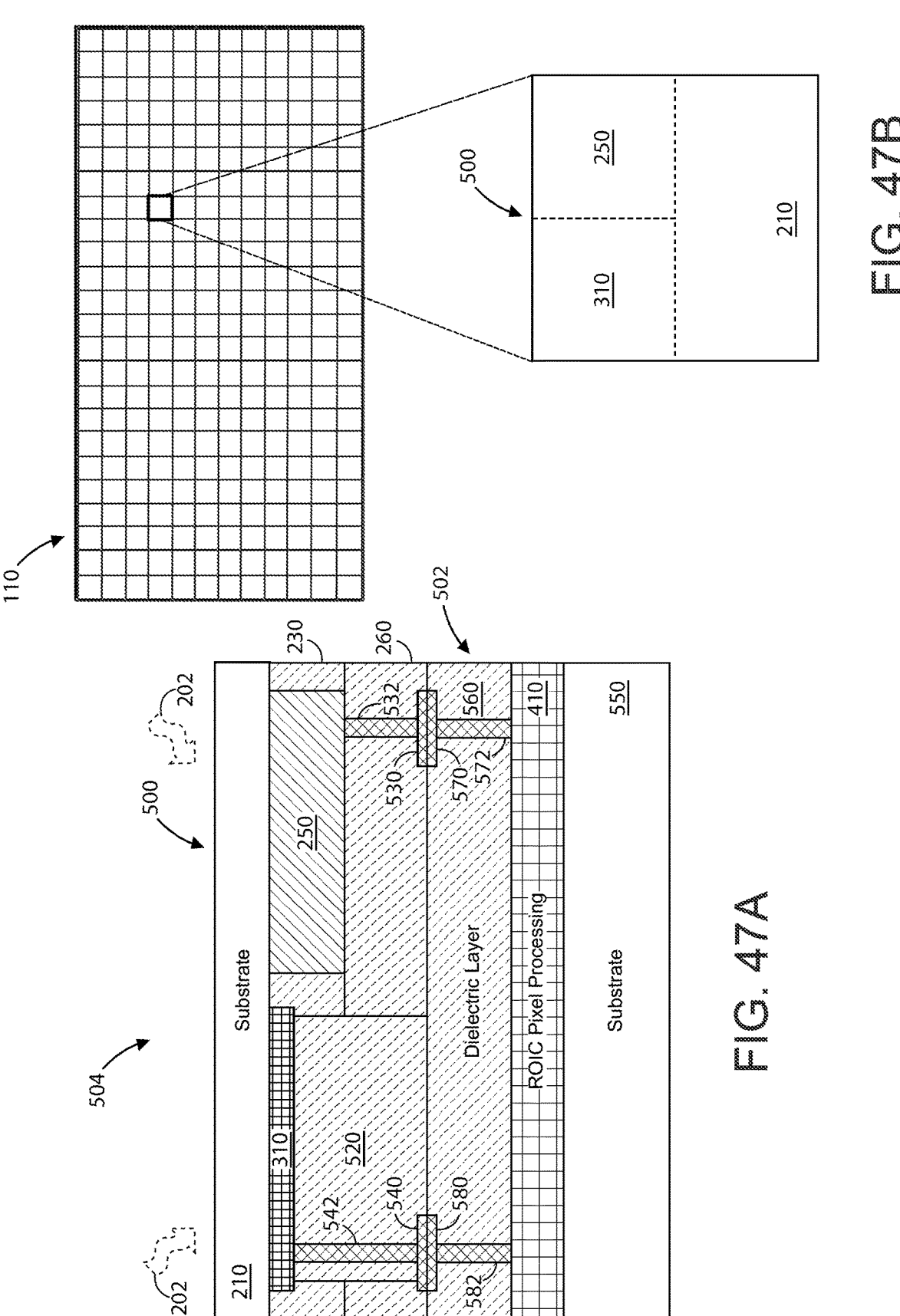

In FIG. 47A, the device 500 resulting from the previous steps is bonded in a flipped orientation to an ROIC substrate 502, which includes a ROIC device 410 formed overlying a substrate 550 and a dielectric layer 560 overlying the ROIC device 410 with at least a first bond pad 570 and a second bond pad 580 coupled to the ROIC device 410 by a first metal interconnect 572 and a second metal interconnect 582, respectively. As shown in the resulting stacked configuration, the first bond pad 570 from the ROIC substrate 502 is coupled to the first bond pad 530 of the device 500 (i.e., to the photodetector device 250, and the second bond pad 580 from the ROIC substrate 502 is coupled to the second bond pad 540 of the device 500 (i.e., to the semiconductor detector device 310). In an example, the bonding process can include wafer-wafer bonding, parallel chip-wafer bonding, chip-wafer bonding, flip-chip bonding, or the like.

As shown, this integrated device 504 can be configured for topside illumination, as shown by the dotted line arrows 202. FIG. 47B shows that the substrate 210 now spatially configured on the topside and the positions of the photodetector device 250 and the semiconductor detector device 310 have been flipped.

Other steps can be taken to finish fabrication of the device 500, including the formation of additional metal interconnects or other backend processing steps, such as thinning substrates or forming lenses or other structures. Other elements and method steps described herein can also be incorporated as well. Those of ordinary skill in the art will recognize other variations, modifications, and alternatives.

According to an example, the present invention provides a circuit for a photodetector. The photodetector circuit includes a buffer material formed (or deposited) overlying a surface region of a Si substrate, or the like. This buffer material can include a CS material deposited on the surface region of the Si substrate using direct heteroepitaxy such that the CS material is characterized by a first bandgap characteristic, a first thermal characteristic, a first polarity, and a first crystalline characteristic. Compared to the buffer material, the Si substrate is characterized by a second bandgap characteristic, a second thermal characteristic, a second polarity, and a second crystalline characteristic.

In a specific example, the CS material can include InP, InGaAs, gallium arsenide (GaAs), gallium phosphide (GaP), indium gallium arsenide phosphide (InGaAsP), indium aluminum gallium arsenide (InAlGaAs), indium aluminum arsenide (InAlAs), indium arsenide (InAs), indium gallium phosphide (InGaP), or a combination thereof.

The photodetector circuit also includes an array of photodetectors. This array is characterized by N and M pixel elements (i.e., N×M array; N>0, M>0). In a specific example, N is an integer greater than 7, and M is an integer greater than 0. Each of these pixel elements has a characteristic length ranging from 0.3 micrometers to 100 micrometers. Also, each of the photodetectors includes an n-type material, an absorption material overlying the n-type material, and a p-type material overlying the absorption material.

In a specific example, the n-type material can include an InP material with a silicon impurity having a concentration ranging from $5E17$ cm$^{-3}$ to $5E18$ cm$^{-3}$ overlying the buffer material. The absorption material can include an InGaAs containing material and can be primarily (or substantially) free from any impurity. And, the p-type material can include a zinc impurity or a beryllium impurity having a concentration ranging from $5E17$ cm$^{-3}$ to $1E20$ cm$^{-3}$.

In an alternative photodetector CS device structure, the n-type material includes a GaAs material comprising a silicon impurity having a concentration ranging from $5E17$ cm$^{-3}$ to $5E18$ cm$^{-3}$, the absorption material includes an InAs quantum dot material, and the p-type material includes a zinc impurity or a beryllium impurity or a carbon impurity having a concentration ranging from $5E17$ cm$^{-3}$ to $1E20$ cm$^{-3}$.

Additionally, the photodetector device structure can be configured with a separate absorption material comprising InGaAs, InAlGaAs, or InGaAsP, and a multiplication material comprising InP whereby the multiplication material generates additional charge carriers by avalanche gain.

The photodetector circuit also includes a first electrode coupled to the n-type material and coupled to a first terminal, as well as a second electrode coupled to the p-type material and coupled to a second terminal. This configuration defines each photodetector as a two-terminal device (i.e., having anode and cathode terminals).

The photodetector circuit also includes an illumination region characterized by an aperture region to allow a plurality of photons to interact with the CS material and be absorbed by a portion of the absorption material to cause a generation of mobile charge carriers that produce an electric current between the first terminal and the second terminal. In a specific example, the Si substrate is configured to allow the photons to traverse there through. The illumination region can also be configured to be free from any portion of the silicon substrate. A color filter can be configured overlying (or otherwise coupled to) the illumination region, and a lens (e.g., microlens, metalens, or the like) can be configured overlying (or otherwise coupled to) the color filter.

Further, the photodetector circuit is characterized by a responsivity greater than 0.5 Amperes/Watt characterizing the circuit between the first terminal and the second terminal, and a photodiode quantum efficiency greater than 50% as measured between the first terminal and the second terminal. The photodetector circuit can be characterized as a BSI device or a FSI depending upon the application.

The photodetector circuit device can further include an analog front-end circuit, such as a ROIC, coupled to the array of photodetectors. The ROIC includes a first input terminal, a second input terminal, and a pixel output. The first and second input terminals are coupled to the first and second terminals of the photodetectors, respectively. The photodetector circuit can also include analog-to-digital conversion functionality (e.g., configured with or as part of the ROIC. There can be other variations, modifications, and alternatives to the elements and configurations discussed above.

FIGS. 48-53 are simplified diagrams illustrating methods of fabricating a compound semiconductor (CS) photodetector circuit device 4800 according to an example of the present invention. In these figures, shared reference numerals in subsequent figures refer to the same elements as described in previous figures.

FIG. 48 is a simplified diagram of a device 4800 including CS buffer materials on a Si substrate realized by heteroepitaxy according to an example of the present invention. In this embodiment, a CS buffer material 4820 is deposited overlying a surface region 4811 of a Si substrate 4810 in order to nucleate the CS material 4820 and to trap and/or filter defects within the buffer material 4820 and near the interface between the CS material 4820 and Si surface 4811. The initial nucleation and buffer material growth may be carried out with a number of methodologies, and combinations of methodologies, including, but not limited to, initial group IV material growth for surface reordering followed by group III-V CS growth for defect trapping; Si surface patterning or structuring, that may include formation of various Si crystal planes, followed by CS nucleation and growth; low-temperature CS nucleation; low-temperature CS nucleation followed by multi-step growth with temperature grading for defect bending and annihilation; use of strained layer superlattices (SLS), interfaces with high strain fields, graded or step-graded materials, or other similar techniques to redirect, trap, convert, and/or annihilate defects.

As shown in FIG. 49, following the formation of the CS buffer material 4820, the photodetector device materials may be deposited overlying the CS buffer material 4820 and Si substrate 4810. The photodetector device materials can include an n-type CS material 4910, a CS absorption material 4920, and a CS material 4930. In this embodiment, CS device materials that are deposited overlying the buffer on Si (e.g., device 4800 of FIG. 48) may form planar photodiode structures for the photodetector array circuit.

The n-type CS material 4910 comprises a Si doping impurity and is formed overlying the buffer on Si. The CS absorption material 4920, which is formed overlying the n-type material 4910, is highly absorptive of light with a characteristic wavelength or wavelength range of interest. The absorption material 4920 is primarily free from impurities. The CS material 4930, which is formed overlying the absorption material 4920, is deposited without intentional impurity. The various materials illustrated may comprise of band smoothing layers, diffusion block layers, a separate absorption layer, a charge layer, or a multiplication layer. Those of ordinary skill in the art will recognize other variations, modifications, and alternatives.

Figure 50:
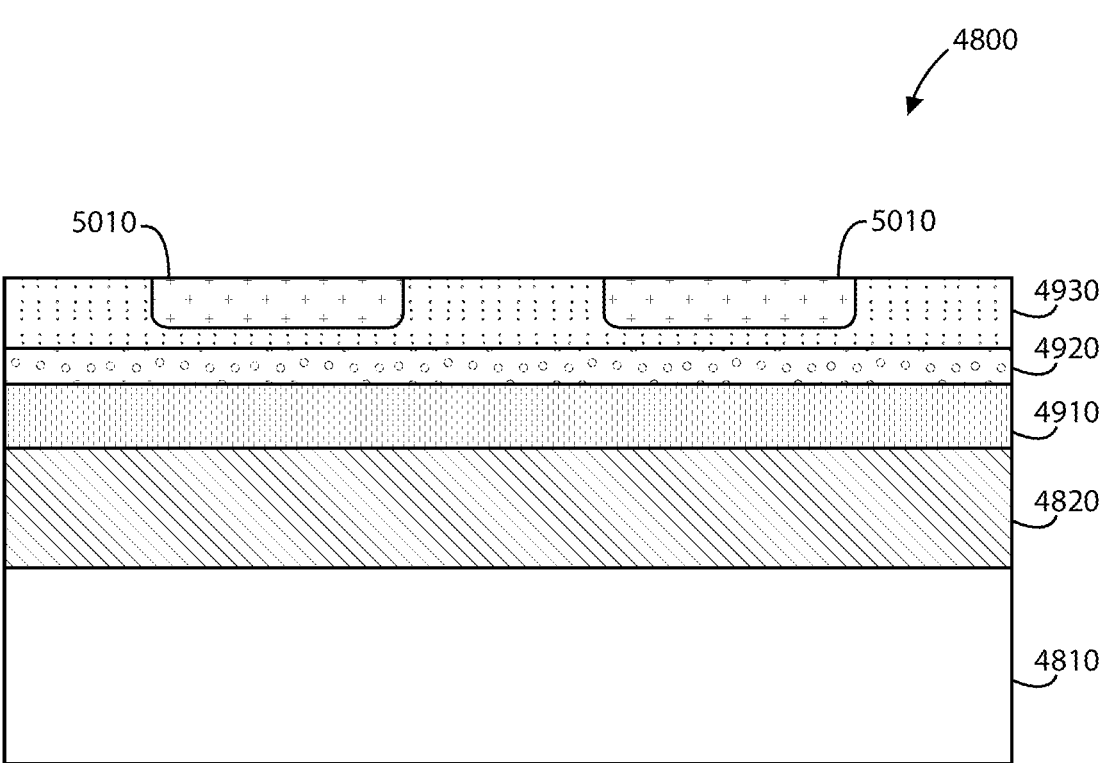

As shown in FIG. 50, the p-type material 5010 for each photodetector is formed within a portion of the CS material 4930. Depending on the specific CS material used for element 4930, the p-type material 5010 can be formed with diffusion of an impurity material that may be zinc, beryllium, or carbon, or the like.

Figure 51:
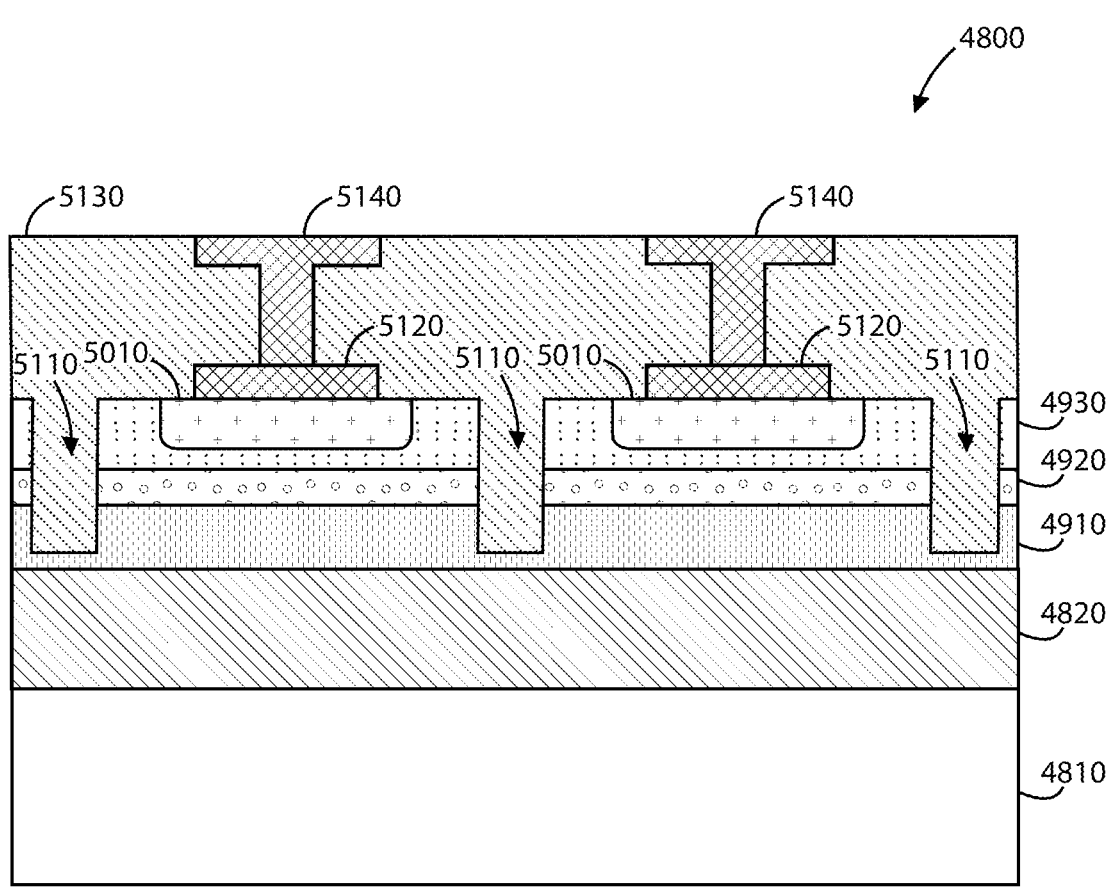

FIG. 51 illustrates the photodetector circuit 4800 following the completion of the front-end fabrication steps (e.g., as shown previously in FIGS. 48-50). Isolation trenches 5110 may be formed within portions of the photodetector device materials (i.e., layers 4910-4930) for optical or electrical isolation, and, in combination, to expose the n-type layer 4910 (e.g., to form one or more n-contact metals). One or more p-contact metals 5120 can be formed overlying the p-type materials 5010. A dielectric material 5130 may be deposited overlying the p-contact metals 5120, the p-type materials 5010, and the photodetector device materials. In this case, the dielectric material 5130 also fills isolation trenches 5110. Additional vias and trenches may be formed to expose the p-contact metals 5120, and then the vias and trenches may be filled with metal materials 5140 to provide metal connections to the p-contact metals 5120 at the exposed surface region of the dielectric material 5130. Of course, there can be other variations, modifications, and alternatives.

Photodetector device structures formed could include, but are not limited to, PIN photodiodes, APDs, CCDs, SPADs, UTC-PDs, mesa photodiodes, or planar photodiodes. Photodetectors could leverage bulk absorptive layers, including, but not limited to, InGaAs, InAlGaAs, InGaAsP, or could alternatively leverage quantum wells, quantum dashes, or quantum dots. Those of ordinary skill in the art will recognize other variations, modifications, and alternatives.

Figure 52:
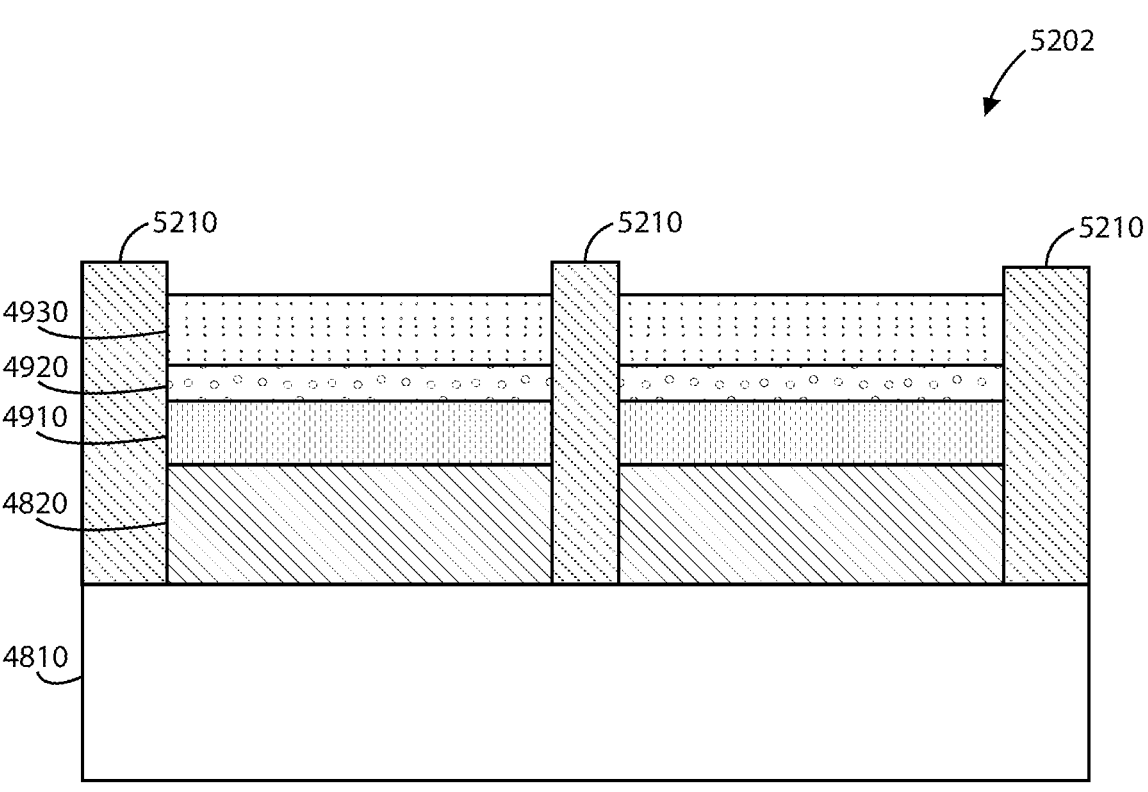
Figure 53:
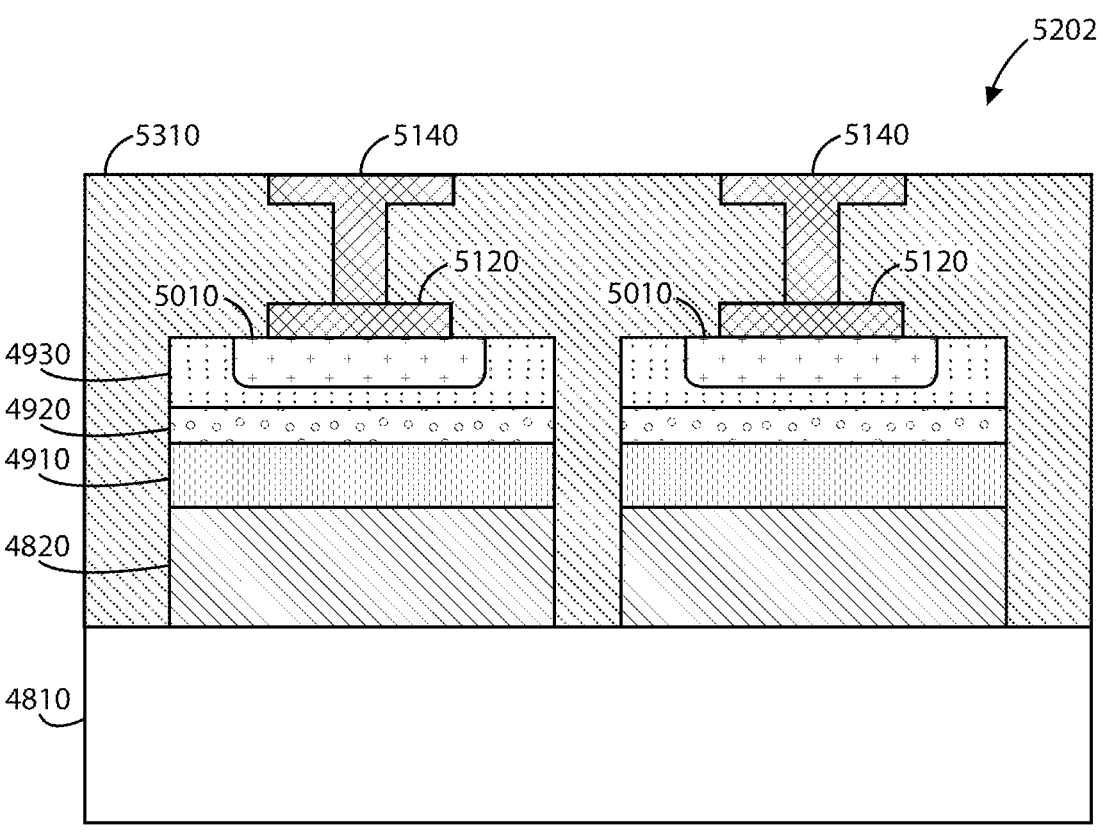

FIG. 52 represents an alternative embodiment of a photodetector circuit 5202 whereby the CS materials are deposited on the Si surface by selective area heteroepitaxy, whereby the Si surface is firstly patterned with a dielectric material 5210 to form recesses, within which the CS materials would be selectively deposited on the exposed Si surface while not depositing on the dielectric material. The materials may comprise of similar or identical layers as those described for FIG. 51 (denoted by the same reference numerals). As illustrated in FIG. 53, the front-end fabrication steps for the photodetector circuit 5202 following the selective heteroepitaxy of the CS materials (shown in FIG. 52) may be similar or identical to those steps utilized to form the photodetector circuit 5200 in the embodiment of FIG. 51 (denoted by the same reference numerals). As shown, the dielectric material 5310 (combined with dielectric material 5210, if not removed) isolates the two CS material stacks formed by selective area heteroepitaxy.

Selective area heteroepitaxy is beneficial for improving the quality of the CS material on Si, for facilitating photodetector fabrication, and also for realization of novel device structures. Selective area heteroepitaxy can improve material quality by releasing thermal strain caused by the mismatch in thermal expansion coefficient between the CS materials and the Si, and by providing aspect ratio trapping of defects and dislocations.

The embodiment of FIG. 53 may not require a separate trench isolation step (shown in FIG. 51) due to the isolation provided by the patterned dielectric 5210. Some of the dielectric between the CS areas can be removed by etching or an alternative process, and then these regions can be filled with materials, such as metals, that would be opaque, to provide additional optical isolation. Without departing from the scope of the invention, such trench isolation could alternatively be formed in a backend step following bonding of the photodetector substrate, or chips from the substrate to a target readout circuit Si CMOS substrate.

Figures 54A, 54B:
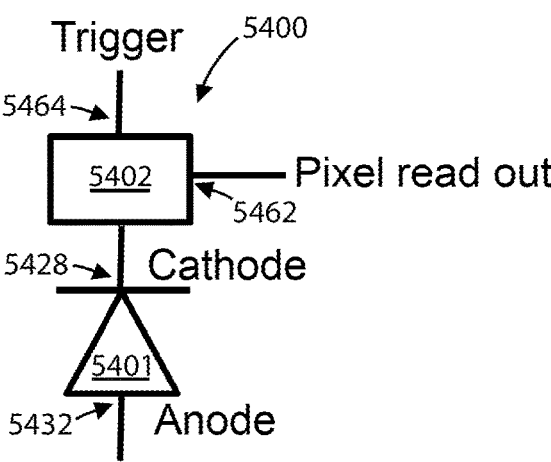
FIG. 54A is a simplified diagram of a circuit device including a photodetector array circuit coupled to a readout circuit according to an example of the present invention.
FIG. 54B is a simplified circuit diagram of the photodetector array circuit coupled to the readout circuit shown in FIG. 54A.

FIG. 54A is a simplified diagram of a circuit device 5400 including a photodetector array circuit 5401 coupled to a readout circuit 5402 according to an example of the present invention. As shown, the photodetector circuit 5401 is bonded to the CMOS readout circuit 5402 at the bond interface 5403. The steps for front-end fabrication of the photodetector circuit and the CMOS circuit may vary in detail or order, without departing from the scope of the invention. In an example, each photodetector device structure in the array 5401 is formed with an n-type CS material 5414, a CS absorption material 5416, a p-type CS material 5420 (configured within a CS material 5418), a p-metal contact 5424 coupled to a first terminal 5428 (i.e., the cathode), and an n-metal contact coupled to a second terminal 5432 (i.e., the anode). The n-metal contact/second terminal coupling may be made from the topside of the photodetector circuit 5401, or from the backside, without departing from the scope of the invention. These photodetector devices can be separated by isolation trenches 5422.

The readout circuit 5402 comprises a Si substrate 5440, which can include the readout integrated circuits (ROIC) 5442 and other front-end integrated circuits (ICs). The metal layers of the readout circuit 5402 within the dielectric layer 5444 can include terminals (e.g., first input terminals 5446 and second input terminals). The first input terminals 5446 of the readout circuit 5402 can connect to the cathode terminals 5428 of the photodetector 5401 at the bond interface 5403. FIG. 54B shows a simplified circuit diagram representation of device 5400 with the photodetector 5401 coupled to the readout circuit 5402 with terminals for pixel read out 5462 and triggering 5464. In an example, the second input terminal of the readout circuit 5402 is coupled to the second terminal 5432 of the photodetector 5401. Those of ordinary skill in the art will recognize other variations, modifications, and alternatives to the configuration for metal contacts and terminal connections.

The steps for the backend fabrication, including bonding, backside contact, optical coating, color filter integration, or lens attachment, may vary in detail or order, without departing from the scope of the invention. In an example of the invention, the Si handle substrate and some of the CS materials are removed from the backside of the photodetector circuit following face-to-face bonding to the Si CMOS circuit. This removal process can be used to form an illumination region configured to allow light to interact with the photodetector materials (e.g., CS absorption material). An optical coating 5450 and/or color filters 5452 may be applied to the n-type CMOS material to assist in defining the illumination apertures for pixel elements. A lens array 5454 may be coupled to the optical coating 5450/color filter 5452 for increasing the coupling of light to each pixel element to improve the responsivity of the photodetector circuit. The photodetector circuit of FIG. 54A represents a back side illuminated (BSI) photodetector. A modified front side illuminated (FSI) photodetector circuit may be realized by CS heteroepitaxy on Si without departing from the scope of the invention.

Figures 55A, 55B, 55C:
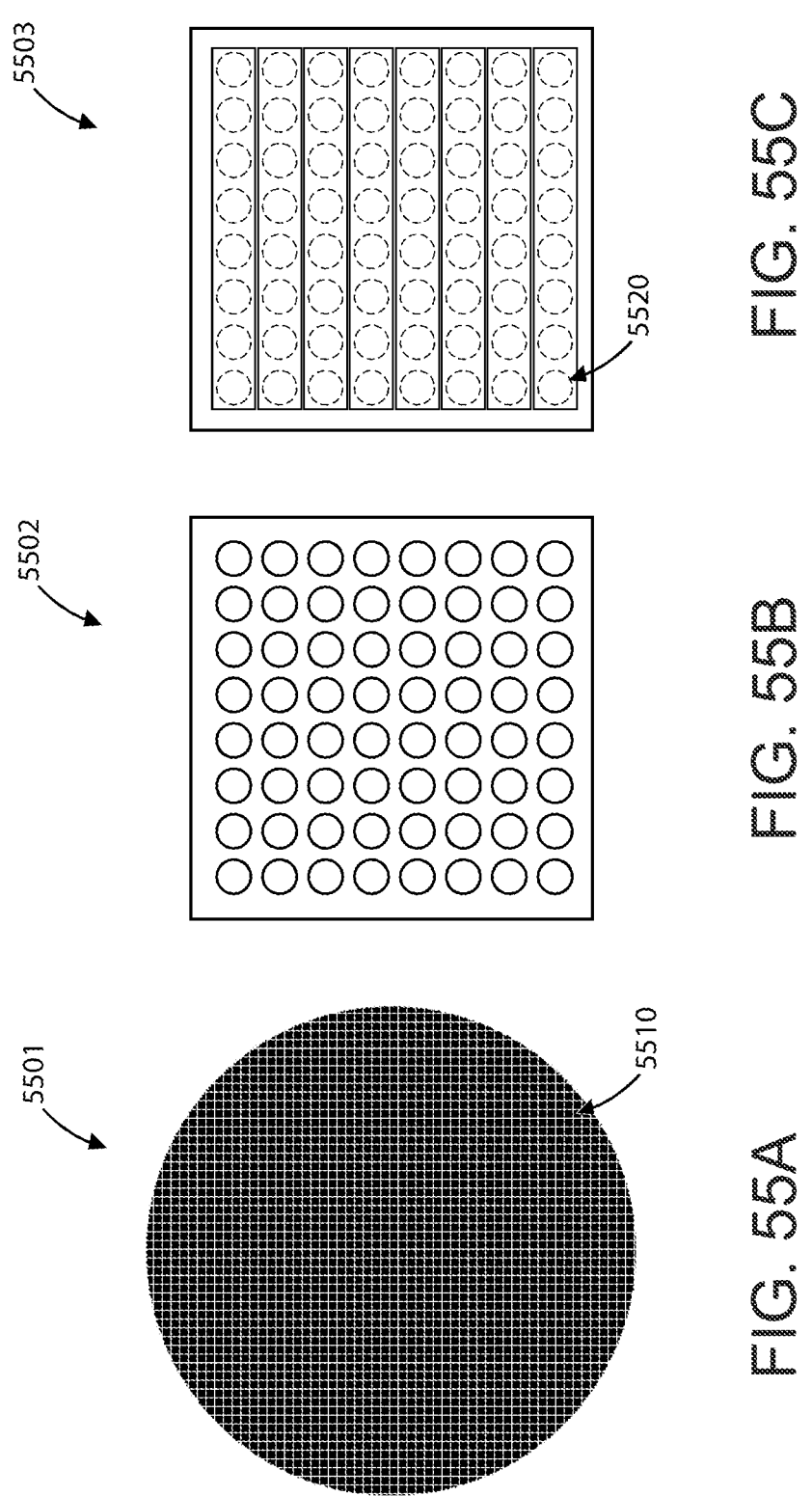
FIGS. 55A-55C are a top view description of a wafer with patterned die and top view descriptions of example dies patterned with circles or rectangular stripes for selective area heteroepitaxy, respectively, according to an example of the present invention.

FIGS. 55A-55C are simplified diagrams illustrating wafer die patterns according to various examples of the present invention. FIG. 55A illustrates a wafer 5501 with an example die pattern, where each individual die (e.g., die 5510) may vary in size/area from small, such as less than 1 mm×1 mm, to a larger size that is the maximum allowable for the lithography system used. Within each die, various patterns of the dielectric can be leveraged should selective area heteroepitaxy be utilized for CS material growth on Si. Examples can include circular patterns (shown in die 5502 of FIG. 55B), rectangular patterns (shown in die 5503 of FIG. 55C). Pattern shape and size selection can assist, along with growth optimization and pattern fill factor, to achieve higher material quality. For the rectangular stripe patterns shown in die 5503, circular photodetectors, denoted by the dashed circles (e.g., photodetector 5520), could be formed following growth by mesa etching or by diffusion, the latter of which would form a planar device. The patterns represent the area from which the dielectric, for selective area heteroepitaxy, is removed to expose the Si surface below the dielectric.

Other patterns, such as, but not limited to, squares, ovals, trapezoids, different size rectangles, parallelograms, and various polygons could be leveraged without departing from the scope of the invention.

The sequence of steps to complete the realization of such photodetectors and photodetector arrays, including those represented in the embodiments described herein, can be carried out in a number of ways and in different order, and the design of the device layers and structure could be varied, without departing from the scope of the invention.

FIGS. 56A to 56E are simplified diagrams illustrating a method of forming a photodetector device 5600 according to an example of the present invention. The method steps illustrated in these figures can be combined with any method steps discussed previously for forming a photodetector device. Further, the same numerals across these figures refer to the same elements, regions, configurations, etc.

Figure 56A:
Figure 56B:
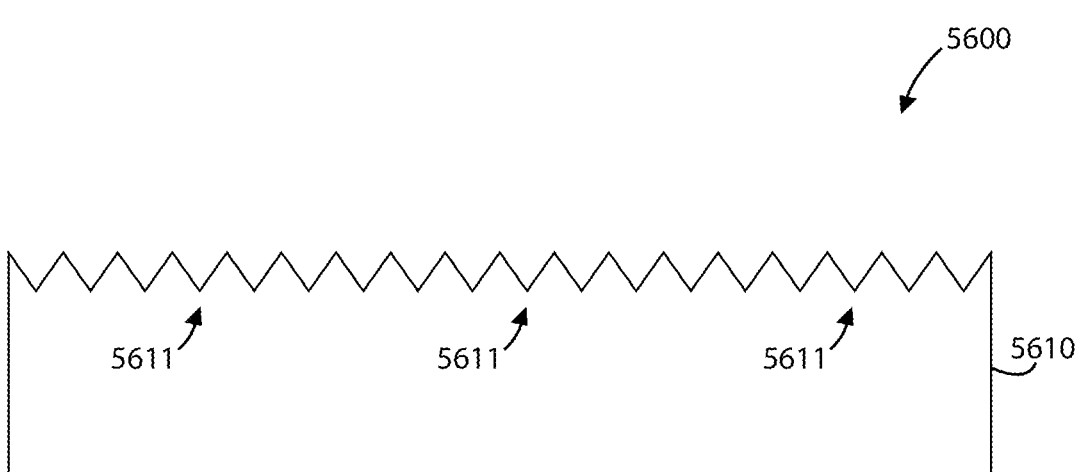

In an example, the present method begins by providing a large silicon substrate 5610, as shown in FIG. 56A. The silicon substrate 5610 has a diameter of about two inches to about twelve inches. In an example, the surface of the silicon substrate is cleaned to remove any native oxide material. The substrate is cleaned using a high temperature environment including hydrogen or other suitable species. In an example, the method includes forming a plurality of v-grooves 5611, as shown in FIG. 56B, each of which can have a feature size of 30 to 500 nanometers in width. In an example, each of the v-grooves exposes {111} crystalline planes of the silicon substrate. The plurality of grooves 5611 are commonly formed using an etchant such as potassium hydroxide (KOH) and tetramethyl ammonium hydroxide (TMAH), or other suitable etchants.

In an example, the method includes forming a nucleation layer 5620 comprising a gallium arsenide material to coat a surface region of the silicon substrate 5610, as shown in FIG. 56C. The nucleation layer 5620 has a thickness ranging from 10 nm to 100 nm, but can be others.

In an example, the method includes forming a buffer material 5630 comprising a plurality of nanowires formed overlying each of the plurality of grooves and extending along a length of each of the v-grooves, as shown in FIG. 56D. The buffer material 5630 includes a first transitionary region 5631 extending from each of the plurality of nanowires, and a second transitionary region 5632 characterized by a {100}-oriented crystalline planar growth of a gallium arsenide compound semiconductor (CS) material configured using a direct heteroepitaxy such that the CS material is characterized by a first bandgap characteristic, a first thermal characteristic, a first polarity, and a first crystalline characteristic, and the silicon substrate 5610 is characterized by a second bandgap characteristic, a second thermal characteristic, a second polarity, and a second crystalline characteristic.

In an example, the buffer material further comprises a gallium arsenide containing material and an indium phosphide containing transitionary region (e.g., InGaAs, or the like) and an interface region comprising a trapping layer comprising indium gallium arsenide and indium phosphide overlying the gallium arsenide containing material and indium phosphide containing transitionary region. In a specific example, the transitionary region can be closer to GaAs at the start and can be closer to InP towards an InP graded region.

Figure 56E:
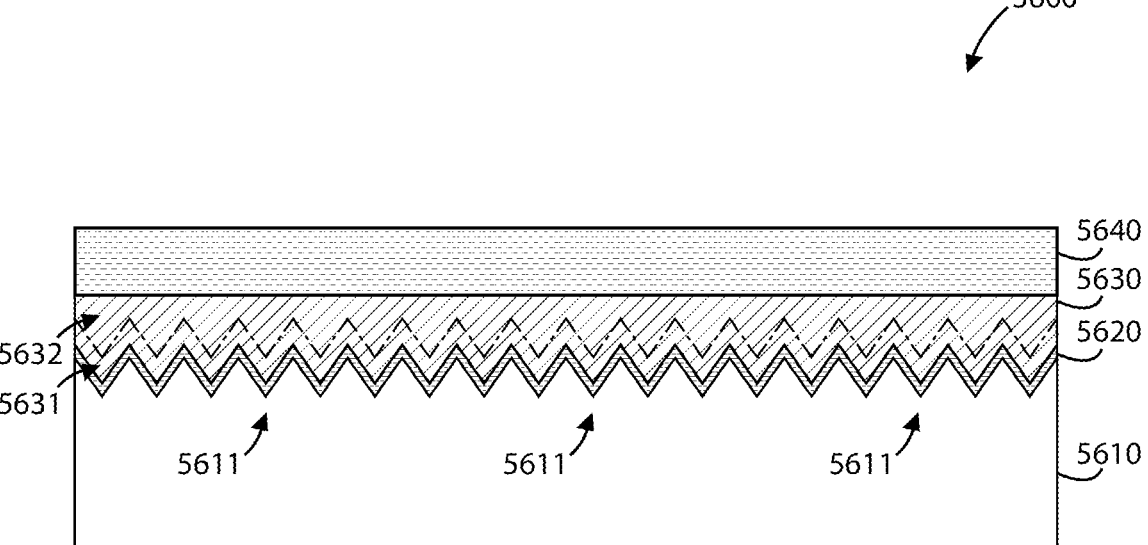

In an example, the method also includes forming one or more device material layers overlying the buffer material 5630, such as a n-type material layer 5640 shown in FIG. 56E. The device materials can include photodetector device materials, such as those discussed previously. As such, these method steps for forming the v-groove patterned substrate can be combined with any method steps for optoelectronic and sensor devices discussed herein.

According to an example, the present invention provides for a method of fabricating a sensor device using a selectively transparent wavelength configuring material. Depending on the material composition and configuration of this selectively transparent material, the sensor device can exhibit high performance for target wavelength ranges while maintaining low dislocation density. Further details are provided with respect to the following figures.

FIGS. 57A-57D are simplified diagrams illustrating a method of forming a sensor material (e.g., photosensor, photodetector, etc.) with a selectively transparent buffer according to an example of the present invention. The method steps illustrated in these figures can be combined with any method steps discussed previously for forming a photodetector device. Further, the same numerals across these figures refer to the same elements, regions, configurations, etc.

Figure 57A:
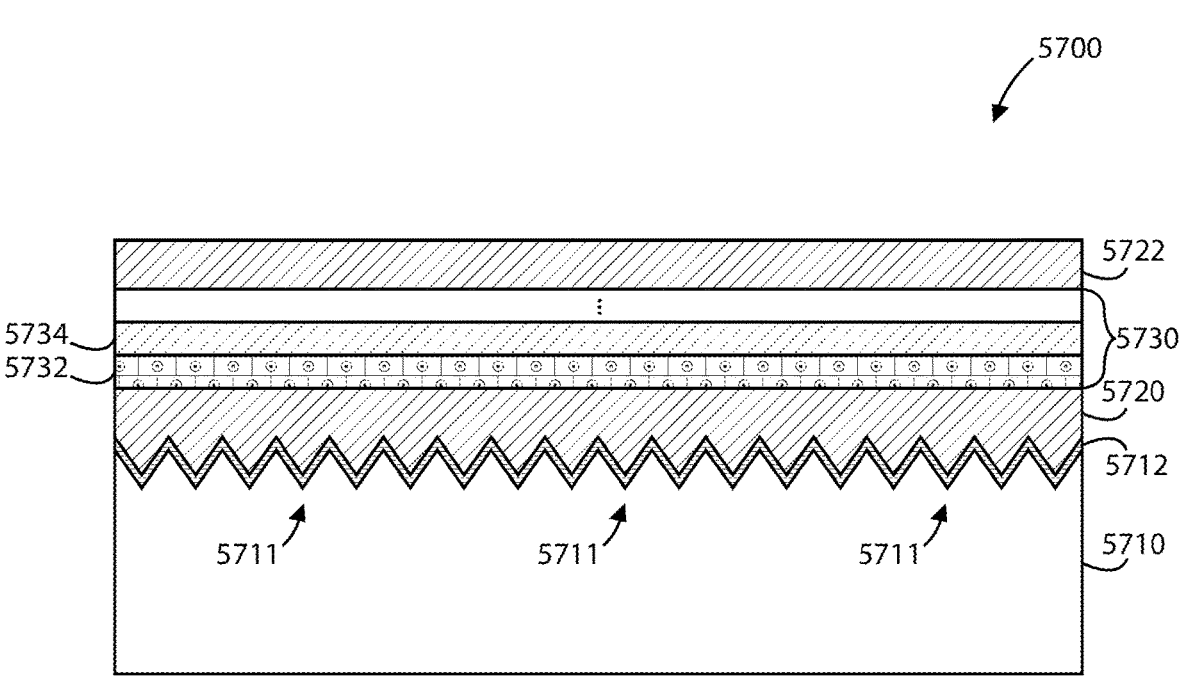
FIGS. 57A-57D are simplified diagrams illustrating a method of forming a sensor material with a selectively transparent buffer according to an example of the present invention.

The method can begin with similar steps to those shown in FIGS. 56A-56D forming the materials of the sensor device 5604 prior to the device layers. Similar to device 5604, FIG. 57A shows device 5700 having a silicon substrate 5710 with a plurality of v-grooves 5711, a nucleation layer 5712 formed overlying the v-grooves 5711, and a first buffer material 5720 formed overlying the v-grooves 5711. The configuration and composition of these materials can be similar to those discussed previously.

As previously discussed, the method also includes forming a transparent buffer region or transparent material stacks. The transparent buffer region can include a plurality of material regions having at least a first material composition and a second material composition, which can be configured as a defect filter layer (DFL) or defect material stack. In a specific example, the first material composition can include an InGaAs(P)/GaAs, (In)GaAsP/GaAs, InAlAs/GaAs or InGaP/GaAs strained layer superlattice (SLS) material; or an InGaAs(P), (In)GaAsP, InAlAs, or InGaP strained interlayer (SIL) material, while the second material composition includes a GaAs spacer material. Or, the first material composition can include an InGa(As)P/InP, In(Ga)AsP/InP, or InAlAs/InP SLS material; or an InGa(As)P, In(Ga)AsP or InAlAs SIL material; while the second material includes an InP spacer material, or the like. In other cases, these material regions can include varying elemental concentrations of InP, InGaAs, GaAs, GaP, InGaAsP, InAs, InAlAs, InAlGaAs, InGaP, or the like.

As shown in device 5700, the transparent buffer region includes a first defect filter layer (DFL) 5730 formed overlying the first buffer material 5720. In an example, the defect filter material stacks 5730 includes one or more defect filter regions 5732 (i.e., first material composition) overlying the buffer material 5720. The defect filter material 5730 can also include one or more spacer regions 5734 (i.e., second material composition) overlying the buffer material 5720. These defect filter regions 5732 and spacer regions 5734 can be configured in an alternating pattern (e.g., repeating 3×, 5×, 10×, etc.). A defect filter cap material or a second buffer material 5722 can be formed overlying the one or more defect filter regions 5732 and the one or more spacer regions 5734 as well. These regions may be formed following one or more thermal cycle annealing (TCA) processes on the first buffer material 5720.

Figure 57B:
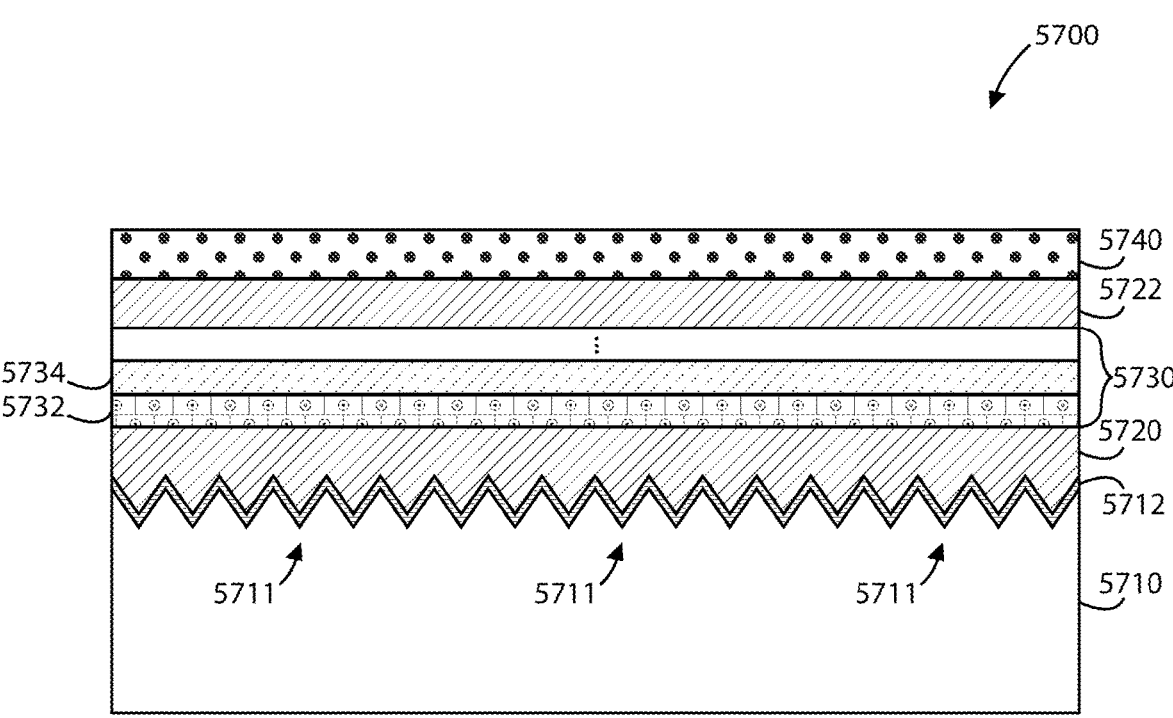

As shown in FIG. 57B, the method can include forming additional transparent buffer regions, which can be lattice matched to any device layers grown on top. Here, the method includes forming a second transparent buffer region having at least a first additional buffer material 5740 overlying the first transparent buffer region. In a specific example, the different material compositions may be chosen for each transparent buffer region. For example, the first transparent buffer region can be configured as a transparent GaAs buffer, while the second transparent buffer region can be configured as a transparent InP buffer.

Figure 57C:
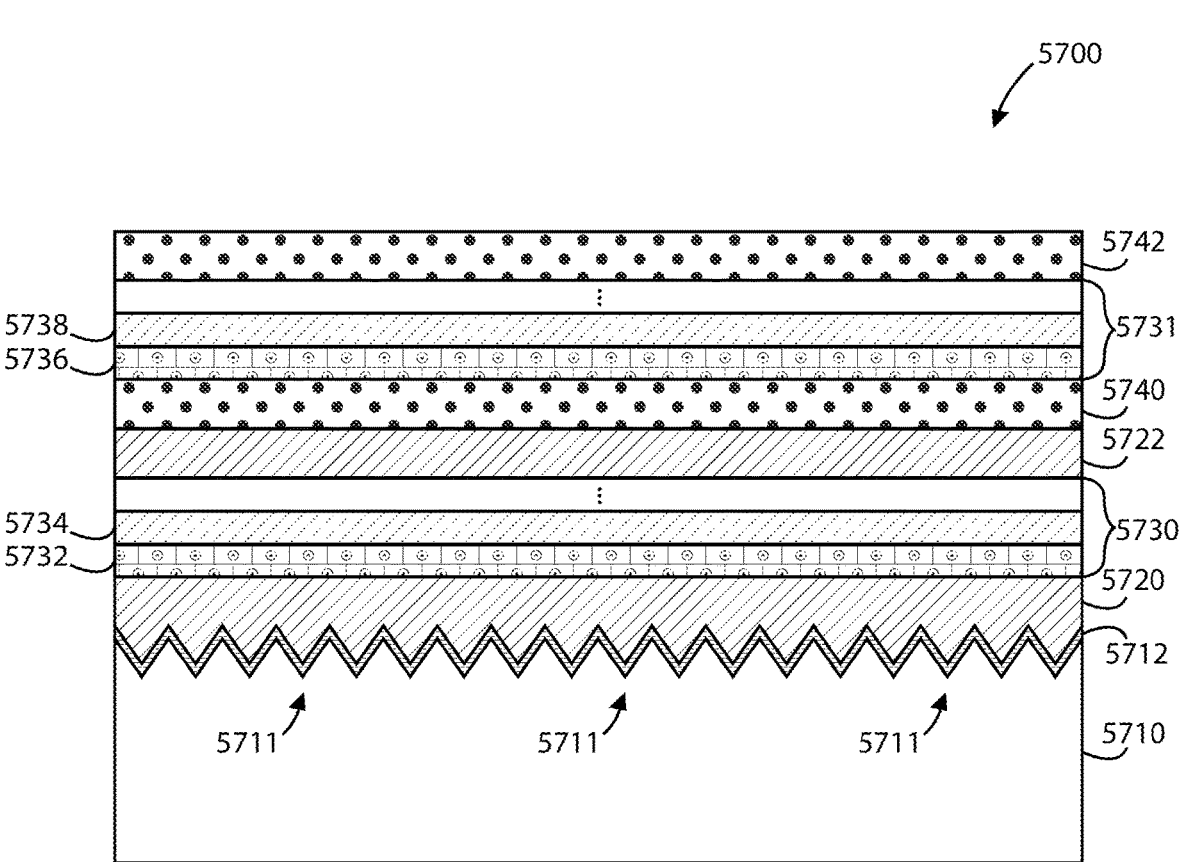

As shown in FIG. 57C, the method can include optionally forming a second DFL 5731 overlying the first additional buffer material 5740. This second DFL 5731 also includes one or more first material compositions 5736 and one or more second material compositions 5738, which can differ from the material compositions of the first transparent buffer region. Following the previous example, the first material of the second DFL 5731 can include an InGa(As)P or InAlAs SIL material, or an InGa(As)P/InP or InAlAs/InP SLS material, and the second material includes an InP spacer material, or the like. Depending on the embodiment, the materials for the first DFL 5730 and the second DFL 5731 may have the same or different configuration of materials and material compositions. Further, a second additional buffer material 5742 can then be formed overlying the second DFL 5731.

Figure 57D:
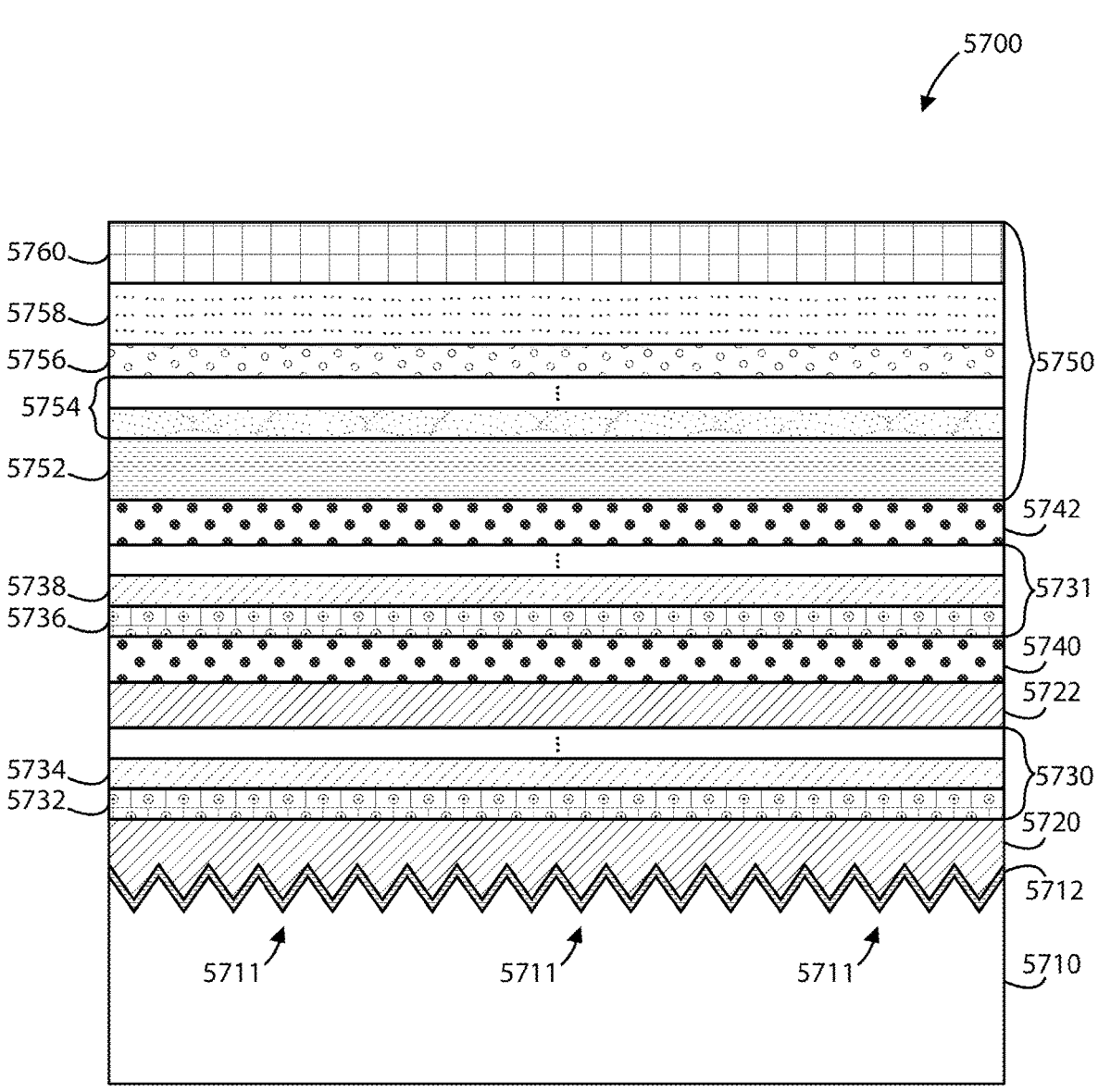

As shown in FIG. 57D, device layers 5750 can be formed overlying the one or more transparent buffer regions. Here, the device layers include, from bottom to top, an n-type contact region 5752, one or more band transition regions 5754, an absorption region 5756, a p-type spacer region 5758, and a p-type contact region 5760 These device layers can be lattice matched to the underlying buffer material (e.g., second additional buffer material 5742), which can help avoid generation of extra defects, among other benefits. In a specific example, the transparent buffer has a thickness greater than 1000 nm and is configured for an operation wavelength range of about 900 nm to about 1700 nm. The composition and configuration of the device layers can include those discussed previously.

Figure 58A:
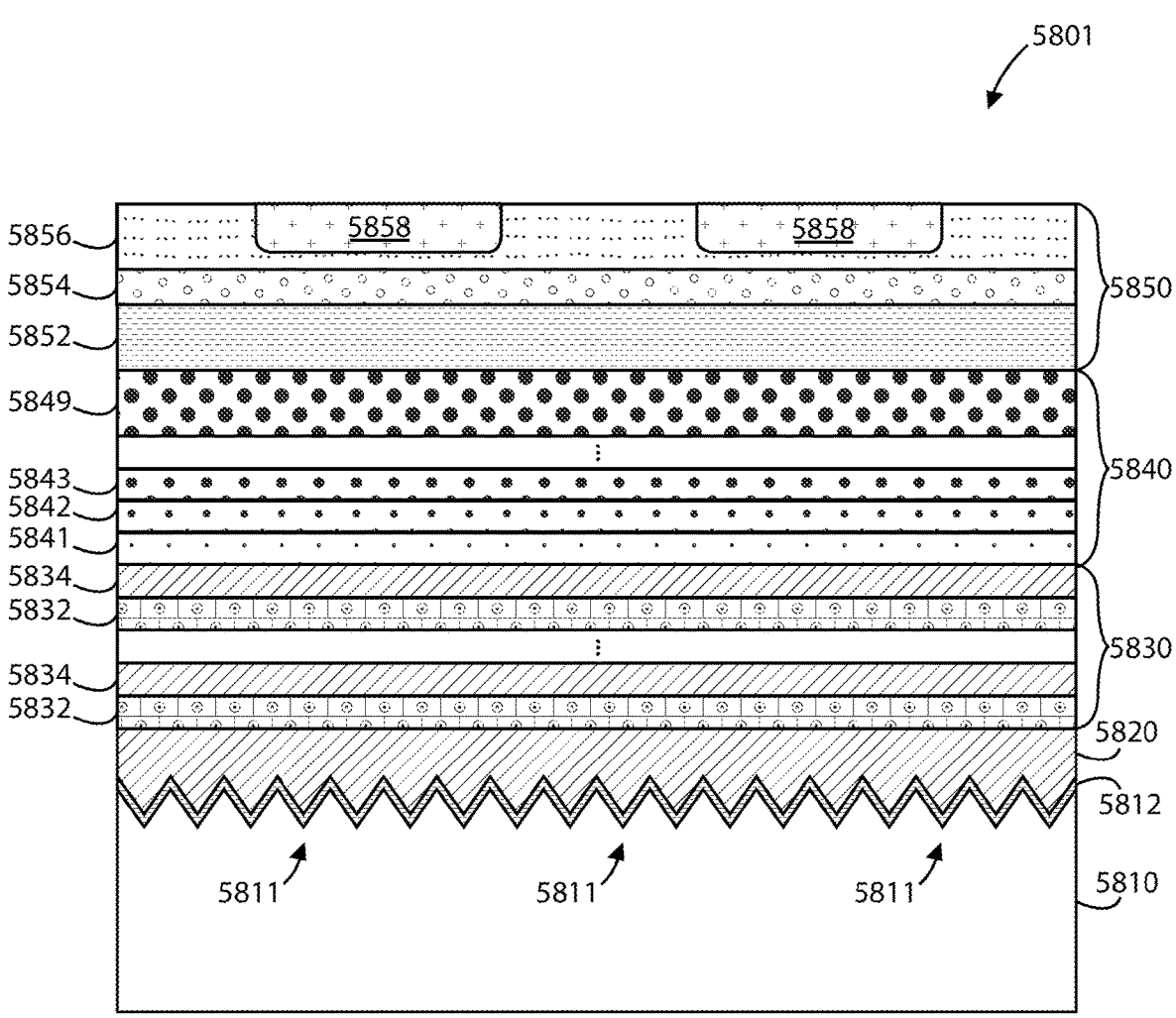
FIGS. 58A and 58B are simplified diagrams illustrating cross-sectional views of a sensor device using graded wavelength configuring materials according to examples of the present invention.
Figure 58B:
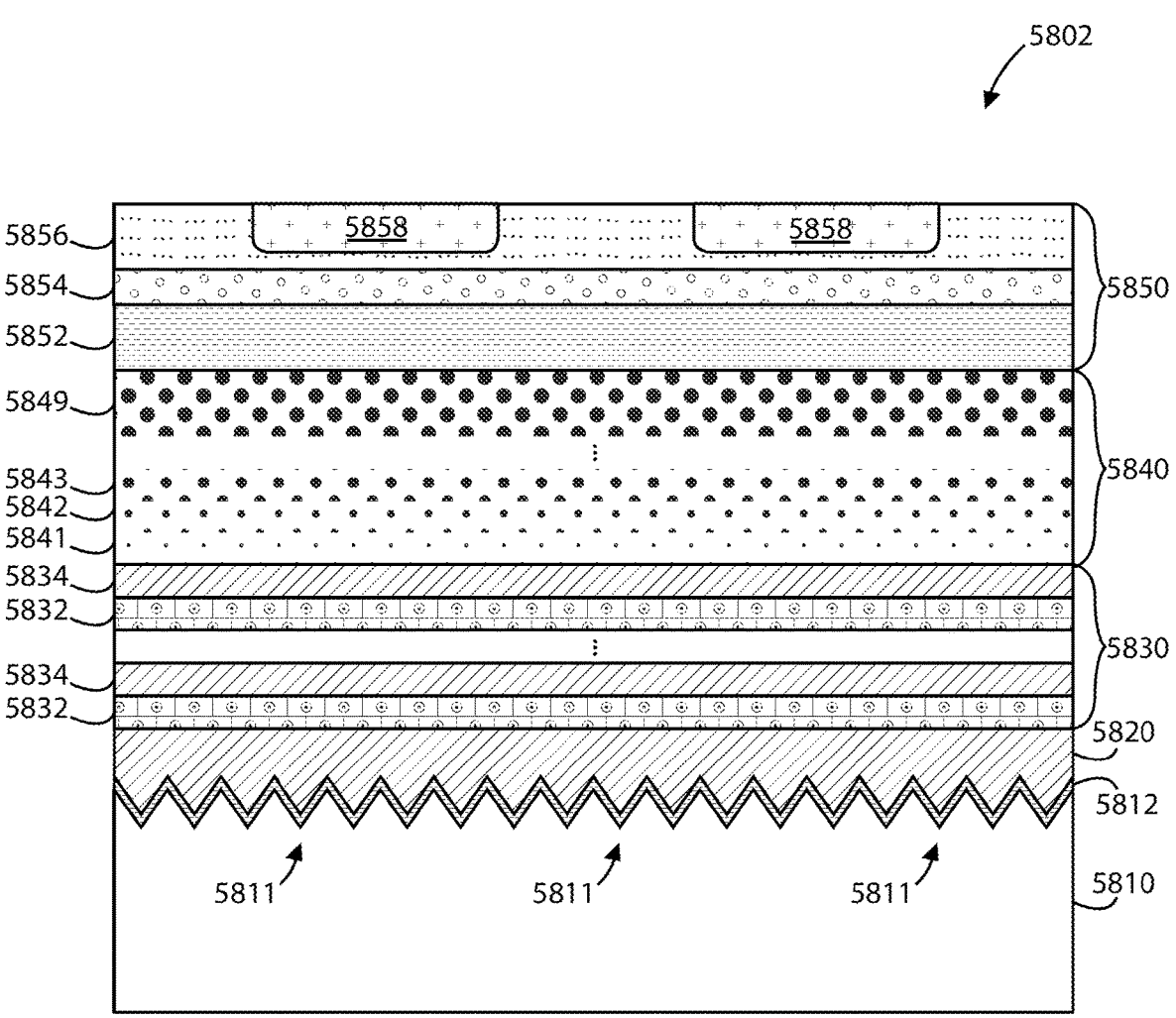

FIGS. 58A to 58B are simplified diagrams illustrating a method of forming sensor devices (devices 5801 to 5802) using graded wavelength configuring materials according to examples of the present invention. The elements and techniques illustrated in these figures can be configured similarly to or combined with any previous device elements and method steps. Further, the same numerals across these figures refer to the same elements, regions, configurations, etc.

FIG. 58A is a simplified diagram illustrating a sensor device using wavelength configuring material in a step-wise pattern according to an example of the present invention. As shown, device 5801 is a photosensor or photodetector device using a wavelength configuring material configured for a selected wavelength range. This device 5801 includes a patterned substrate 5810 with a plurality of v-grooves 5811 and a nucleation material 5812 (see FIGS. 57A to 57E), a buffer material 5820 overlying the substrate 5810 and the nucleation material 5812, a defect filter layer (DFL) or defect filter material stacks 5830 overlying the buffer material 5820, a wavelength configuring material 5840 overlying the defect filter material 5830, and device materials 5850 overlying the wavelength configuring material.

In an example, the defect filter material stacks 5830 includes one or more defect filter regions 5832 overlying the buffer material 5820. The defect filter material 5830 can also include one or more spacer regions 5834 overlying the buffer material 5820. These defect filter regions 5832 and spacer regions 5834 can be configured in an alternating pattern. A defect filter cap material can be formed overlying the one or more defect filter regions 5832 and the one or more spacer regions 5834 as well. These regions may be formed following one or more thermal cycle annealing (TCA) processes on the buffer material 5820. In a specific example, the defect filter material 5832 includes an InGaAs material, the spacer region 5834 includes a GaAs material, and the defect filter cap material includes a GaAs material. Other CS materials may be used as well.

In an example, the wavelength configuring material 5840 includes a graded region, which includes a plurality of material regions 5841-5849. Although the device 5801 shows material regions 5841-5843 and a final material region 5849, the number of material regions can vary depending on the desired application. These material regions can include different elemental concentrations of certain materials or combinations of materials. In a specific example, these interfaces between each adjacent pair of material regions can be free from a smearing of compositions. Further, the overlying device materials 5850 can include an n-type material 5852, an absorption material 5854, a spacer material 5856, and a p-type material 5858.

In an example, the plurality of material regions includes varying concentrations of InGaAs with a final material region of InGaAsP. The In concentration can be in increasing order, the Ga concentration can be in decreasing order, and the As concentration can remain constant. In these cases, the n-type material can be an N+ InGaAsP contact region or an N+ InGaAs contact region, the absorption material can be a UID InGaAs absorber region, and the spacer material can be a UID InGaAsP spacer region.

In an example, the plurality of material regions includes varying concentrations of InAlAs with a final material region of InAlAs. The In concentration can be in increasing order, the Al concentration can be in decreasing order, and the As concentration can remain constant. Similar to the previous example, the n-type material can be an N+ InGaAsP contact region or an N+ InAlAs contact region, the absorption material can be a UID InGaAs absorber region, and the spacer material can be a UID InGaAsP spacer region or a UID InAlAs spacer region.

In an example, the plurality of material regions includes varying concentrations of InGaAsP with a final material region of InGaAsP. The In concentration can remain constant, the Ga concentration can also remain constant, the As concentration can be in increasing order, and the P concentration can be in decreasing order. Similar to the previous examples, the n-type material can be an N+ InGaAsP contact region, the absorption material can be a UID InGaAs absorber region, and the spacer material can be a UID InGaAsP spacer region.

In cases of increasing or decreasing elemental concentration, the rate increase or decrease can also be varied depending on the desired wavelength range. Also, in the cases of constant elemental concentrations, the ratio of one elemental concentration to another elemental concentration can also be varied depending on the desired wavelength range. Of course, there can be other variations, modifications, and alternatives.

FIG. 58B is a simplified diagram illustrating a sensor device using a wavelength configuring material in a continuous pattern according to an example of the present invention. As shown, the material components of device 5802 are the same as the previous device 5801. In this case, the wavelength configuring material 5840 is configured in a continuous pattern. Those of ordinary skill in the art will recognize other variations, modifications, and alternatives to the application of the wavelength configuring material.

In an example, the device layers can be configured as mesa-type sensor devices, planar-type sensor devices, or the like. Further, the device on the transparent buffer can be configured for either front-illumination or back-illumination configurations. Examples of these configurations are shown in FIGS. 59A and 59B and FIGS. 60A and 60B.

Figure 59A:
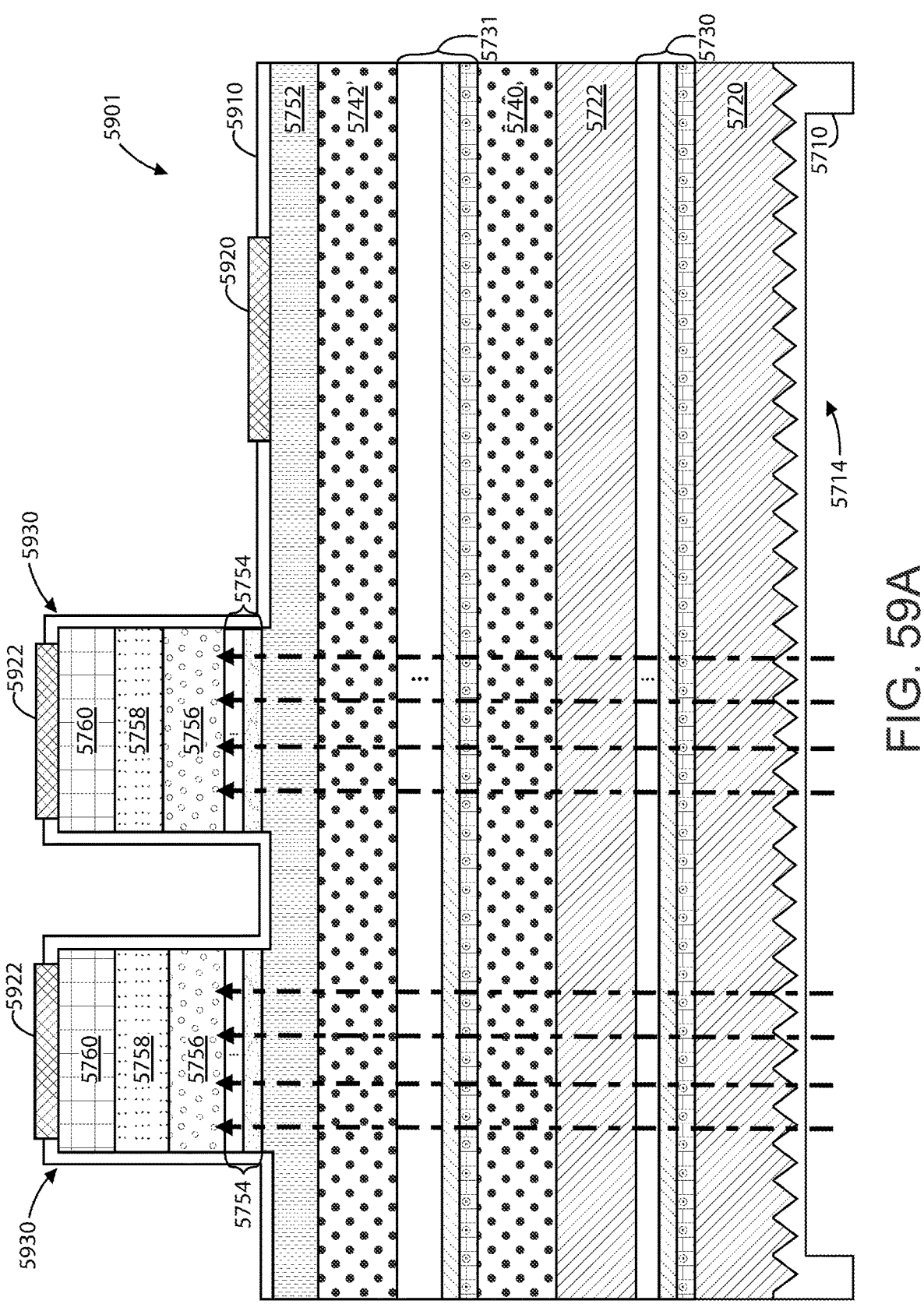
FIGS. 59A and 59B are simplified diagrams illustrating cross-sectional views of backside illumination and frontside illumination mesa-type sensor devices using wavelength configuring materials and selectively transparent buffer materials according to examples of the present invention.
Figure 59B:
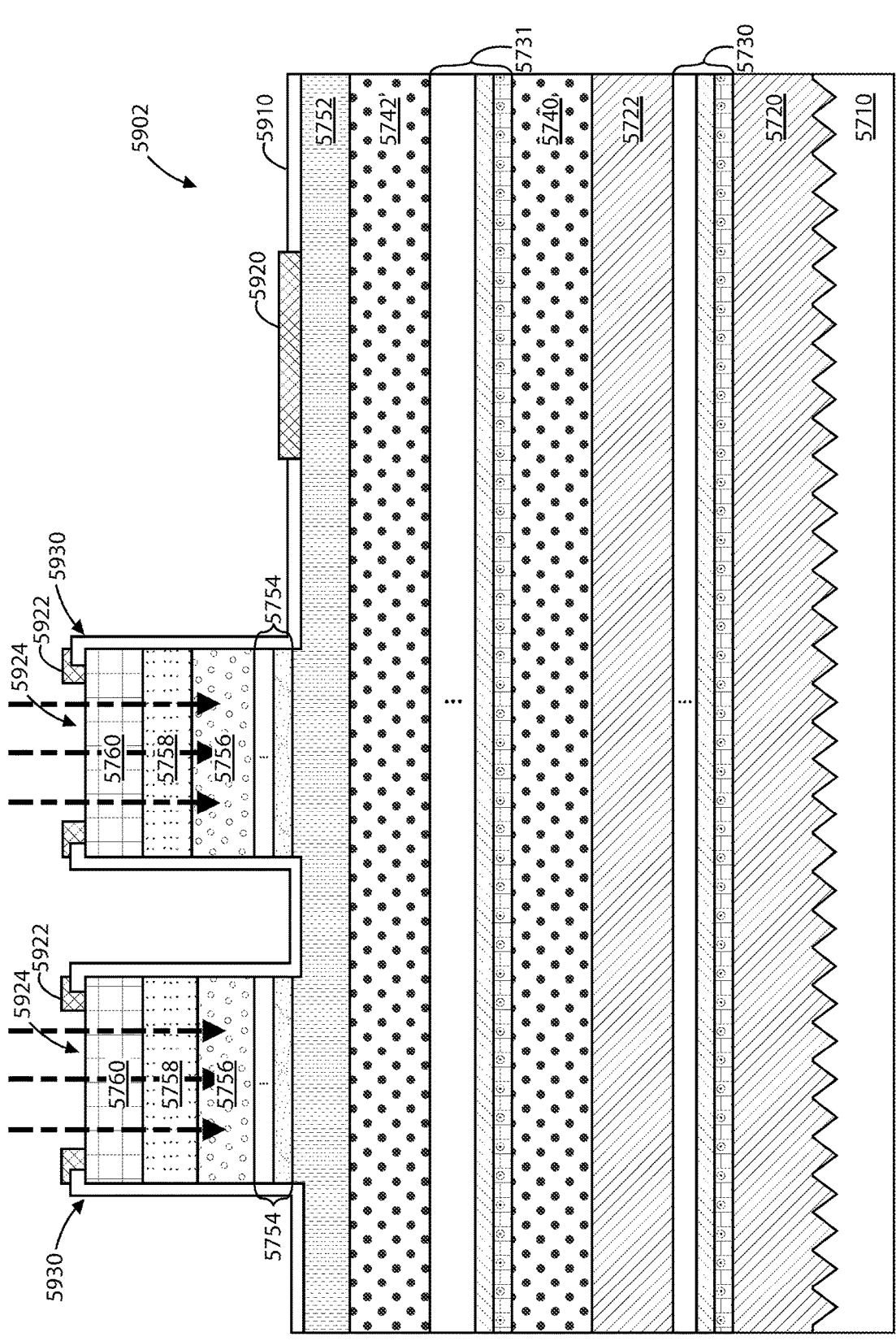

FIGS. 59A and 59B are simplified diagrams illustrating cross-sectional views of backside illumination and frontside illumination mesa-type sensor devices using wavelength configuring materials and selectively transparent buffer materials according to examples of the present invention. The method steps illustrated in these figures can be combined with any method steps discussed previously for forming a photodetector device. Further, the same numerals across these figures and previous figures refer to the same elements, regions, configurations, etc.

FIG. 59A shows a mesa-type sensor device 5901 in a backside illumination configuration. Here, the device layers 5754-5760 are configured in mesa-type sensor units 5930 with a passivation material 5910 overlying the top surface region of the mesa-type units 5930 (i.e., p-type contact region 5760) and the n-type contact region 5752. The passivation material 5910 can include silicon oxide, silicon nitride, aluminum oxide, or polymer materials, and the like. Portions of the passivation material can be removed (e.g., wet etching, dry etching, etc.) exposing portions of the p-type and n-type contact regions for metal contact formation. As shown, an n-metal contact 5920 is formed overlying a portion of the n-type contact region 5752 and p-metal contacts 5922 are formed overlying the sensor units 5930.

In this backside illumination configuration, the silicon substrate is thinned or etched to include a cavity region 5714. This cavity region 5714 allows more photons to travel through the material layers (shown by the dotted-line arrows) from the backside to the absorption region 5756 of the sensor units 5930. This configuration can improve responsivity and quantum efficiency of a resulting photodetector array, or other similar sensor device.

FIG. 59B shows a mesa-type sensor device 5902 in a topside illumination configuration. Compared to device 5901, this device 5902 does not have a thinned substrate or a cavity region in the silicon substrate 5710. Instead, a portion (e.g., a center portion) of the p-metal contacts 5922 are removed to form p-metal cavities 5924 that expose portions of the p-type contact regions 5760. This allows photons to travel through the material layers (shown by the dotted-line arrows) from the topside to the absorption region 5756 of the sensor units 5730. This configuration can enable a simplified fabrication process without the need for further processing of the substrate 5710.

Figure 60A:
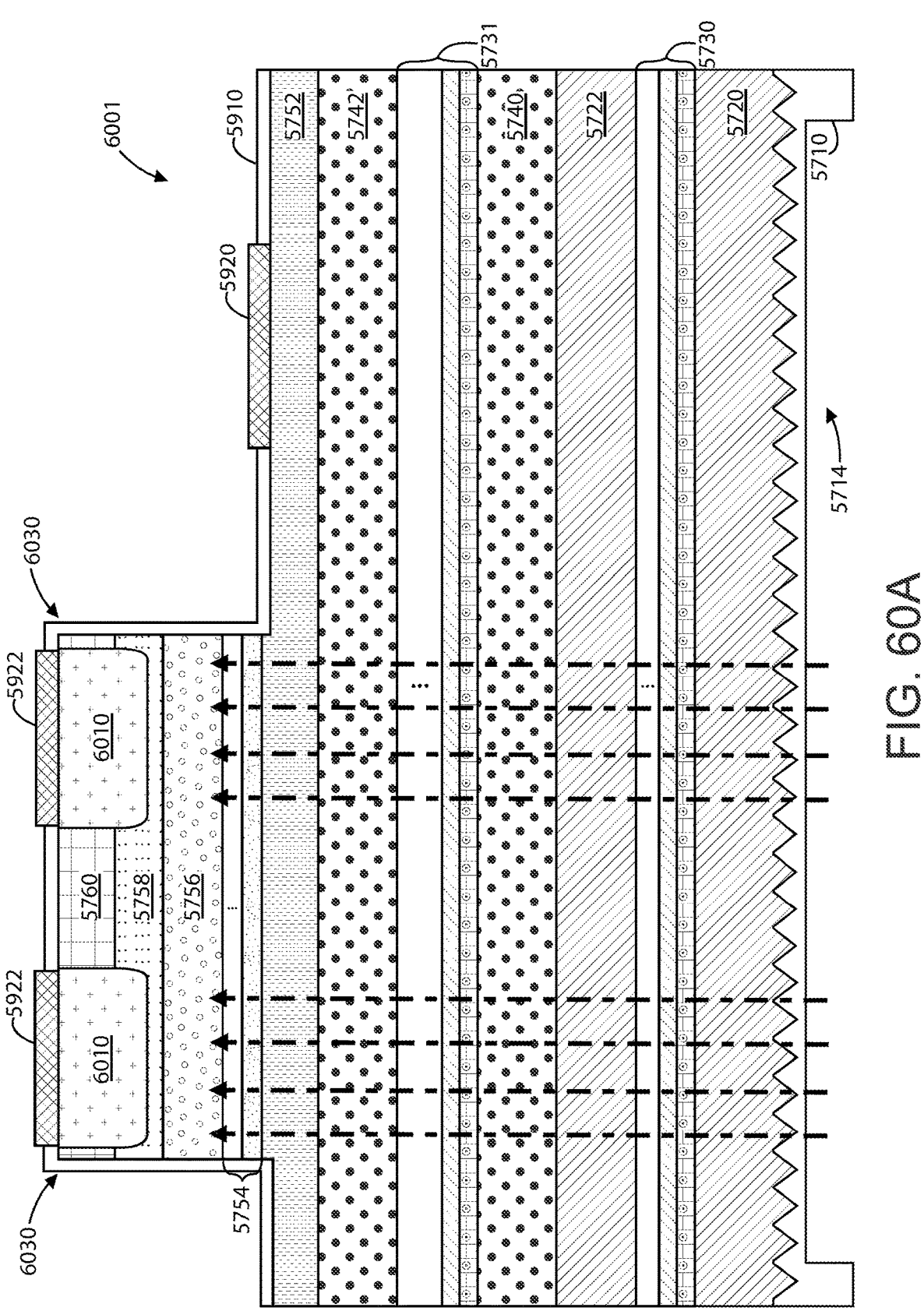
FIGS. 60A and 60B are simplified diagrams illustrating cross-sectional views of backside illumination and frontside illumination planar-type sensor devices using wavelength configuring materials and selectively transparent buffer materials according to examples of the present invention.
Figure 60B:
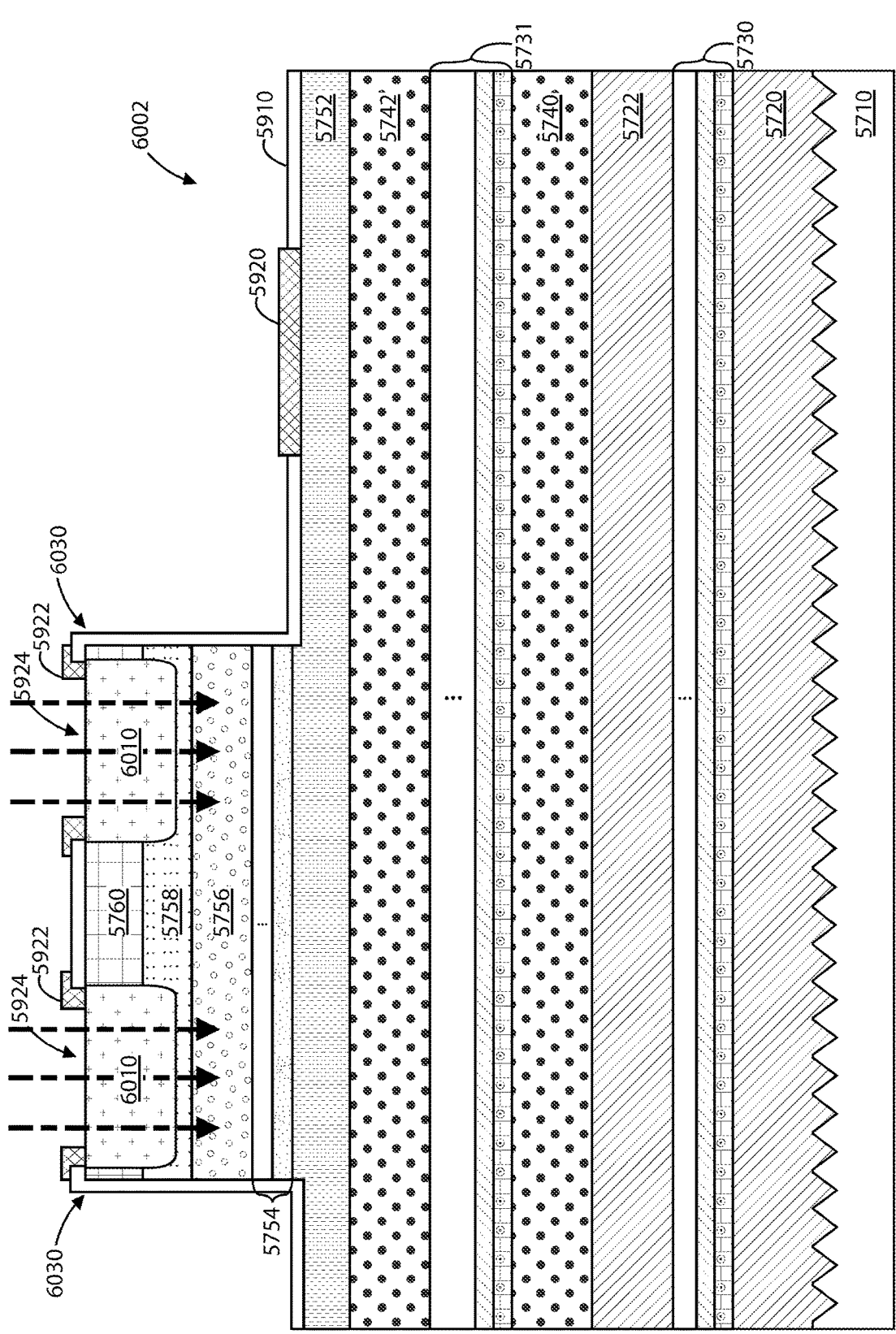

FIGS. 60A and 60B are simplified diagrams illustrating cross-sectional views of backside illumination and frontside illumination planar-type sensor devices using wavelength configuring materials and selectively transparent buffer materials according to examples of the present invention. The method steps illustrated in these figures can be combined with any method steps discussed previously for forming a photodetector device. Further, the same numerals across these figures and previous figures refer to the same elements, regions, configurations, etc.

FIG. 60A shows a planar-type sensor device 6001 in a backside illumination configuration. Here, the device layers 5754-5760 are configured as sensor units 6030 within a planar structure with a passivation material 5910 overlying the top surface region of the planar structure (i.e., p-type contact region 5760) and the n-type contact region 5752. Each sensor unit 6030 includes a diffused p-type region 6010 (or p-regions), which can be formed within at least a portion of the p-type contact region 5760 and can be formed within a portion of the p-type spacer region 5758 as well. These diffused p-regions 6010 can be formed with similar dopants and processes discussed previously. In a specific example, the diffused p-regions 6010 can include a Zn diffusion p-region.

Similar to device 5901, an n-metal contact 5920 is formed overlying an exposed portion of the n-type contact region 5752 and p-metal contacts 5922 are formed overlying the exposed portions of the sensor units 6030. Similarly, the silicon substrate is thinned or etched to include a cavity region 5714, which allows more photons to travel through the material layers (shown by the dotted-line arrows) from the backside to the absorption region 5756 of the sensor units 6030. In addition to the benefits discussed previously, this configuration can potentially lower the dark current of the resulting photodetector array, or similar sensor device.

FIG. 60B shows a planar-type sensor device 6002 in a topside illumination configuration. Similar to device 6001, the device layers 5754-5760 are configured as sensor units 6030 within a planar structure, and, similar to device 5902, p-metal cavities 5924 that expose portions of the p-type contact regions 5760, allows photons to travel through the material layers (shown by the dotted-line arrows) from the topside to the absorption region 5756 of the sensor units 6030. This configuration can also provide the benefits described previously for device 6001. Those of ordinary skill in the art will recognize other variations, modifications, and alternatives to the application of the wavelength configuring material.

Figure 61A:
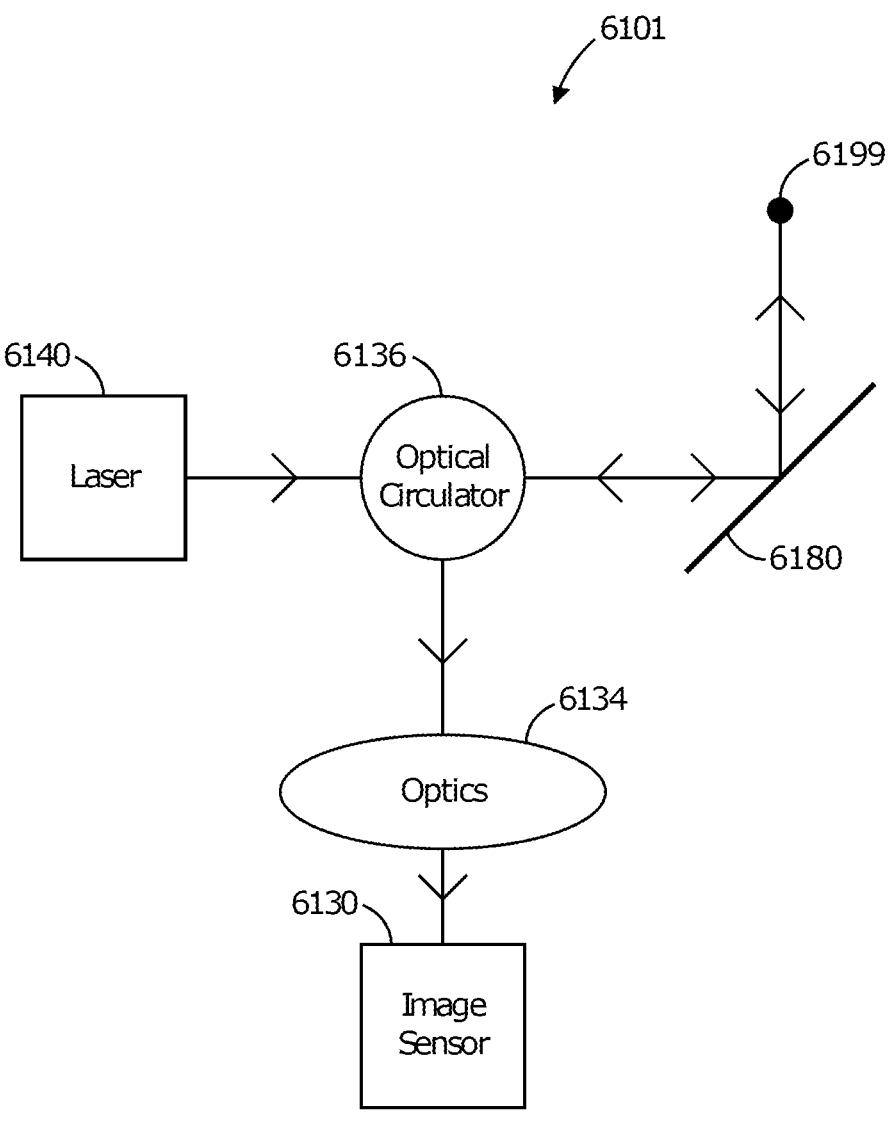
FIGS. 61A and 61B are simplified block diagrams illustrating LiDAR systems according to examples of the present invention.

FIG. 61A is a simplified block diagram illustrating a LiDAR system according to an example of the present invention. As shown, system 6101 includes an image sensor device 6130, optics 6134, a laser device (or laser array) 6140, a movable mirror 6180 optically coupled to an optical circulator 6136. In this configuration, the movable mirror 6180 can steer one or more outgoing beams coming from the laser 6140 (through the optical circulator 6136) to an object/point of reflection 6199. Then, one or more return beams from that object/point of reflection 6199 are imaged with the image sensor 6130 (i.e., reflected from the movable mirror 6180 and directed by the optical circulator 6136 through the optics 6134 to the image sensor 6130). Using this optical path between these elements (shown by the lines with directional arrows), the movable mirror 6180 may steer in 2D to enable 3D imaging of a scene or object. Of course, there can be other variations, modifications, and alternatives to this example LiDAR system.

Figure 61B:
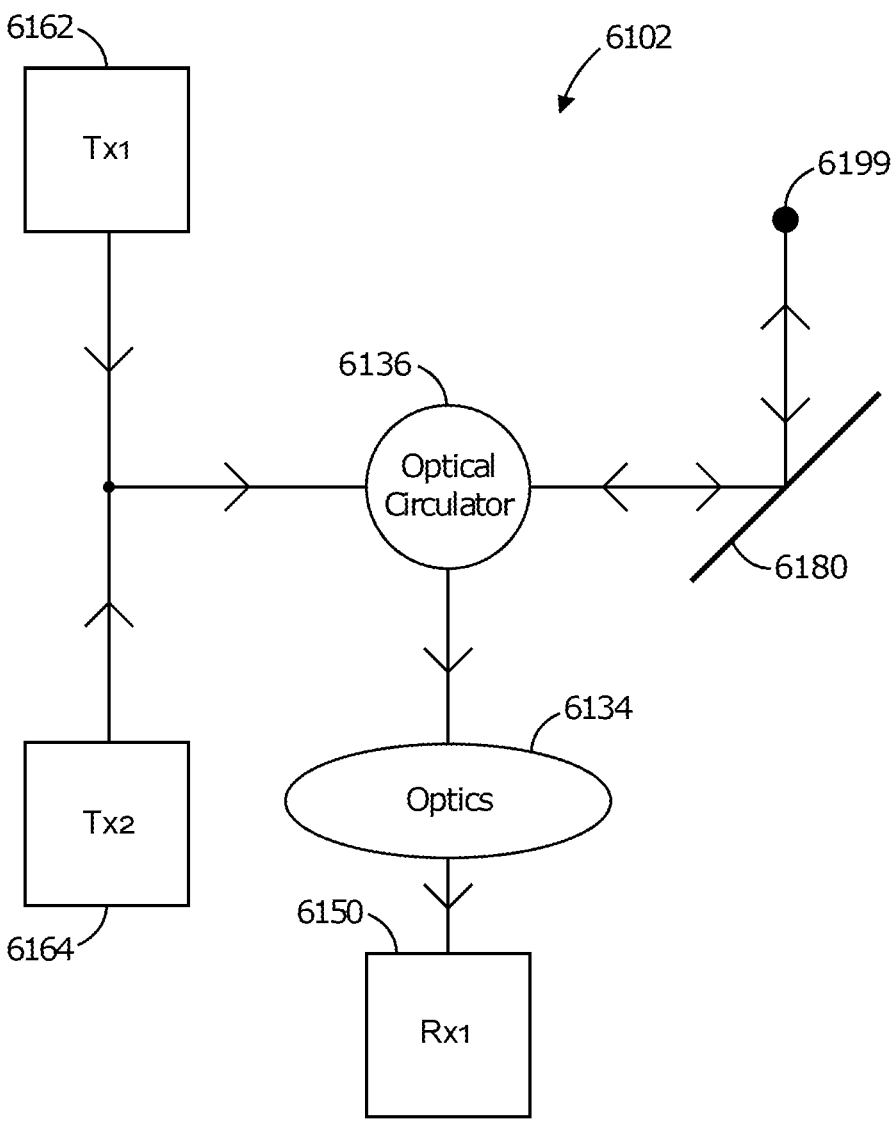

FIG. 61B is a simplified block diagram illustrating a LiDAR system according to an example of the present invention. Similar to system 6101, system 6102 includes optics 134, and a movable mirror 180 optically coupled to an optical circulator 136. Here, this system 6102 also includes at least a receiver device 6150 and at least a first transmitter device 6162 and a second transmitter device 6164. The receiver device 6150 can include any device type discussed previously, such as an image sensor, photodetector device, focal planar array (FPA) device, or the like. For example, the receiver device 6150 can include a two-color monolithic FPA configured to process inputs at two different wavelengths.

The first and second transmitter devices 6162, 6164 can include laser devices or laser arrays, which can be configured for different wavelength ranges. For example, the first transmitter device 6162 can be configured for 850-940 nm wavelengths, while the second transmitter device 6164 can be configured for 1064-2500 nm wavelengths. In this case, the receiver device 6150 is configured to handle inputs from both wavelength ranges. Of course, there can be other variations, modifications, and alternatives.

As discussed previously, the movable mirror 6180 can steer one or more outgoing beams coming through the optical circulator 6136 to an object/point of reflection 6199. Then, one or more return beams from that object/point of reflection 6199 are imaged with the receiver device 6150 (i.e., reflected from the movable mirror 180 and directed by the optical circulator 136 through the optics 134 to the receiver device 6150). Using this optical path between these elements (shown by the lines with directional arrows), the movable mirror 6180 may steer in 2D to enable 3D imaging of a scene or object. Those of ordinary skill in the art will recognize other variations, modifications, and alternatives to this example LiDAR system.

While the above is a full description of the specific embodiments, various modifications, alternative constructions, and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. A method of fabricating a stacked sensor device, the method comprising:

providing a partially completed semiconductor substrate comprising a semiconductor detector device formed overlying a first portion of a first substrate and a first dielectric layer formed overlying the semiconductor detector device and the first substrate;

forming a first cavity region within a portion of the first dielectric layer exposing a second portion of the first substrate;

forming a buffer material overlying the first substrate within the first cavity region, wherein forming the buffer material comprises a selective area heteroepitaxy process;

forming a plurality of photodetector device materials overlying the buffer material within the first cavity region to form a photodetector device overlying the first substrate, wherein forming the photodetector device comprises a selective area heteroepitaxy process;

forming a second dielectric layer overlying the first dielectric layer and the photodetector device;

forming a second cavity region within a portion of the first dielectric layer and the second dielectric layer exposing the semiconductor detector device;

subjecting the semiconductor detector device to one or more IC processing steps;

forming a dielectric material within the second cavity region overlying the semiconductor detector device;

forming a first metal interconnect within a portion of the second dielectric layer overlying the photodetector device, the first metal interconnect being coupled to the photodetector device;

forming a second metal interconnect within a portion of the first and second dielectric layers, the second metal interconnect being coupled to the semiconductor detector device;

forming a first bond pad overlying the second dielectric layer, the first bond pad being coupled to the first metal interconnect;

forming a second bond pad overlying the second dielectric layer, the second bond pad being coupled to the second metal interconnect;

wherein the partially completed semiconductor substrate, the photodetector device, the semiconductor detector device, the first dielectric layer, the second dielectric layer, the dielectric material, the first and second metal interconnects, and the first and second bond pads form a sensor device substrate;

providing a read-out integrated circuit (ROIC) substrate comprising a ROIC device overlying a second substrate and a third dielectric layer overlying the ROIC device and the second substrate, wherein the ROIC substrate includes a third metal interconnect and a fourth metal interconnect formed within the third dielectric layer and coupled to the ROIC device, and wherein the ROIC substrate includes a third bond pad and a fourth bond pad overlying the third dielectric layer such that the third bond pad is coupled to the third metal interconnect and the fourth bond pad is coupled to the fourth metal interconnect; and bonding the sensor device substrate overlying the ROIC substrate in a flipped orientation such that the first and second bond pads of the sensor device are coupled to the third and fourth bond pads of the ROIC substrate.

2. The method of claim 1 wherein forming the photodetector device includes forming a detector device configured for about 900 to 2500 nm wavelength applications, and wherein forming the semiconductor detector device includes forming a detector device configured for about 400 to 1000 nm wavelength applications.

3. The method of claim 1 wherein the ROIC substrate comprises an array configuration having a plurality of pixel regions; and wherein the sensor device is formed within each of the pixel regions resulting in a sensor array device.

4. The method of claim 1 wherein forming the photodetector device comprises forming a III-V pixel infrared (IR) detector device, and wherein forming the semiconductor detector device comprises forming a silicon detector device.

5. The method of claim 1 wherein forming the buffer material comprises forming a wavelength configuring material having a graded region configured for a selected wavelength, the graded region comprising a plurality of material regions configured in order of concentration with respect to at least a first element concentration including $In_zGa_{1-z}As$, $In_zGa_{1-z}P$, or $In_zAl_{1-z}As$; and wherein the plurality of material regions includes an interface region between each adjacent pair of the material regions.

6. The method of claim 1 wherein forming the buffer material comprises forming a wavelength configuring material having a selectively transparent region, the selectively transparent region comprising a plurality of material regions having at least a first material composition and a second material composition, the first material composition comprising an InGaP material, an InP strained layer superlattice (SLS) material, or an InGaP SLS material; and the second material composition comprising an InP spacer material; and wherein the plurality of material regions includes an interface region between each adjacent pair of the material regions.

7. The method of claim 1 wherein forming the photodetector device comprises forming an n-type contact region overlying the buffer material;

forming a UID absorber region overlying the n-type contact region;

forming a band transition region overlying the UID absorber region;

forming a non-absorbing p-type spacer region overlying the band transition region; and forming a p-type contact region overlying the non-absorbing p-type spacer region.

8. The method of claim 1 wherein bonding the sensor device substrate to the ROIC substrate comprises a wafer-wafer bonding process, a parallel chip-wafer bonding process, a chip-wafer bonding process, or a flip-chip bonding process.

9. The method of claim 1 further comprising removing or thinning the first substrate following the bonding of the sensor device substrate to the ROIC substrate.

10. A stacked sensor device comprising:

a first substrate;

a semiconductor detector device overlying a first portion of the first substrate;

a first dielectric layer overlying the first substrate and the semiconductor device;

a photodetector device overlying a second portion of the first substrate within a portion of the first dielectric layer;

a second dielectric layer overlying the first dielectric layer and the photodetector device;

a first metal interconnect configured within a first portion of the second dielectric layer, the first metal interconnect being coupled to the photodetector device;

a second metal interconnect configured within a second portion of the second dielectric layer and a portion of the first dielectric layer, the second metal interconnect being coupled to the semiconductor detector device;

a first bond pad overlying the second dielectric layer, the first bond pad being coupled to the first metal interconnect;

a second bond pad overlying the second dielectric layer, the second bond pad being coupled to the second interconnect;

wherein the first substrate, the semiconductor detector device, the photodetector device, the first dielectric layer, the second dielectric layer, the first and second metal interconnects, and the first and second bond pads form a sensor device substrate;

a second substrate;

a read-out integrated circuit (ROIC) device overlying the second substrate;

a third dielectric layer overlying the ROIC device and the second substrate;

a third metal interconnect configured within a first portion of the third dielectric layer;

a fourth metal interconnect configured within a second portion of the third dielectric layer;

a third bond pad overlying the third dielectric layer and coupled to the third metal interconnect;

a fourth bond pad overlying the third dielectric layer and coupled to the fourth metal interconnect;

wherein the second substrate, the ROIC device, the third dielectric layer, the third and fourth metal interconnects, and the third and fourth bond pads form a ROIC substrate; and wherein the sensor device substrate is bonded overlying the ROIC substrate in a flipped orientation such that the first and second bond pads of the sensor device are coupled to the third and fourth bond pads of the ROIC substrate.

11. The device of claim 10 wherein the photodetector device is configured for about 900 to 2500 nm wavelength applications, and wherein the semiconductor detector device is configured for about 400 to 1000 nm wavelength applications.

12. The device of claim 10 wherein the ROIC substrate comprises an array configuration having a plurality of pixel regions; and wherein the sensor device substrate is configured within each of the pixel regions as a sensor array device.

13. The device of claim 10 wherein the photodetector device comprises a III-V pixel infrared (IR) detector device, and wherein the semiconductor detector device comprises a silicon detector device.

14. The device of claim 10 wherein the buffer material comprises a wavelength configuring material having a graded region configured for a selected wavelength, the graded region comprising a plurality of material regions configured in order of concentration with respect to at least a first element concentration including $In_zGa_{1-z}As$, $In_zGa_{1-z}P$, or $In_zAl_{1-z}As$; and wherein the plurality of material regions includes an interface region between each adjacent pair of the material regions.

15. The device of claim 10 wherein the buffer material comprises a wavelength configuring material having a selectively transparent region, the selectively transparent region comprising a plurality of material regions having at least a first material composition and a second material composition, the first material composition comprising an InGaP material, an InP strained layer superlattice (SLS) material, or an InGaP SLS material; and the second material composition comprising an InP spacer material; and wherein the plurality of material regions includes an interface region between each adjacent pair of the material regions.

16. The device of claim 10 wherein the photodetector device comprises an n-type contact region overlying the buffer material; a UID absorber region overlying the n-type contact region; a band transition region overlying the UID absorber region; a non-absorbing p-type spacer region overlying the band transition region; and a p-type contact region overlying the non-absorbing p-type spacer region.

17. A stacked sensor device comprising:
a substrate;
a read-out integrated circuit (ROIC) device overlying the substrate;
a first dielectric layer overlying the ROIC device and the substrate;
a first metal interconnect configured within a first portion of the first dielectric layer;
a second metal interconnect configured within a second portion of the first dielectric layer;
a first bond pad overlying the first dielectric layer and coupled to the first metal interconnect;
a second bond pad overlying the first dielectric layer and coupled to the second metal interconnect;
a third bond pad coupled to the first bond pad;
a fourth bond pad coupled to the second bond pad;

a second dielectric layer overlying the first dielectric layer, and the third and fourth bond pads;
a third dielectric layer overlying the second dielectric layer;
a third metal interconnect configured within a first portion of the second dielectric layer, the third metal interconnect being coupled to the third bond pad;
a fourth metal interconnect configured within a second portion of the second dielectric layer and a first portion of the third dielectric layer, the fourth metal interconnect being coupled to the fourth bond pad;
a photodetector device configured within a second portion of the third dielectric layer, the photodetector device being coupled to the third metal interconnect, and the photodetector comprising a buffer material; and
a semiconductor detector device configured within a third portion of the third dielectric layer, the semiconductor detector device being coupled to the fourth metal interconnect.

18. The device of claim 17 wherein the photodetector device is configured for about 900 to 2500 nm wavelength applications, and wherein the semiconductor detector device is configured for about 400 to 1000 nm wavelength applications.

19. The device of claim 17 wherein the substrate, the ROIC device, the first dielectric layer, the first and second metal interconnects, and the first and second bond pads form an ROIC substrate; the ROIC substrate comprising an array configuration having a plurality of pixel regions; and wherein the third and fourth bond pads, the third and fourth metal interconnects, the second and third dielectric layers, the photodetector device, and the semiconductor detector device form a sensor device substrate, the sensor device substrate being configured within each of the pixel regions as a sensor array device.

20. The device of claim 17 wherein the photodetector device comprises a III-V pixel infrared (IR) detector device, and wherein the semiconductor detector device comprises a silicon detector device.

21. The device of claim 17 wherein the buffer material comprises a wavelength configuring material having a graded region configured for a selected wavelength, the graded region comprising a plurality of material regions configured in order of concentration with respect to at least a first element concentration including $In_zGa_{1-z}As$, $In_zGa_{1-z}P$, or $In_zAl_{1-z}As$; and wherein the plurality of material regions includes an interface region between each adjacent pair of the material regions.

22. The device of claim 17 wherein the buffer material comprises a wavelength configuring material having a selectively transparent region, the selectively transparent region comprising a plurality of material regions having at least a first material composition and a second material composition, the first material composition comprising an InGaP material, an InP strained layer superlattice (SLS) material, or an InGaP SLS material; and the second material composition comprising an InP spacer material; and wherein the plurality of material regions includes an interface region between each adjacent pair of the material regions.

23. The device of claim 17 wherein the photodetector device comprises an n-type contact region overlying the buffer material; a UID absorber region overlying the n-type contact region; a band transition region overlying the UID absorber region; a non-absorbing p-type spacer region overlying the band transition region; and a p-type contact region overlying the non-absorbing p-type spacer region.

* * * * *